US012336368B2

(12) United States Patent
Ishisone et al.

(10) Patent No.: US 12,336,368 B2
(45) Date of Patent: Jun. 17, 2025

(54) LIGHT-EMITTING DEVICE, LIGHT-EMITTING APPLIANCE, DISPLAY DEVICE, ELECTRONIC APPLIANCE, AND LIGHTING DEVICE

(71) Applicant: Semiconductor Energy Laboratory Co., Ltd., Kanagawa-ken (JP)

(72) Inventors: Takahiro Ishisone, Kanagawa (JP); Nobuharu Ohsawa, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/599,954

(22) Filed: Mar. 8, 2024

(65) Prior Publication Data

US 2024/0268140 A1 Aug. 8, 2024

Related U.S. Application Data

(63) Continuation of application No. 17/427,511, filed as application No. PCT/IB2020/050550 on Jan. 24, 2020, now Pat. No. 11,930,653.

(30) Foreign Application Priority Data

Feb. 6, 2019 (JP) .................. 2019-019692

(51) Int. Cl.
*H10K 50/12* (2023.01)
*G06F 3/041* (2006.01)
(Continued)

(52) U.S. Cl.
CPC ........... *H10K 50/121* (2023.02); *G06F 3/041* (2013.01); *H10K 50/13* (2023.02); *H10K 2101/30* (2023.02); *H10K 2101/90* (2023.02)

(58) Field of Classification Search
CPC ............. H10K 50/121; H10K 2101/90; H10K 50/13–131
See application file for complete search history.

(56) References Cited

U.S. PATENT DOCUMENTS

| 5,759,444 A | 6/1998 | Enokida et al. |
| 6,376,107 B1 | 4/2002 | Heuer et al. |

(Continued)

FOREIGN PATENT DOCUMENTS

| CN | 102439749 A | 5/2012 |
| CN | 102884649 A | 1/2013 |

(Continued)

OTHER PUBLICATIONS

International Search Report (Application No. PCT/IB2020/050550) Dated Apr. 21, 2020.

(Continued)

*Primary Examiner* — Amar Movva
(74) *Attorney, Agent, or Firm* — Husch Blackwell LLP

(57) ABSTRACT

A light-emitting device with high emission efficiency and reliability is provided. The light-emitting device includes a fluorescent light-emitting layer and a phosphorescent light-emitting layer. A host material used in the fluorescent light-emitting layer has a function of converting triplet excitation energy into light emission and a guest material used in the fluorescent light-emitting layer emits fluorescence. The guest material has a molecular structure including a luminophore and a protecting group, and one molecule of the guest material includes five or more protecting groups. The introduction of the protecting groups into the molecule inhibits transfer of triplet excitation energy from the host material to the guest material by the Dexter mechanism. An alkyl group or a branched-chain alkyl group is used as the protecting group. The longest wavelength absorption band in the absorption spectrum of the guest material in the (Continued)

phosphorescent light-emitting layer has an overlap with the emission spectrum of the host material in the phosphorescent light-emitting layer.

16 Claims, 19 Drawing Sheets

(51) Int. Cl.
  *H10K 50/13* (2023.01)
  *H10K 101/00* (2023.01)
  *H10K 101/30* (2023.01)

(56) References Cited

U.S. PATENT DOCUMENTS

| | | |
|---|---|---|
| 7,175,922 B2 | 2/2007 | Jarikov et al. |
| 7,183,010 B2 | 2/2007 | Jarikov |
| 7,332,857 B2 | 2/2008 | Seo et al. |
| 7,572,522 B2 | 8/2009 | Seo et al. |
| 7,597,967 B2 | 10/2009 | Kondakova et al. |
| 7,943,925 B2 | 5/2011 | Yamazaki |
| 7,993,760 B2 | 8/2011 | Komori et al. |
| 8,034,465 B2 | 10/2011 | Liao et al. |
| 8,461,574 B2 | 6/2013 | Nishimura et al. |
| 8,723,171 B2 | 5/2014 | Nishimura et al. |
| 8,729,310 B2 | 5/2014 | Osaka et al. |
| 8,766,249 B2 | 7/2014 | Sawada et al. |
| 8,941,297 B2 | 1/2015 | Kaiser et al. |
| 8,963,127 B2 | 2/2015 | Pieh et al. |
| 8,993,129 B2 | 3/2015 | Endo et al. |
| 9,054,317 B2 | 6/2015 | Monkman et al. |
| 9,356,250 B2 | 5/2016 | Ohsawa et al. |
| 9,362,517 B2 | 6/2016 | Ohsawa et al. |
| 10,910,565 B2 | 2/2021 | Ogiwara et al. |
| 2003/0175553 A1 | 9/2003 | Thompson et al. |
| 2004/0253478 A1 | 12/2004 | Thompson et al. |
| 2005/0048310 A1 | 3/2005 | Cocchi et al. |
| 2005/0221116 A1 | 10/2005 | Cocchi et al. |
| 2006/0134464 A1 | 6/2006 | Nariyuki |
| 2006/0186376 A1 | 8/2006 | Yamamoto et al. |
| 2006/0202190 A1 | 9/2006 | Funahashi |
| 2006/0210830 A1 | 9/2006 | Funahashi et al. |
| 2006/0228577 A1 | 10/2006 | Nagara |
| 2007/0007884 A1 | 1/2007 | Iwanaga et al. |
| 2007/0090756 A1 | 4/2007 | Okada et al. |
| 2007/0244320 A1 | 10/2007 | Inoue et al. |
| 2007/0252511 A1 | 11/2007 | Funahashi |
| 2008/0160345 A1 | 7/2008 | Inoue et al. |
| 2008/0286604 A1 | 11/2008 | Inoue et al. |
| 2009/0166563 A1 | 7/2009 | Yokoyama. et al. |
| 2010/0052527 A1 | 3/2010 | Ikeda et al. |
| 2010/0145044 A1 | 6/2010 | Inoue et al. |
| 2010/0301318 A1 | 12/2010 | Kuma et al. |
| 2010/0314644 A1 | 12/2010 | Nishimura et al. |
| 2011/0001146 A1 | 1/2011 | Yamazaki et al. |
| 2011/0210316 A1 | 9/2011 | Kadoma et al. |
| 2011/0215714 A1 | 9/2011 | Seo et al. |
| 2012/0098417 A1 | 4/2012 | Inoue et al. |
| 2012/0205632 A1 | 8/2012 | Shitagaki et al. |
| 2012/0205687 A1 | 8/2012 | Yamazaki et al. |
| 2012/0206035 A1 | 8/2012 | Shitagaki et al. |
| 2012/0217486 A1 | 8/2012 | Takemura. et al. |
| 2012/0217487 A1 | 8/2012 | Yamazaki et al. |
| 2012/0235127 A1 | 9/2012 | Takasu et al. |
| 2012/0242219 A1 | 9/2012 | Seo et al. |
| 2012/0248421 A1 | 10/2012 | Yamazaki et al. |
| 2012/0248968 A1 | 10/2012 | Ogiwara et al. |
| 2012/0256535 A1 | 10/2012 | Seo et al. |
| 2012/0263648 A1 | 10/2012 | Shapiro et al. |
| 2013/0048964 A1 | 2/2013 | Takeda et al. |
| 2013/0049579 A1 | 2/2013 | Kaiser et al. |
| 2013/0056720 A1 | 3/2013 | Kim et al. |
| 2013/0207088 A1 | 8/2013 | Seo |
| 2013/0270531 A1 | 10/2013 | Seo et al. |
| 2013/0277653 A1 | 10/2013 | Osaka et al. |
| 2013/0277655 A1 | 10/2013 | Seo et al. |
| 2013/0277656 A1 | 10/2013 | Seo et al. |
| 2013/0292656 A1 | 11/2013 | Seo et al. |
| 2013/0306945 A1 | 11/2013 | Seo |
| 2014/0014930 A1 | 1/2014 | Hirose et al. |
| 2014/0034925 A1 | 2/2014 | Osaka et al. |
| 2014/0034926 A1 | 2/2014 | Matsubara et al. |
| 2014/0034927 A1 | 2/2014 | Seo et al. |
| 2014/0034930 A1 | 2/2014 | Seo et al. |
| 2014/0034931 A1 | 2/2014 | Inoue et al. |
| 2014/0034932 A1 | 2/2014 | Seo et al. |
| 2014/0048784 A1 | 2/2014 | Inoue et al. |
| 2014/0061604 A1 | 3/2014 | Seo et al. |
| 2014/0336379 A1 | 11/2014 | Adachi et al. |
| 2015/0069352 A1 | 3/2015 | Kim et al. |
| 2015/0188070 A1 | 7/2015 | Ogiwara et al. |
| 2016/0028022 A1 | 1/2016 | Seo et al. |
| 2016/0056401 A1 | 2/2016 | Lee et al. |
| 2016/0064684 A1 | 3/2016 | Seo et al. |
| 2016/0093823 A1 | 3/2016 | Seo et al. |
| 2016/0104847 A1 | 4/2016 | Xia et al. |
| 2016/0104855 A1 | 4/2016 | Ohsawa et al. |
| 2016/0172602 A1 | 6/2016 | Ogiwara et al. |
| 2016/0190478 A1 | 6/2016 | Nakanotani et al. |
| 2016/0190500 A1 | 6/2016 | Watabe et al. |
| 2016/0248031 A1 | 8/2016 | Seo |
| 2016/0248032 A1 | 8/2016 | Seo et al. |
| 2016/0268513 A1 | 9/2016 | Ishisone et al. |
| 2016/0268534 A1 | 9/2016 | Hosoumi et al. |
| 2016/0315274 A1 | 10/2016 | Lennartz et al. |
| 2016/0343949 A1 | 11/2016 | Seo et al. |
| 2016/0343954 A1 | 11/2016 | Seo et al. |
| 2016/0351833 A1 | 12/2016 | Hosoumi et al. |
| 2017/0012207 A1 | 1/2017 | Seo et al. |
| 2017/0271610 A1 | 9/2017 | Takahashi |
| 2017/0324054 A1 | 11/2017 | Ishisone et al. |
| 2017/0324055 A1 | 11/2017 | Ishisone et al. |
| 2019/0140027 A1 | 5/2019 | Ishisone et al. |
| 2019/0280236 A1 | 9/2019 | Tabata et al. |
| 2021/0043840 A1 | 2/2021 | Seo et al. |
| 2021/0057667 A1 | 2/2021 | Ohsawa et al. |
| 2021/0104680 A1 | 4/2021 | Ogiwara et al. |
| 2021/0280811 A1 | 9/2021 | Ohsawa et al. |

FOREIGN PATENT DOCUMENTS

| | | |
|---|---|---|
| CN | 105514288 A | 4/2016 |
| DE | 102010020044 | 11/2011 |
| EP | 2442379 A | 4/2012 |
| EP | 3104428 A | 12/2016 |
| JP | 2686418 | 12/1997 |
| JP | 2002-256168 A | 9/2002 |
| JP | 2008-288344 A | 11/2008 |
| JP | 4188369 | 11/2008 |
| JP | 4188401 | 11/2008 |
| JP | 2013-526773 | 6/2013 |
| JP | 2014-022666 A | 2/2014 |
| JP | 2014-045179 A | 3/2014 |
| JP | 2015-179809 A | 10/2015 |
| JP | 2020-017721 A | 1/2020 |
| KR | 2012-0034646 A | 4/2012 |
| KR | 2013-0107206 A | 10/2013 |
| KR | 2016-0043505 A | 4/2016 |
| TW | 201106780 | 2/2011 |
| WO | WO-2010/143434 | 12/2010 |
| WO | WO-2011/141109 | 11/2011 |
| WO | WO-2015/198988 | 12/2015 |
| WO | WO-2018/097153 | 5/2018 |
| WO | WO-2019/215535 | 11/2019 |
| WO | WO-2020/012304 | 1/2020 |

OTHER PUBLICATIONS

Written Opinion (Application No. PCT/IB2020/050550) Dated Apr. 21, 2020.

Yokoyama.D et al., "Dual efficiency enhancement by delayed fluorescence and dipole orientation in high-efficiency fluorescent organic light-emitting diodes", Appl. Phys. Lett. (Applied Physics

(56) References Cited

OTHER PUBLICATIONS

Letters), Sep. 22, 2011, vol. 99, No. 12, pp. 123303-1-123303-4, AIP Publishing.
Gong.X et al., "Phosphorescence from iridium complexes doped into polymer blends", J. Appl. Phys. (Journal of Applied Physics), Feb. 1, 2004, vol. 95, No. 3, pp. 948-953.
D'Andrade.B et al., "High-efficiency yellow double-doped organic light-emitting devices based on phosphor-sensitized fluorescence", Appl. Phys. Lett. (Applied Physics Letters), Aug. 13, 2001, vol. 79, No. 7, pp. 1045-1047.
Cheng.G et al., "Improved efficiency for white organic light-emitting devices based on phosphor sensitized fluorescence", Appl. Phys. Lett. (Applied Physics Letters), Feb. 20, 2006, vol. 88, No. 8, pp. 083512-1-083512-3.
Kanno.H et al., "White organic light-emitting device based on a compound fluorescent phosphor-sensitized-fluorescent emission layer", Appl. Phys. Lett. (Applied Physics Letters), Oct. 2, 2006, vol. 89, No. 14, pp. 143516-1-143516-3.
Park.Y et al., "Efficient triplet harvesting by fluorescent molecules through exciplexes for high efficiency organic light-emitting diodes", Appl. Phys. Lett. (Applied Physics Letters), Apr. 18, 2013, vol. 102, No. 15, pp. 153306-1-153306-5.
Nakanotani.H et al., "High-efficiency organic light-emitting diodes with fluorescent emitters", Nature Communications, May 30, 2014, vol. 5, pp. 4016-1-4016-7.
Noda.H et al., "Excited state engineering for efficient reverse intersystem crossing", Science Advances, Jul. 22, 2018, vol. 4, No. 6, p. 6910.
Nakagawa.T et al., "Electroluminescence based on thermally activated delayed fluorescence generated by a spirobifluorene donor-acceptor structure", Chemical Communications, Apr. 17, 2012, vol. 48, No. 77, pp. 9580-9582, RSC Publishing.

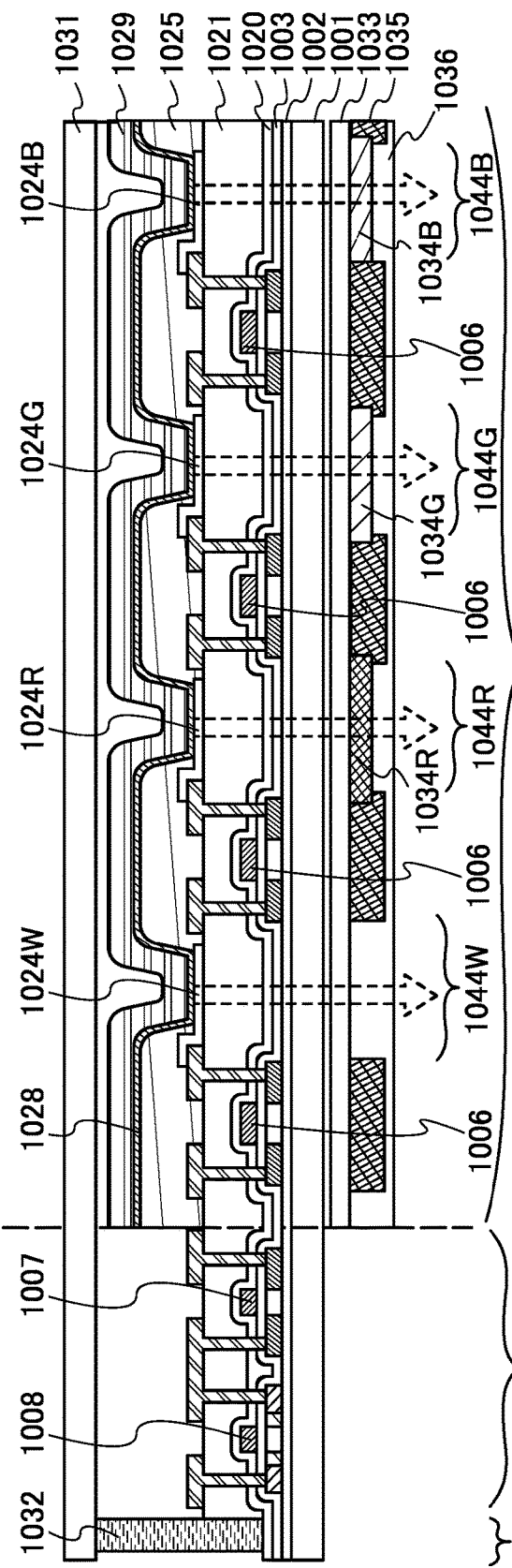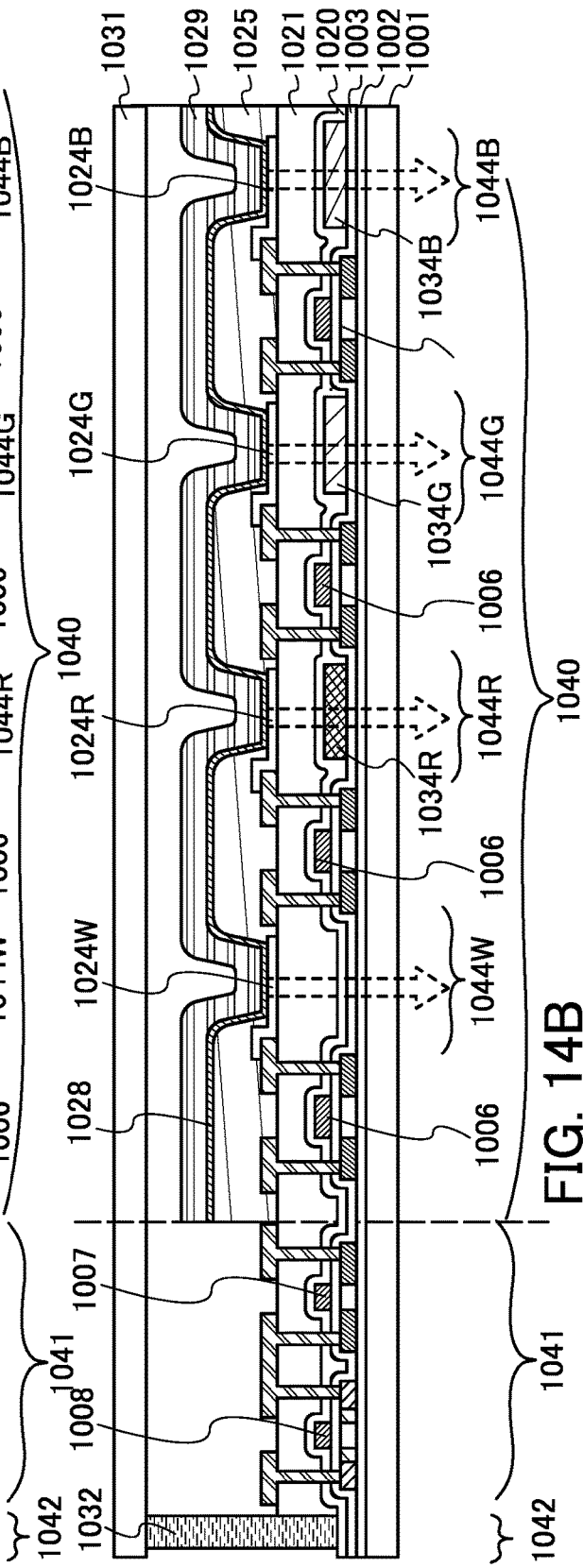
FIG. 14A
FIG. 14B

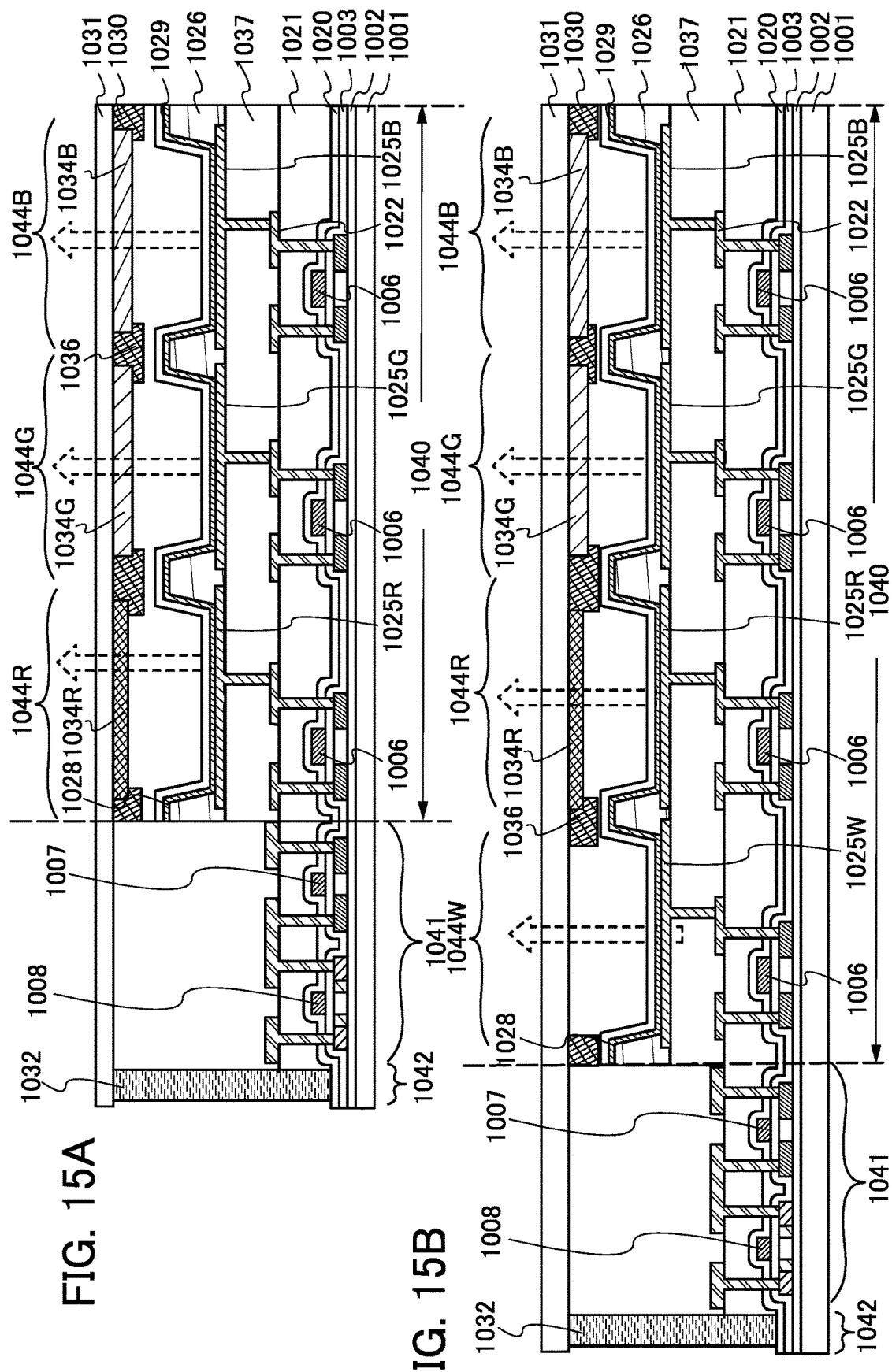

LIGHT-EMITTING DEVICE, LIGHT-EMITTING APPLIANCE, DISPLAY DEVICE, ELECTRONIC APPLIANCE, AND LIGHTING DEVICE

This application is a continuation of copending U.S. application Ser. No. 17/427,511, filed on Jul. 30, 2021 which is a 371 of international application PCT/IB2020/050550 filed on Jan. 24, 2020 which are all incorporated herein by reference.

TECHNICAL FIELD

One embodiment of the present invention relates to a light-emitting device, or a display device, an electronic appliance, and a lighting device including the light-emitting device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Accordingly, specific examples of the technical field of one embodiment of the present invention disclosed in this specification include a semiconductor device, a display device, a liquid crystal display device, a light-emitting device, a lighting device, a power storage device, a memory device, a driving method thereof, and a manufacturing method thereof.

BACKGROUND ART

In recent years, research and development have been extensively conducted on light-emitting devices utilizing electroluminescence (EL). The basic structure of these light-emitting devices is a structure in which a layer containing a light-emitting substance (an EL layer) is interposed between a pair of electrodes. By application of a voltage between the electrodes of this device, light emission from the light-emitting substance can be obtained.

Since the above light-emitting device is a self-luminous type, a display device using this has advantages such as high visibility, no necessity of a backlight, and low power consumption. The display device also has advantages in that it can be fabricated to be thin and lightweight and has high response speed, for example.

In the case of a light-emitting device (e.g., an organic EL device) in which an organic compound is used as a light-emitting substance and an EL layer containing the light-emitting organic compound is provided between a pair of electrodes, application of a voltage between the pair of electrodes causes injection of electrons from a cathode and holes from an anode into the light-emitting EL layer and thus a current flows. Then, by recombination of the injected electrons and holes, the light-emitting organic compound is brought into an excited state, and light emission can be obtained from the excited light-emitting organic compound.

The types of excited states formed by an organic compound are a singlet excited state (S*) and a triplet excited state (T*); light emission from the singlet excited state is referred to as fluorescence, and light emission from the triplet excited state is referred to as phosphorescence. The statistical formation ratio of them in the light-emitting device is $S^*:T^*=1:3$. For this reason, a light-emitting device using a compound that emits phosphorescence (a phosphorescent material) can have higher emission efficiency than a light-emitting device using a compound that emits fluorescence (a fluorescent material). Therefore, light-emitting devices using phosphorescent materials capable of converting energy of the triplet excited state into light emission have been actively developed in recent years.

Among light-emitting devices using phosphorescent materials, a light-emitting device that emits blue phosphorescence in particular has not yet been put into practical use because it is difficult to develop a stable compound having a high triplet excitation energy level. For this reason, the development of a light-emitting device using a fluorescent material, which is more stable, has been conducted and a technique for improving the emission efficiency of a light-emitting device using a fluorescent material (a fluorescent light-emitting device) has been searched.

As a material capable of converting part or all of energy of the triplet excited state into light emission, a thermally activated delayed fluorescent (TADF) material is known in addition to a phosphorescent material. In a thermally activated delayed fluorescent material, a singlet excited state is generated from a triplet excited state by reverse intersystem crossing, and the singlet excited state is converted into light emission.

In order to improve the emission efficiency of a light-emitting device using a thermally activated delayed fluorescent material, not only efficient generation of a singlet excited state from a triplet excited state but also efficient light emission from a singlet excited state, that is, high fluorescence quantum yield, is important in the thermally activated delayed fluorescent material. It is, however, difficult to design a light-emitting material that simultaneously meets these two.

A method in which in a light-emitting device containing a thermally activated delayed fluorescent material and a fluorescent material, singlet excitation energy of the thermally activated delayed fluorescent material is transferred to the fluorescent material and light emission is obtained from the fluorescent material has been proposed (see Patent Document 1). In other words, alight-emitting device in which a thermally activated delayed fluorescent material is used as a host material and a fluorescent material is used as a guest material has been proposed.

REFERENCE

Patent Document

[Patent Document 1] Japanese Published Patent Application No. 2014-45179

SUMMARY OF THE INVENTION

Problems to be Solved by the Invention

Multicolor light-emitting devices typified by white light-emitting devices are expected to be applied to displays and the like. A multicolor light-emitting device preferably has a structure in which a plurality of light-emitting layers exhibiting different emission colors are provided between a pair of electrodes. In that case, the development of a light-emitting device including a combination of a light-emitting layer containing a phosphorescent material and a light-emitting layer containing a fluorescent material is required in terms of reliability and color purity.

An example of a method for improving the emission efficiency of a fluorescent light-emitting layer in a light-emitting device is as follows: in a fluorescent light-emitting layer containing a host material and a fluorescent material as a guest material, triplet excitation energy of the host material is converted into singlet excitation energy, and then, the singlet excitation energy is transferred to the fluorescent material. However, the process where the triplet excitation energy of the host material is converted into the singlet excitation energy is in competition with a process where the triplet excitation energy is deactivated. Therefore, the triplet excitation energy of the host material is not sufficiently converted into the singlet excitation energy in some cases. A possible pathway where the triplet excitation energy is deactivated is, for example, a deactivation pathway where the triplet excitation energy of a host material is transferred to the lowest triplet excitation energy level ($T_1$ level) of a fluorescent material in a fluorescent light-emitting layer. The energy transfer in the deactivation pathway does not contribute to light emission, which decreases the emission efficiency of the fluorescent light-emitting layer. This deactivation pathway can be inhibited by reducing the concentration of the fluorescent material as a guest material; however, in this case, the rate of energy transfer from the host material to a singlet excited state of the fluorescent material is also decreased, so that quenching due to a degraded material or an impurity is likely to occur. Accordingly, the luminance of the light-emitting device easily decreases, leading to a decrease in reliability. Furthermore, in the case where a phosphorescent light-emitting layer and a fluorescent light-emitting layer are close to each other, the aforementioned $T_1$ level of the fluorescent material might serve as a deactivation pathway of the triplet excitation energy of the phosphorescent light-emitting layer. In other words, the emission efficiency of the phosphorescent light-emitting layer is decreased.

Thus, an object of one embodiment of the present invention is to inhibit transfer of the triplet excitation energy of a host material to the $T_1$ level of a fluorescent material in a fluorescent light-emitting layer, and efficiently convert the triplet excitation energy of the host material into the singlet excitation energy of the fluorescent material, so as to improve the fluorescence efficiency and reliability of a light-emitting device. Another object is to improve the emission efficiency of both of a phosphorescent light-emitting layer and a fluorescent light-emitting layer in a light-emitting device including the phosphorescent light-emitting layer and the fluorescent light-emitting layer.

An object of one embodiment of the present invention is to provide a light-emitting device with high emission efficiency. Another object of one embodiment of the present invention is to provide a highly reliable light-emitting device. Another object of one embodiment of the present invention is to provide a light-emitting device with reduced power consumption. Another object of one embodiment of the present invention is to provide a novel light-emitting device. Another object of one embodiment of the present invention is to provide a novel light-emitting appliance. Another object of one embodiment of the present invention is to provide a novel display device.

Note that the description of the above objects does not disturb the existence of other objects. In one embodiment of the present invention, there is no need to achieve all of these objects. Objects other than those described above are apparent from the description of the specification and the like and objects other than those described above can be derived from the description of the specification and the like.

Means for Solving the Problems

One embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and five or more protecting groups; the luminophore is a condensed aromatic ring or a condensed heteroaromatic ring; the five or more protecting groups each independently have any one of an alkyl group having 1 to 10 carbon atoms, a substituted or unsubstituted cycloalkyl group having 3 to 10 carbon atoms, and a trialkylsilyl group having 3 to 12 carbon atoms; light emission is obtained from the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and five or more protecting groups; the luminophore is a condensed aromatic ring or a condensed heteroaromatic ring; the five or more protecting groups each independently have any one of an alkyl group having 1 to 10 carbon atoms, a substituted or unsubstituted cycloalkyl group having 3 to 10 carbon atoms, and a trialkylsilyl group having 3 to 12 carbon atoms; light emission is obtained from the second material; the second light-emitting layer includes a sixth material, a seventh material, and a fourth material; the fourth material has a function of converting triplet excitation energy into light emission; the sixth material and the seventh material form an exciplex; and the emission spectrum of the exciplex overlaps with the longest wavelength absorption band in the absorption spectrum of the fourth material.

In the above structure, it is preferable that at least four of the five or more protecting groups be each independently any one of an alkyl group having 3 to 10 carbon atoms, a substituted or unsubstituted cycloalkyl group having 3 to 10 carbon atoms, and a trialkylsilyl group having 3 to 12 carbon atoms.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and at least four protecting groups; the luminophore is a condensed aromatic ring or a condensed heteroaromatic ring; the four protecting groups are not directly bonded to the condensed aromatic ring or the condensed heteroaromatic ring; the four protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; light emission is obtained from the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and at least four protecting groups; the luminophore is a condensed aromatic ring or a condensed heteroaromatic ring; the four protecting groups are not directly bonded to the condensed aromatic ring or the condensed heteroaromatic ring; the four protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; light emission is obtained from the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and two or more diarylamino groups; the luminophore is a condensed aromatic ring or a condensed heteroaromatic ring; the condensed aromatic ring or the condensed heteroaromatic ring is bonded to the two or more diarylamino groups; aryl groups in the two or more diarylamino groups each independently have at least one protecting group; the protecting group has any one of an alkyl group having 3 to 10 carbon atoms, a substituted or unsubstituted cycloalkyl group having 3 to 10 carbon atoms, and a trialkylsilyl group having 3 to 12 carbon atoms; the T1 level of the first material is higher than the S1 level of the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and two or more diarylamino groups; the luminophore is a condensed aromatic ring or a condensed heteroaromatic ring; the condensed aromatic ring or the condensed heteroaromatic ring is bonded to the two or more diarylamino groups; aryl groups in the two or more diarylamino groups each independently have at least two protecting groups; the protecting groups each have any one of an alkyl group having 3 to 10 carbon atoms, a substituted or unsubstituted cycloalkyl group having 3 to 10 carbon atoms, and a trialkylsilyl group having 3 to 12 carbon atoms; the T1 level of the first material is higher than the S1 level of the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

In the above structure, the diarylamino group is preferably a diphenylamino group.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and a plurality of protecting groups; the luminophore is a condensed aromatic ring or a condensed heteroaromatic ring; the plurality of protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; at least one of atoms included in the plurality of protecting groups is positioned over one plane of the condensed aromatic ring or the condensed heteroaromatic ring and at least one of the atoms included in the plurality of protecting groups is positioned over the other plane of the condensed aromatic ring or the condensed heteroaromatic ring; light emission is obtained from the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

Another embodiment of the present invention is a light-emitting device including a first light-emitting layer and a second light-emitting layer between a pair of electrodes; the first light-emitting layer includes a first material and a second material; the first material has a function of converting triplet excitation energy into light emission; the second material has a function of converting singlet excitation energy into light emission and includes a luminophore and two or more diphenylamino groups; the luminophore is a condensed aromatic ring or a condensed heteroaromatic ring; the condensed aromatic ring or the condensed heteroaromatic ring is bonded to the two or more diphenylamino groups; phenyl groups in the two or more diphenylamino groups each independently have protecting groups at the 3-position and the 5-position; the protecting groups each independently have any one of an alkyl group having 3 to 10 carbon atoms, a substituted or unsubstituted cycloalkyl group having 3 to 10 carbon atoms, and a trialkylsilyl group having 3 to 12 carbon atoms; light emission is obtained from the second material; the second light-emitting layer includes a third material and a fourth material; the fourth material has a function of converting triplet excitation energy into light emission; and the emission spectrum of the third material overlaps with the longest wavelength absorption band in the absorption spectrum of the fourth material.

In the above structure, the alkyl group is preferably a branched-chain alkyl group.

In the above structure, the branched-chain alkyl group preferably has quaternary carbon.

In the above structure, the condensed aromatic ring or the condensed heteroaromatic ring preferably includes any one of naphthalene, anthracene, fluorene, chrysene, triphenylene, pyrene, tetracene, perylene, coumarin, quinacridone, and naphthobisbenzofuran.

In the above structure, preferably, the light-emitting layer further includes a fifth material and the first material and the fifth material form an exciplex.

In the above structure, the emission spectrum of a first exciplex preferably overlaps with the longest wavelength absorption band of the second material.

In the above structure, preferably, the third material includes the sixth material and the seventh material, the sixth material and the seventh material form a second exciplex, and the third material is the second exciplex.

In the above structure, preferably, the first material is a first phosphorescent material and the fourth material is a second phosphorescent material.

In the above structure, preferably, the first material is a compound exhibiting thermally activated delayed fluorescence and the fourth material is a phosphorescent material.

In the above structure, the difference between the energy value of a peak of the emission spectrum of the third material and the energy value of a peak of the longest wavelength absorption band in the absorption spectrum of the fourth material is preferably less than or equal to 0.2 eV.

In the above structure, the emission color obtained from the first light-emitting layer is preferably different from the emission color obtained from the second light-emitting layer, and further preferably, the peak wavelength of the emission spectrum obtained from the first light-emitting layer is shorter than the peak wavelength of the emission spectrum obtained from the second light-emitting layer.

Another embodiment of the present invention is a display device including the light-emitting device having any of the above structures and at least one of a color filter and a transistor. Another embodiment of the present invention is an electronic appliance including the display device and at least one of a housing and a touch sensor. Another embodiment of the present invention is a lighting device including the light-emitting device having any of the above structures and at least one of a housing and a touch sensor. The category of one embodiment of the present invention includes not only a light-emitting apparatus including a light-emitting device but also an electronic appliance including a light-emitting device. Accordingly, a light-emitting apparatus in this specification refers to an image display device or a light source (including a lighting device). In some cases, the light-emitting apparatus includes a display module in which a connector, for example, an FPC (Flexible Printed Circuit) or a TCP (Tape Carrier Package), is connected to a light-emitting device, a display module in which a printed wiring board is provided on the tip of a TCP, or a display module in which an IC (integrated circuit) is directly mounted on a light-emitting device by a COG (Chip On Glass) method.

Effect of the Invention

According to one embodiment of the present invention, a light-emitting device with high emission efficiency can be provided. According to another embodiment of the present invention, a highly reliable light-emitting device can be provided. According to another embodiment of the present invention, a light-emitting device with reduced power consumption can be provided. According to another embodiment of the present invention, a novel light-emitting device can be provided. According to another embodiment of the present invention, a novel light-emitting appliance can be provided. According to another embodiment of the present invention, a novel display device can be provided.

Note that the description of these effects does not disturb the existence of other effects. In one embodiment of the present invention, there is no need to achieve all of these effects. Other effects are apparent from the description of the specification, drawings, claims, and the like and other effects can be derived from the description of the specification, drawings, claims, and the like.

BRIEF DESCRIPTION OF THE DRAWINGS

FIG. 14A and FIG. 14B are schematic cross-sectional views illustrating display devices of one embodiment of the present invention.

FIG. 15A and FIG. 15B are schematic cross-sectional views illustrating display devices of one embodiment of the present invention.

MODE FOR CARRYING OUT THE INVENTION

Figure 1A:
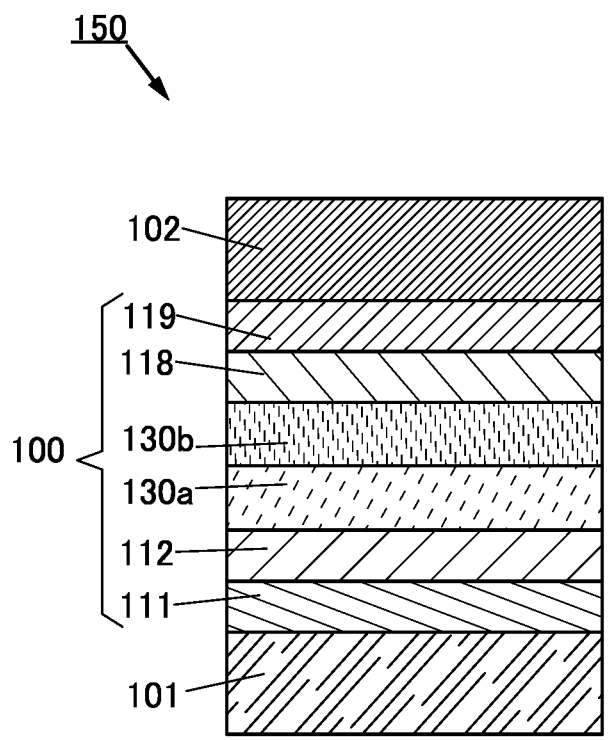
FIG. 1A and FIG. 1B are schematic cross-sectional views of a light-emitting device of one embodiment of the present invention.

Embodiments of the present invention are described in detail below with reference to drawings. Note that the present invention is not limited to the following description, and the modes and details of the present invention can be modified in various ways without departing from the spirit and scope of the present invention. Accordingly, the present invention should not be interpreted as being limited to the description of the embodiments below.

Note that the position, size, range, or the like of each component illustrated in drawings and the like is not accurately represented in some cases for easy understanding. Therefore, the disclosed invention is not necessarily limited to the position, size, range, or the like disclosed in drawings and the like.

In this specification and the like, the ordinal numbers such as first and second are used for convenience, and do not denote the order of steps or the stacking order of layers in some cases. Therefore, for example, description can be made even when "first" is replaced with "second", "third", or the like, as appropriate. In addition, the ordinal numbers in this specification and the like do not correspond to the ordinal numbers which are used to specify one embodiment of the present invention in some cases.

In describing structures of the invention in this specification and the like with reference to drawings, common numerals are used for the same components in different drawings in some cases.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, a singlet excited state (S*) refers to a singlet state having excitation energy. An S1 level means the lowest level of the singlet excitation energy level, that is, the excitation energy level of the lowest singlet excited state (S1 state). A triplet excited state (T*) refers to a triplet state having excitation energy. A T1 level means the lowest level of the triplet excitation energy level, that is, the excitation energy level of the lowest triplet excited state (T1 state). Note that in this specification and the like, simple expressions singlet excited state and singlet excitation energy level mean the S1 state and the S1 level, respectively, in some cases. In addition, expressions triplet excited state and triplet excitation energy level mean the T1 state and the T1 level, respectively, in some cases.

In this specification and the like, a fluorescent material refers to a compound that supplies light emission in the visible light region when the relaxation from the singlet excited state to the ground state occurs. A phosphorescent material refers to a compound that supplies light emission in the visible light region at room temperature when the relaxation from the triplet excited state to the ground state occurs. In other words, a phosphorescent material refers to one of compounds that can convert triplet excitation energy into visible light.

In this specification and the like, a wavelength range of blue is greater than or equal to 400 nm and less than 490 nm, and blue light has at least one emission spectrum peak in that wavelength range. A wavelength range of green is greater than or equal to 490 nm and less than 580 nm, and green light has at least one emission spectrum peak in that wavelength range. A wavelength range of red is greater than or equal to 580 nm and less than or equal to 680 nm, and red light has at least one emission spectrum peak in that wavelength range.

In this specification and the like, a light-emitting layer refers to a layer that contains at least one kind of fluorescent material or phosphorescent material. A fluorescent light-emitting layer refers to a layer from which fluorescence is obtained whereas a phosphorescent light-emitting layer refers to a layer from which phosphorescence is obtained. When current flows through a light-emitting device, light emission derived from a fluorescent material or a phosphorescent material included in a light-emitting layer can be obtained from the light-emitting device.

Embodiment 1

In this embodiment, a light-emitting device of one embodiment of the present invention will be described below with reference to FIG. 1 to FIG. 5.

Structure Example of Light-Emitting Device

First, a structure of a light-emitting device of one embodiment of the present invention will be described below with reference to FIG. 1.

Figure 1B:
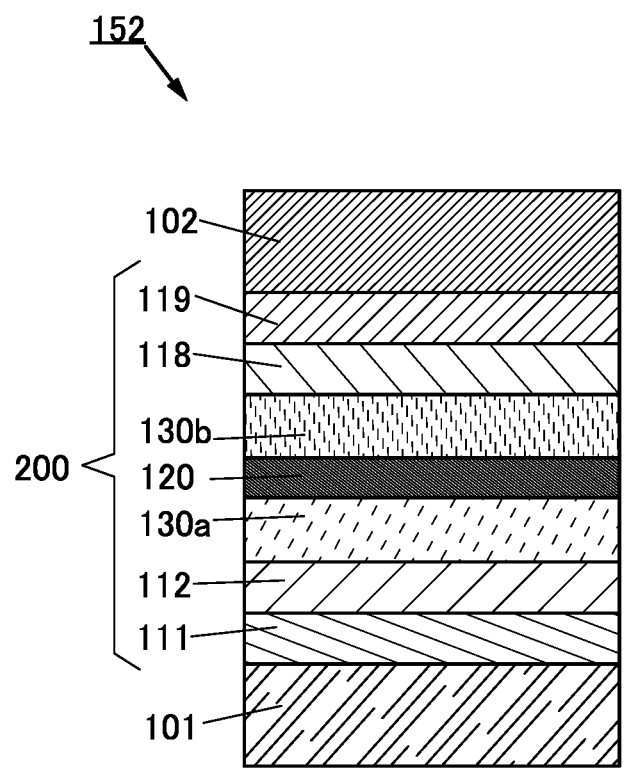

FIG. 1A and FIG. 1B are schematic cross-sectional views of a light-emitting device 150 and a light-emitting device 152 of one embodiment of the present invention.

The light-emitting device 150 and the light-emitting device 152 each include a pair of electrodes (an electrode 101 and an electrode 102) and an EL layer 100 or an EL layer 200 provided between the pair of electrodes. The EL layer 100 and the EL layer 200 each include at least a light-emitting layer 130a and a light-emitting layer 130b.

The EL layer 100 illustrated in FIG. 1A includes, in addition to the light-emitting layer 130a and the light-emitting layer 130b, functional layers such as a hole-injection layer 111, a hole-transport layer 112, an electron-transport layer 118, and an electron-injection layer 119, and the EL layer 200 illustrated in FIG. 1B further includes a separation layer 120. In other words, the EL layer 200 has a structure in which the separation layer 120 is added to the EL layer 100.

Although description in this embodiment is given assuming that the electrode 101 and the electrode 102 of the pair of electrodes serve as an anode and a cathode, respectively, the structures of the light-emitting device 150 and the light-emitting device 152 are not limited thereto. That is, the electrode 101 may serve as a cathode, the electrode 102 may serve as an anode, and the stacking order of the layers between the electrodes may be reversed. In other words, the hole-injection layer 111, the hole-transport layer 112, the light-emitting layer 130a, the light-emitting layer 130b, the electron-transport layer 118, and the electron-injection layer 119 may be stacked in this order from the anode side.

Although FIG. 1A and FIG. 1B illustrate that the hole-transport layer 112 and the light-emitting layer 130a are adjacent to each other and the electron-transport layer 118 and the light-emitting layer 130b are adjacent to each other, the structures of the light-emitting device 150 and the light-emitting device 152 are not limited thereto. That is, the light-emitting device 150 and the light-emitting device 152 may have a structure in which the hole-transport layer 112 and the light-emitting layer 130b are adjacent to each other and the electron-transport layer 118 and the light-emitting layer 130a are adjacent to each other.

The structures of the EL layer 100 and the EL layer 200 are not limited to the structures illustrated in FIG. 1A and FIG. 1B, and a structure including at least one selected from the hole-injection layer 111, the hole-transport layer 112, the electron-transport layer 118, and the electron-injection layer 119 can be employed. Alternatively, the EL layer 100 and the EL layer 200 may have a structure including a functional layer which has a function of lowering a hole- or electron-injection barrier, improving a hole- or electron-transport property, inhibiting a hole- or electron-transport property, inhibiting a quenching phenomenon by an electrode, or the like. Note that the functional layers may each be a single layer or have a structure in which a plurality of layers are stacked.

Description in this embodiment is given assuming that the light-emitting layer 130a is a fluorescent light-emitting layer containing a fluorescent material whereas the light-emitting layer 130b is a phosphorescent light-emitting layer containing a phosphorescent material. Thus, fluorescence and phosphorescence can be obtained from the light-emitting device of one embodiment of the present invention.

<Light Emission Mechanism of Light-Emitting Layer 130a>

Next, a light emission mechanism of the light-emitting layer 130a, which is a fluorescent light-emitting layer, will be described below.

In the light-emitting device 150 and the light-emitting device 152 of one embodiment of the present invention, voltage application between the pair of electrodes (the electrode 101 and the electrode 102) allows electrons and holes to be injected from the cathode and the anode, respectively, into the EL layer 100 or the EL layer 200 and thus current flows. The ratio of singlet excitons to triplet excitons (hereinafter, exciton generation probability) which are generated by recombination of carriers (electrons and holes) is 1:3 according to the statistically obtained probability. In other words, the generation probability of singlet excitons is 25% and the generation probability of triplet excitons is 75%; thus, it is important to make the triplet excitons contribute to light emission in order to improve the emission efficiency of the light-emitting device. For this reason, a material that has a function of converting triplet excitation energy into light emission is preferably used for the light-emitting layer 130a.

As the material that has a function of converting triplet excitation energy into light emission, a phosphorescent material is given. A phosphorescent material in this specification and the like refers to a compound that exhibits phosphorescence but does not exhibit fluorescence at a temperature higher than or equal to low temperatures (e.g., 77 K) and lower than or equal to room temperature (i.e., higher than or equal to 77 K and lower than or equal to 313 K). The phosphorescent material preferably contains a metal element with large spin-orbit interaction, specifically a transition metal element. It is particularly preferable that a platinum group element (ruthenium (Ru), rhodium (Rh), palladium (Pd), osmium (Os), iridium (Ir), or platinum (Pt)), especially iridium, be contained. When Ir is contained, the transition probability relating to direct transition between the singlet ground state and the triplet excited state can be increased.

As the material that has a function of converting triplet excitation energy into light emission, a TADF material is given. Note that the TADF material refers to a material that has a small difference between the S1 level and the T1 level and can convert triplet excitation energy into singlet excitation energy by reverse intersystem crossing. Thus, it is possible to upconvert triplet excitation energy into singlet excitation energy (reverse intersystem crossing) using a little thermal energy and to efficiently generate a singlet excited state. An exciplex (also referred to as Exciplex) whose excited state is formed by two kinds of substances has an extremely small difference between the S1 level and the T1 level and functions as a TADF material that can convert triplet excitation energy into singlet excitation energy.

Note that a phosphorescent spectrum observed at low temperatures (e.g., 10 K) is used for an index of the T1 level. When the level of energy with a wavelength of the line obtained by extrapolating a tangent to the fluorescent spectrum at room temperature or low temperatures at a tail on the short wavelength side is the S1 level and the level of energy with a wavelength of the line obtained by extrapolating a tangent to the phosphorescent spectrum at a tail on the short wavelength side is the T1 level, the difference between S1 and T1 of the TADF material is preferably smaller than or equal to 0.2 eV.

As the material that has a function of converting triplet excitation energy into light emission, a nanostructure of a transition metal compound having a perovskite structure is also given. In particular, a nanostructure of a metal-halide perovskite material is preferable. The nanostructure is preferably a nanoparticle or a nanorod.

Figure 2A:
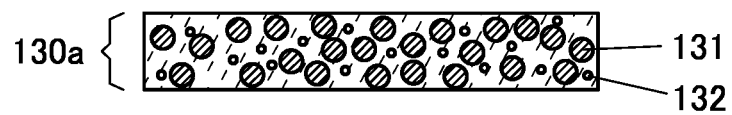
FIG. 2A is a schematic cross-sectional view of a light-emitting layer of a light-emitting device of one embodiment of the present invention.
Figure 2B:
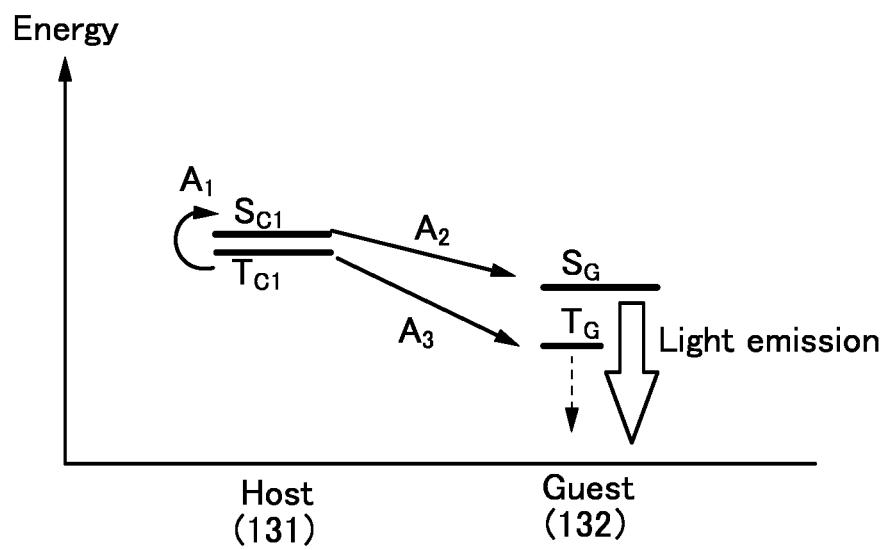
FIG. 2B is a diagram illustrating the correlation between energy levels.

FIG. 2A is a schematic cross-sectional view illustrating the light-emitting layer 130a of the light-emitting device of one embodiment of the present invention. In one embodiment of the present invention, the light-emitting layer 130a contains a compound 131 and a compound 132. The compound 131 has a function of converting triplet excitation energy into light emission and the compound 132 has a function of converting singlet excitation energy into light emission. In order to obtain a highly reliable light-emitting device, a fluorescent material is preferably used as the compound 132 because it has high stability. Since the compound 131 has a function of converting triplet excitation energy into light emission, carrier recombination preferably occurs in the compound 131 in order to obtain a light-emitting device with high emission efficiency. Therefore, it is preferable that both the singlet excitation energy and the triplet excitation energy of excitons generated by carrier recombination in the compound 131 be finally transferred to the singlet excited state of the compound 132, and the compound 132 emit light. Here, in the light-emitting layer 130a, the compound 131 serves as an energy donor and the compound 132 serves as an energy acceptor. In FIG. 2A and FIG. 2B, the light-emitting layer 130a is a fluorescent light-emitting layer including the compound 131 as a host material and the compound 132 as a guest material. That is, in FIG. 2A and FIG. 2B, the host material has a function of an energy donor and the guest material has a function of an energy acceptor. In addition, light emission derived from the compound 132 serving as a guest material can be obtained from the light-emitting layer 130a.

Structure Example 1 of Light-Emitting Layer 130a

FIG. 2B shows an example of the correlation between energy levels in the light-emitting layer of the light-emitting device of one embodiment of the present invention. In this structure example, the case where a TADF material is used as the compound 131 is described.

FIG. 2B shows the correlation between the energy levels of the compound 131 and the compound 132 in the light-emitting layer 130a. The vertical axis in FIG. 2B denotes energy (arbitrary unit). The following explains what the terms and numerals in FIG. 2B represent.

Host (131): compound 131
Guest (132): compound 132
$T_{C1}$: T1 level of compound 131
$S_{C1}$: S1 level of compound 131
$S_G$: S1 level of compound 132
$T_G$: T1 level of compound 132

Here, the triplet excitation energy of the compound 131 generated by current excitation is focused on. The compound 131 has a TADF property. Therefore, the compound 131 has a function of converting triplet excitation energy into singlet excitation energy by upconversion (Route $A_1$ in FIG. 2B). The singlet excitation energy of the compound 131 can be rapidly transferred to the compound 132 (Route $A_2$ in FIG. 2B). At this time, $S_{C1} \geq S_G$ is preferably satisfied. Specifically, when the level of energy with a wavelength of the line obtained by extrapolating a tangent to the fluorescent spectrum of the compound 131 at a tail on the short wavelength side is $S_{C1}$ and the level of energy with a wavelength of the absorption edge of the absorption spectrum of the compound 132 is $S_G$, $S_{C1} \geq S_G$ is preferably satisfied. Note that $S_{C1}$ and $T_{C1}$ are significantly small because the compound 131 is a material having a TADF property. Thus, $S_{C1} \geq S_{T1} \geq S_G$ can be satisfied.

The triplet excitation energy generated in the compound 131 is transferred to the S1 level of the compound 132, which is a guest material, through Route $A_1$ and Route $A_2$ described above and the compound 132 emits light, whereby the emission efficiency of the fluorescent light-emitting device can be improved. In Route $A_2$, the compound 131 serves as an energy donor and the compound 132 serves as an energy acceptor.

Here, in the light-emitting layer 130a, the compound 131 and the compound 132 are mixed. Thus, a process where the triplet excitation energy of the compound 131 is converted into the triplet excitation energy of the compound 132 (Route $A_3$ in FIG. 2B) is likely to occur in competition with Route $A_1$ and Route $A_2$ described above. Since the compound 132 is a fluorescent material, the triplet excitation energy of the compound 132 does not contribute to light emission. In other words, when the energy transfer through Route $A_3$ occurs, the emission efficiency of the light-emitting device decreases. Note that in practice, the energy transfer from $T_{C1}$ to $T_G$ (Route $A_3$) can be, not a direct route, a pathway where $T_{C1}$ is once transferred to the triplet excited state at a level higher than $T_G$ of the compound 132 and then the triplet excited state is converted into $T_G$ by internal conversion; the process is omitted in the drawing. Hereinafter, the same applies to all undesired thermal deactivation processes, that is, all the deactivation processes to $T_G$ in this specification.

As mechanisms of the intermolecular energy transfer, the Förster mechanism (dipole-dipole interaction) and the Dexter mechanism (electron exchange interaction) are known. Since the compound 132, which is an energy acceptor, is a fluorescent material, the Dexter mechanism is dominant as the mechanism of energy transfer through Route $A_3$. In general, the Dexter mechanism occurs significantly when the distance between the compound 131, which is an energy donor, and the compound 132, which is an energy acceptor, is less than or equal to 1 nm. Therefore, to inhibit Route $A_3$, it is important that the distance between the host material and the guest material, that is, the distance between the energy donor and the energy acceptor be large.

Since direct transition from a singlet ground state to a triplet excited state in the compound 132 is forbidden, energy transfer from the singlet excitation energy level ($S_{C1}$) of the compound 131 to the triplet excitation energy level ($T_G$) of the compound 132 is unlikely to be a main energy transfer process; thus, the energy transfer is not illustrated.

$T_G$ in FIG. 2B is the energy level derived from a luminophore in the energy acceptor in many cases. Therefore, specifically, to inhibit Route $A_3$, it is important that the energy donor and the luminophore of the energy acceptor be made away from each other. A general method for making the energy donor and the luminophore of the energy acceptor away from each other is to lower the concentration of the energy acceptor in a mixed film of these compounds. However, lowering the concentration of the energy acceptor in the mixed film inhibits not only energy transfer based on the Dexter mechanism from the energy donor to the energy acceptor but also energy transfer based on the Förster mechanism from the energy donor to the energy acceptor. In that case, a problem such as a decrease in the emission efficiency and reliability of the light-emitting device is caused because Route $A_2$ is based on the Förster mechanism.

In view of the above, the present inventors have found that the above decrease in emission efficiency and reliability can be inhibited by using, as an energy acceptor, a fluorescent material having protecting groups for keeping a distance from the energy donor. The present inventors also have found that a decrease in the emission efficiency of a phosphorescent light-emitting layer, which is caused when the phosphorescent light-emitting layer and a fluorescent light-emitting layer are combined, can be inhibited.

<Concept of Fluorescent Material Having Protecting Groups>

Figure 3A:
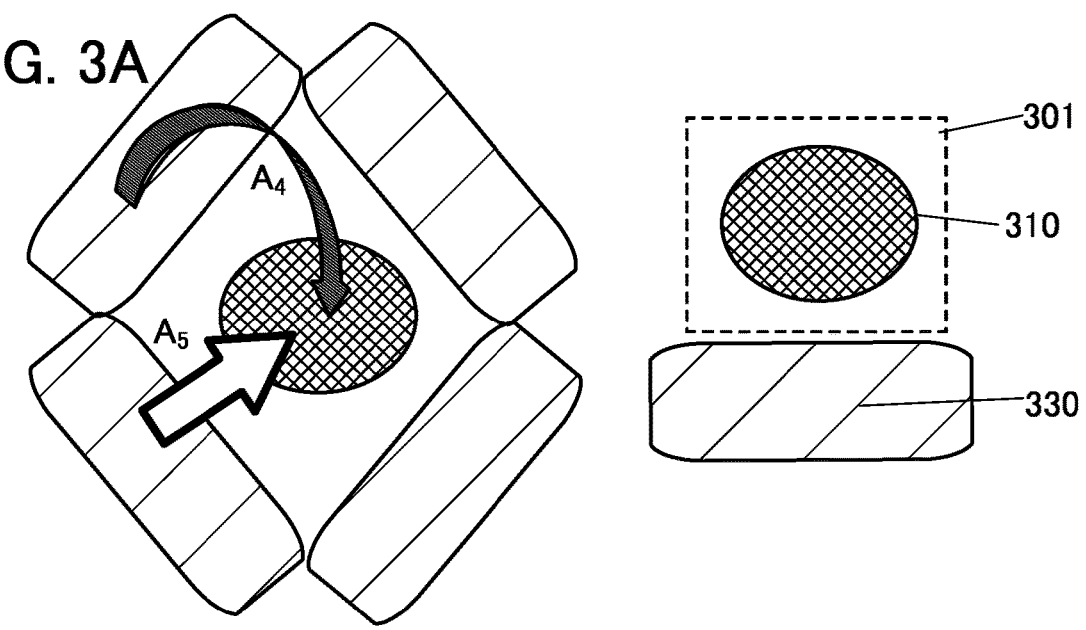
FIG. 3A is a conceptual diagram of a conventional guest material.
Figure 3B:
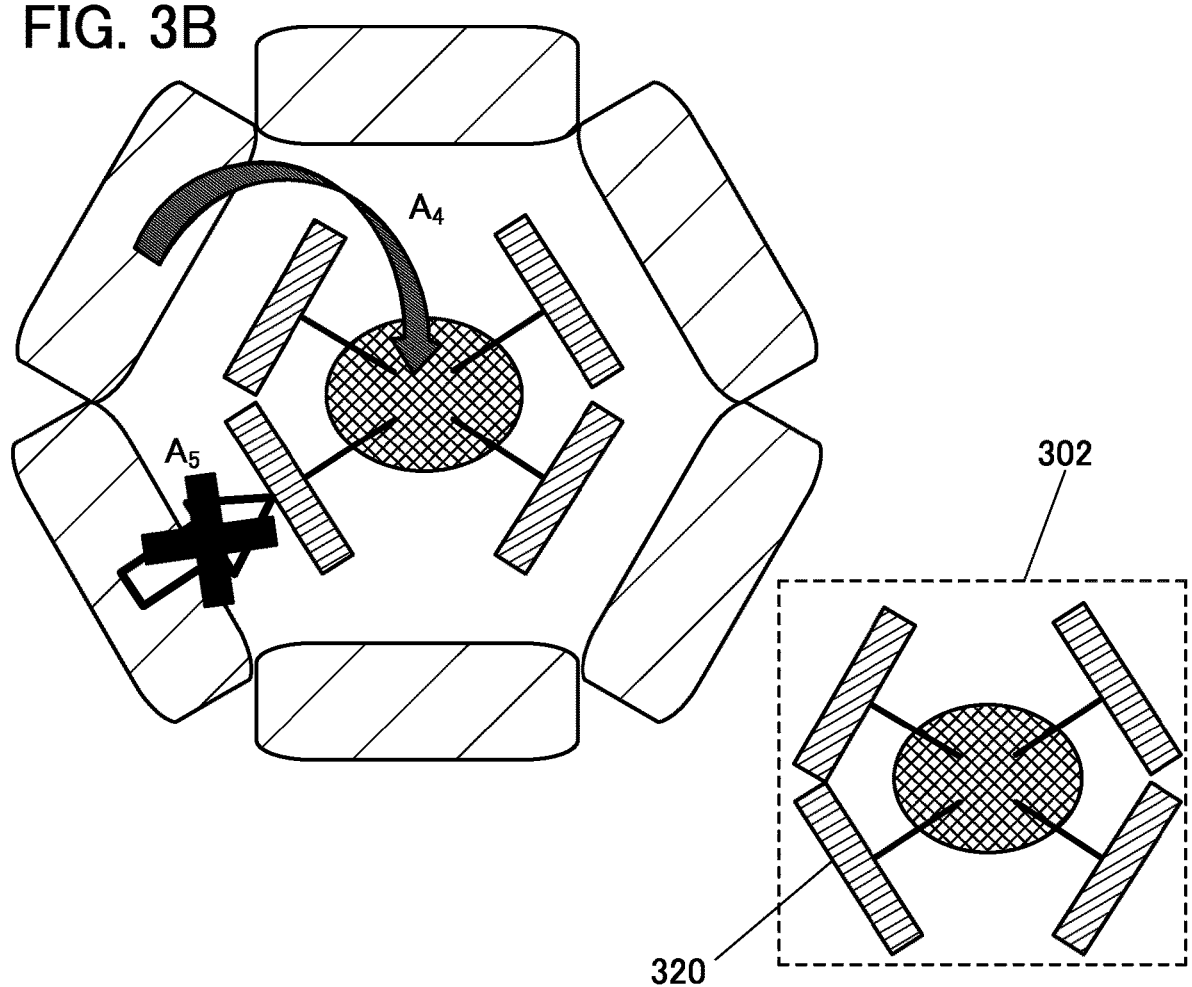
FIG. 3B is a conceptual diagram of a guest material used in a light-emitting device of one embodiment of the present invention.

FIG. 3A is a conceptual diagram illustrating the case where a typical fluorescent material having no protecting group is dispersed as a guest material in a host material. FIG. 3B is a conceptual diagram illustrating the case where a fluorescent material having protecting groups, which is used for the light-emitting device of one embodiment of the present invention, is dispersed as a guest material in a host material. The host material and the guest material may be rephrased as an energy donor and an energy acceptor, respectively. Here, the protecting groups have a function of making a luminophore and the host material away from each other. In FIG. 3A, a guest material 301 includes a luminophore 310. The guest material 301 has a function of an energy acceptor. In contrast, a guest material 302 includes the luminophore 310 and protecting groups 320 in FIG. 3B. In FIG. 3A and FIG. 3B, the guest material 301 and the guest material 302 are surrounded by host materials 330. Since the luminophore is close to the host materials in FIG. 3A, both energy transfer by the Förster mechanism (Route $A_4$ in FIG. 3A and FIG. 3B) and energy transfer by the Dexter mechanism (Route $A_5$ in FIG. 3A and FIG. 3B) can occur as the energy transfer from the host materials 330 to the guest material 301. In the case where the guest material is a fluorescent material, when the triplet excitation energy transfer from the host material to the guest material is caused by the Dexter mechanism and the triplet exited state of the guest material is generated, non-radiative decay of the triplet excitation energy occurs, contributing to a reduction in the emission efficiency.

In contrast, the guest material 302 in FIG. 3B has the protecting groups 320. Thus, the luminophore 310 and the host materials 330 can be kept away from each other. This inhibits energy transfer by the Dexter mechanism (Route $A_5$).

Here, in order that the guest material 302 can emit light, the guest material 302 needs to receive energy from the host materials 330 by the Förster mechanism because the Dexter mechanism is inhibited. In other words, it is preferable that energy transfer by the Förster mechanism be efficiently utilized while energy transfer by the Dexter mechanism is inhibited. It is known that energy transfer by the Förster mechanism is also affected by the distance between a host material and a guest material. In general, the Dexter mechanism is dominant when the distance between the host material 330 and the guest material 302 is less than or equal to 1 nm, and the Förster mechanism is dominant when the distance therebetween is greater than or equal to 1 nm and less than or equal to 10 nm. Energy transfer is generally unlikely to occur when the distance between the host material 330 and the guest material 302 is greater than or equal to 10 nm. Here, the distance between the host material 330 and the guest material 302 can be rephrased as the distance between the host material 330 and the luminophore 310.

Thus, the protecting groups 320 preferably extend within a range from 1 nm to 10 nm, further preferably from 1 nm to 5 nm from the luminophore 310. With such a structure, energy transfer by the Förster mechanism from the host material 330 to the guest material 302 can be efficiently utilized while energy transfer by the Dexter mechanism is inhibited. Thus, a light-emitting device with high emission efficiency can be fabricated.

Furthermore, in order to improve the efficiency of energy transfer (increase the energy transfer rate) by the Förster mechanism, the concentration of the guest material 301 or the guest material 302 with respect to the host material 330 is preferably increased. However, as the concentration of the guest material is increased, the rate of energy transfer by the Dexter mechanism is usually increased, resulting in a decrease in emission efficiency. It is thus difficult to increase the concentration of the guest material. As a fluorescent light-emitting device using a material having a function of converting triplet excitation energy into light emission as a host material, a light-emitting device having a small guest material concentration of lower than or equal to 1 wt % has been reported.

In contrast, in the light-emitting device of one embodiment of the present invention, a guest material in which a luminophore has protecting groups is used for a light-emitting layer. Therefore, energy transfer by the Förster mechanism can be efficiently utilized while energy transfer by the Dexter mechanism inhibited; thus, the concentration of the guest material serving as an energy acceptor can be increased. As a result, increasing the rate of energy transfer by the Förster mechanism and inhibiting energy transfer by the Dexter mechanism, which are originally conflicting phenomena, can be concurrently caused. By increasing the rate of energy transfer due to the Förster mechanism, the excitation lifetime of the energy acceptor in the light-emitting layer is shortened, leading to an improvement in the reliability of the light-emitting device. The concentration of the guest material with respect to the host material is preferably higher than or equal to 2 wt % and lower than or equal to 30 wt %, further preferably higher than or equal to 5 wt % and lower than or equal to 20 wt %, and still further preferably higher than or equal to 5 wt % and lower than or equal to 15 wt %. With such a structure, the rate of energy transfer by the Förster mechanism can be increased; thus, a light-emitting device with high emission efficiency can be obtained. In addition, the use of a material having a function of converting triplet excitation energy into light emission as a host material allows fabrication of a fluorescent light-emitting device having emission efficiency as high as that of a phosphorescent light-emitting device. Since the emission efficiency can be improved using a fluorescent material having high stability, a highly reliable light-emitting device can be fabricated. Note that the above-described concentration is the concentration obtained when a light-emitting material is mainly used as the guest material and a material other than the guest material is used as the host material of the light-emitting layer.

In particular, the effect of the light-emitting device of one embodiment of the present invention is not only an increase in reliability owing to the use of a fluorescent material with high stability. The energy transfer described above always conflicts with a quenching process due to the influence of a degraded material and an impurity. As the quenching rate constant of the quenching process increases over time, the proportion of light emission from the light-emitting device decreases. That is, the luminance of the light-emitting device deteriorates. However, as described above, in one embodiment of the present invention, the rate of energy transfer by the Förster mechanism can be more increased than in a conventional light-emitting device while the energy transfer by the Dexter mechanism is inhibited; thus, the influence of conflict with the quenching process can be reduced, so that the lifetime of the device can be increased.

Here, the luminophore refers to an atomic group (skeleton) that causes light emission in a fluorescent material. The luminophore generally has a π bond and preferably has an aromatic ring, further preferably a condensed aromatic ring or a condensed heteroaromatic ring. As another embodiment, the luminophore can be regarded as an atomic group (skeleton) having an aromatic ring having a transition dipole vector on a ring plane. In the case where one fluorescent material has a plurality of condensed aromatic rings or condensed heteroaromatic rings, a skeleton having the lowest S1 level among the plurality of condensed aromatic rings or condensed heteroaromatic rings is considered as a luminophore of the fluorescent material in some cases. In other cases, a skeleton having an absorption edge on the longest wavelength side among the plurality of condensed aromatic rings or condensed heteroaromatic rings may be considered as the luminophore of the fluorescent material. The luminophore of the fluorescent material can be presumed from the shapes of the emission spectra of the plurality of condensed aromatic rings or condensed heteroaromatic rings in some cases.

As the condensed aromatic ring or the condensed heteroaromatic ring, a phenanthrene skeleton, a stilbene skeleton, an acridone skeleton, a phenoxazine skeleton, a phenothiazine skeleton, and the like are given. Specifically, fluorescent materials having a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton are preferable because of their high fluorescence quantum yields.

Substituents used as the protecting groups need to have a triplet excitation energy level higher than the T1 levels of the luminophore and the host material. Thus, a saturated hydrocarbon group is favorably used. This is because a substituent having no π bond has a high triplet excitation energy level. In addition, a substituent having no π bond has a poor function of transporting carriers (electrons or holes). Thus, a saturated hydrocarbon group can make the luminophore and the host material away from each other with little influence on the excited state or the carrier-transport property of the host material. In an organic compound including a substituent having no π bond and a substituent having a π-conjugated system, frontier orbitals {HOMO (Highest Occupied Molecular Orbital) and LUMO (Lowest Unoccupied Molecular Orbital)} are present on the side of the substituent having a π-conjugated system in many cases; in particular, the luminophore tends to have the frontier orbitals. As described later, the overlap of the HOMOs of the energy donor and the energy acceptor and the overlap of the LUMOs of the energy donor and the energy acceptor are important for energy transfer by the Dexter mechanism. Therefore, the use of a saturated hydrocarbon group as the protecting group enables a large distance between the frontier orbitals of the host material serving as an energy donor and the frontier orbitals of the guest material serving as an energy acceptor, leading to inhibition of energy transfer by the Dexter mechanism.

A specific example of the protecting group is an alkyl group having 1 to 10 carbon atoms. In addition, the protecting group is preferably a bulky substituent because the luminophore and the host material need to be away from each other. Thus, an alkyl group having 3 to 10 carbon atoms, a substituted or unsubstituted cycloalkyl group having 3 to 10 carbon atoms, or a trialkylsilyl group having 3 to 12 carbon atoms can be favorably used. In particular, the alkyl group is preferably a bulky branched-chain alkyl group. Furthermore, the substituent preferably has quaternary carbon, in which case it becomes a bulky substituent.

One luminophore preferably has five or more protecting groups. With such a structure, the luminophore can be entirely covered with the protecting groups, so that the distance between the host material and the luminophore can be adjusted as appropriate. In FIG. 3B, the protecting groups are directly bonded to the luminophore; however, the protecting groups are preferably not directly bonded to the luminophore. For example, the protecting groups may each be bonded to the luminophore via a substituent with a valence of 2 or more, such as an arylene group or an amino group. Bonding of each of the protecting groups to the luminophore via the substituent can effectively make the luminophore away from the host material. Thus, in the case where the protecting groups are not directly bonded to the luminophore, four or more protecting groups for one luminophore can effectively inhibit energy transfer by the Dexter mechanism.

Furthermore, the substituent with a valence of 2 or more that bonds the luminophore and each of the protecting groups is preferably a substituent having a π-conjugated system. With such a structure, the physical properties of the guest material, such as the emission color, the HOMO level, and the glass transition point, can be adjusted. Note that the protecting groups are preferably positioned on the outermost side when the molecular structure is observed with the luminophore positioned at the center.

Examples of Fluorescent Material Having Protecting Groups and its Molecular Structure Here, a structure of N,N'-[(2-tert-butylanthracene)-9,10-diyl]-N,N-bis(3,5-di-tert-butylphenyl)amine (abbreviation: 2tBu-mmtBuDPhA2Anth), a fluorescent material that is represented by Structural Formula (102) below and can be used for the light-emitting device of one embodiment of the present invention, is shown. In 2tBu-mmtBuDPhA2Anth, an anthracene ring is a luminophore and tertiary butyl (tBu) groups serve as protecting groups.

[Chemical Formula 1]

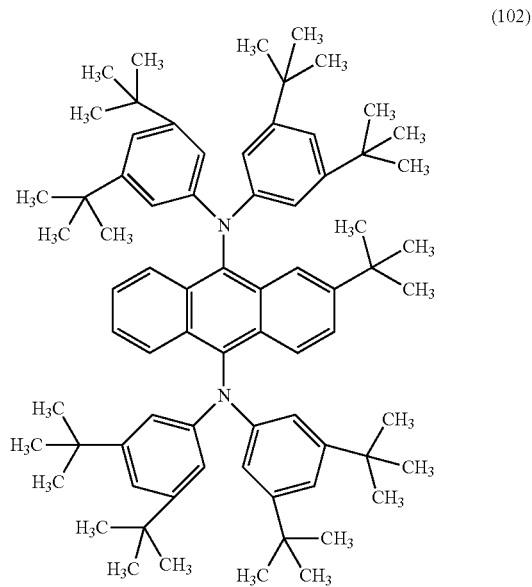

(102)

Figure 4A:
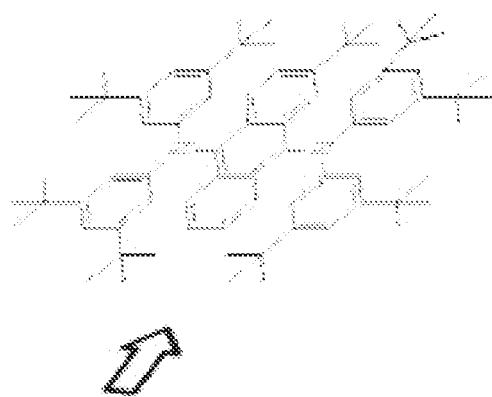
FIG. 4A is a structural formula of a guest material used in a light-emitting device of one embodiment of the present invention.
Figure 4B:
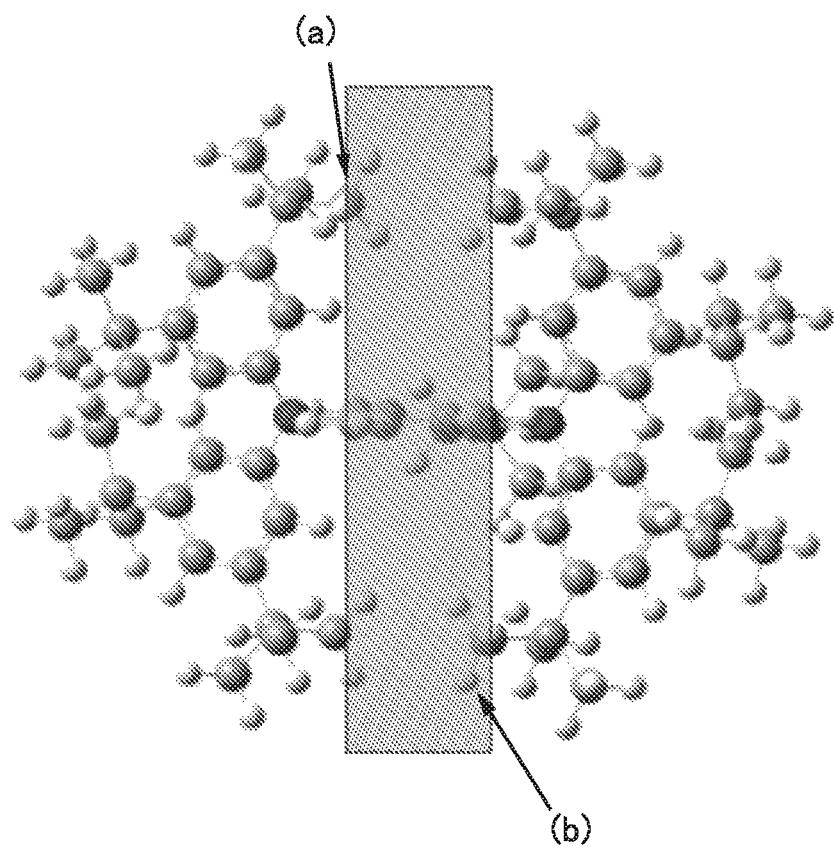
FIG. 4B is a ball-and-stick diagram of the guest material used in the light-emitting device of one embodiment of the present invention.

FIG. 4B shows a ball-and-stick model image of 2tBu-mmtBuDPhA2Anth shown above. Note that FIG. 4B shows the state where 2tBu-mmtBuDPhA2Anth is viewed in the direction indicated by an arrow in FIG. 4A (the direction parallel to the anthracene ring plane). The hatched portion in FIG. 4B represents an overhead portion of the anthracene ring plane, which is a luminophore, and the overhead portion includes a region overlapping with tBu groups, which are protecting groups. For example, in FIG. 4B, an atom indicated by an arrow (a) is a carbon atom of the tBu group overlapping with the hatched portion, and an atom indicated by an arrow (b) is a hydrogen atom of the tBu group overlapping with the hatched portion. In other words, in 2tBu-mmtBuDPhA2Anth, atoms included in protecting groups are positioned over one plane of the luminophore, and atoms included in protecting groups are also positioned over the other plane. With such a structure, even in the state where a guest material is dispersed in a host material, the anthracene ring, which is the luminophore, and the host material can be away from each other in both the horizontal direction and the vertical direction of the anthracene ring, leading to inhibition of energy transfer by the Dexter mechanism.

In addition, for example, when the transition related to energy transfer is transition between HOMO and LUMO, the overlap of the HOMOs of the host material and the guest material and the overlap of the LUMOs of the host material and the guest material are important for energy transfer by the Dexter mechanism. The overlap of the HOMOs of both of the materials and the overlap of the LUMOs thereof significantly cause the Dexter mechanism. Therefore, it is important to inhibit the overlap of the HOMOs of both of the materials and the overlap of the LUMOs thereof in order to inhibit the Dexter mechanism. In other words, it is important that the distance between the skeleton and the host material, which are related to the excited state, be large. In a fluorescent material, both HOMO and LUMO are included in a luminophore in many cases. For example, in the case where the HOMO and LUMO of a guest material extend above and below the luminophore plane (above and below the anthracene ring in 2tBu-mmtBuDPhA2Anth), it is important that the upper and lower planes of the luminophore be covered with protecting groups in the molecular structure. Note that the phrase above and below the anthracene ring means the upper and lower planes of the anthracene ring plane seen from the direction of the arrow in FIG. 4A.

A condensed aromatic ring and a condensed heteroaromatic ring serving as a luminophore, such as a pyrene ring and an anthracene ring, have a transition dipole vector on the ring plane. Thus, in FIG. 4B, 2tBu-mmtBuDPhA2Anth preferably includes a region overlapping with a tBu group, which is a protecting group, on the plane where the transition dipole vector is present, that is, over the plane of the anthracene ring. Specifically, at least one of atoms of a plurality of protecting groups (the tBu groups in FIG. 4) is positioned over one plane of a condensed aromatic ring or a condensed heteroaromatic ring (the anthracene ring in FIG. 4), and at least one of atoms of the plurality of protecting groups is positioned over the other plane of the condensed aromatic ring or the condensed heteroaromatic ring. With such a structure, even in the state where a guest material is dispersed in a host material, the luminophore and the host material can be away from each other, leading to inhibition of energy transfer by the Dexter mechanism. Furthermore, protecting groups such as tBu groups are preferably positioned to cover a luminophore such as an anthracene ring.

Structure Example 2 of Light-Emitting Layer 130a

Figure 5A:
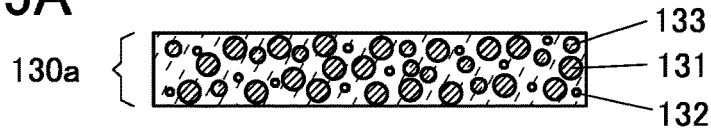
FIG. 5A is a schematic cross-sectional view of a light-emitting layer of a light-emitting device of one embodiment of the present invention.
Figure 5B:
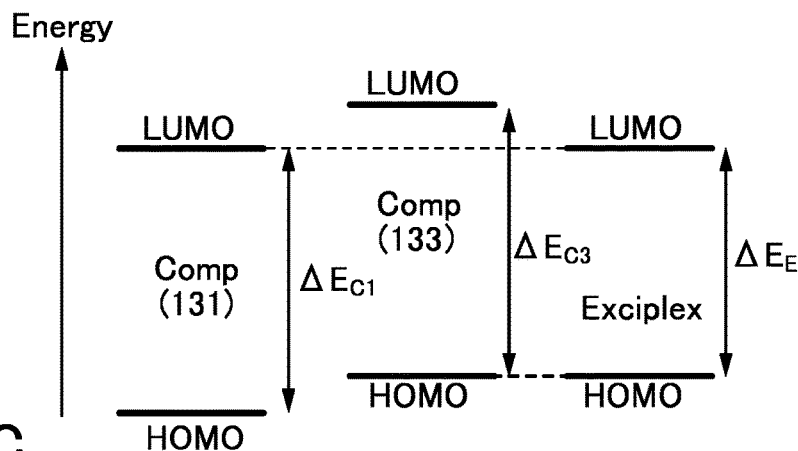
FIG. 5B to FIG. 5D are diagrams illustrating the correlation between energy levels of the light-emitting layer of the light-emitting device of one embodiment of the present invention.
Figure 5C:
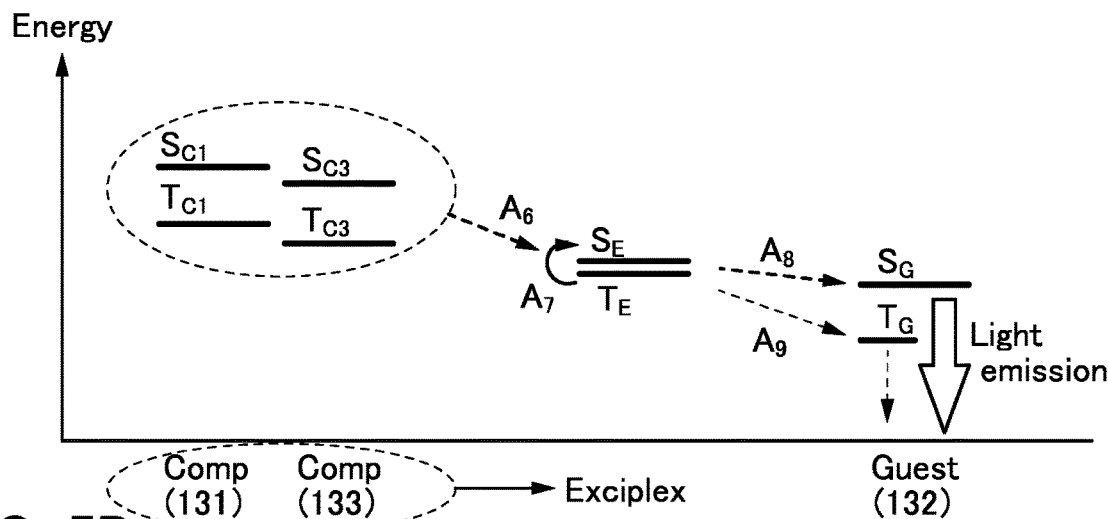

FIG. 5C shows an example of the correlation between energy levels in the light-emitting layer 130a of the light-emitting device 150 and the light-emitting device 152 of one embodiment of the present invention. The light-emitting layer 130a illustrated in FIG. 5A contains the compound 131, the compound 132, and also a compound 133. In one embodiment of the present invention, the compound 132 is preferably a fluorescent material. In this structure example, the compound 131 and the compound 133 form an exciplex in combination.

Although any combination of the compound 131 and the compound 133 that can form an exciplex is acceptable, it is further preferable that one of them be a compound having a function of transporting holes (hole-transport property) and the other be a compound having a function of transporting electrons (electron-transport property). In this case, a donor-acceptor exciplex is easily formed; thus, efficient formation of an exciplex is possible. In the case where the combination of the compound 131 and the compound 133 is a combination of a compound having a hole-transport property and a compound having an electron-transport property, the carrier balance can be easily controlled by the mixture ratio. Specifically, the ratio of the compound having a hole-transport property to the compound having an electron-transport property is preferably within a range of 1:9 to 9:1 (weight ratio). Since the carrier balance can be easily controlled with the structure, a carrier recombination region can also be controlled easily.

For the combination of host materials for forming an exciplex efficiently, it is preferable that the HOMO level of one of the compound 131 and the compound 133 be higher than the HOMO level of the other and the LUMO level of the one of the compounds be higher than the LUMO level of the other. Note that the HOMO level of the compound 131 may be equivalent to the HOMO level of the compound 133, or the LUMO level of the compound 131 may be equivalent to the LUMO level of the compound 133.

Note that the LUMO levels and the HOMO levels of the compounds can be derived from the electrochemical characteristics (reduction potentials and oxidation potentials) of the compounds that are measured by cyclic voltammetry (CV) measurement.

In the case where the compound 131 has a hole-transport property and the compound 133 has an electron-transport property, for example, it is preferable that the HOMO level of the compound 131 be higher than the HOMO level of the compound 133 and that the LUMO level of the compound 131 be higher than the LUMO level of the compound 133, as in an energy band diagram in FIG. 5B. Such energy level correlation is suitable because holes and electrons that are carriers injected from the pair of electrodes (the electrode 101 and the electrode 102) are easily injected into the compound 131 and the compound 133, respectively.

As to terms and reference numerals in FIG. 5B, Comp (131) represents the compound 131, Comp (133) represents the compound 133, $\Delta E_{C1}$ represents the energy difference between the LUMO level and the HOMO level of the compound 131, $\Delta E_{C3}$ represents the energy difference between the LUMO level and the HOMO level of the compound 133, and $\Delta E_E$ represents the energy difference between the LUMO level of the compound 131 and the HOMO level of the compound 133.

In the case where an exciplex is formed by the compound 131 and the compound 133, holes are injected into the HOMO of the compound 131 and electrons are injected into the LUMO of the compound 133. The excitation energy of the exciplex substantially corresponds to the energy difference ($\Delta E_E$) between the LUMO level of the compound 133 and the HOMO level of the compound 131, which is smaller than the energy difference ($\Delta E_{C1}$) between the LUMO level and the HOMO level of the compound 131 and the energy difference ($\Delta E_{C3}$) between the LUMO level and the HOMO level of the compound 133. Thus, when the compound 131 and the compound 133 form an exciplex, an excited state can be formed with lower excitation energy. Having lower excitation energy, the exciplex can form a stable excited state.

FIG. 5C shows the correlation between the energy levels of the compound 131, the compound 132, and the compound 133 in the light-emitting layer 130a. The following explains what the terms and numerals in FIG. 5C represent.

Comp (131): compound 131
Comp (133): compound 133
Guest (132): compound 132
$S_{C1}$: S1 level of compound 131
$T_{C1}$: T1 level of compound 131
$S_{C3}$: S1 level of compound 133
$T_{C3}$: T1 level of compound 133
$T_G$: T1 level of compound 132
$S_E$: S1 level of exciplex
$T_E$: T1 level of exciplex In the light-emitting device of one embodiment of the present invention, the compound 131 and the compound 133 contained in the light-emitting layer 130a form an exciplex. The S1 level ($S_E$) of the exciplex and the T1 level ($T_E$) of the exciplex are energy levels adjacent to each other (see Route $A_6$ in FIG. 5C).

Because the excitation energy levels ($S_E$ and $T_E$) of the exciplex are lower than the S1 levels ($S_{C1}$ and $S_{C3}$) of the substances (the compound 131 and the compound 133) that form an exciplex, an excited state can be formed with lower excitation energy. Accordingly, the driving voltage of the light-emitting device of one embodiment of the present invention can be reduced.

Since the S1 level ($S_E$) and the T1 level ($T_E$) of the exciplex are energy levels adjacent to each other, reverse intersystem crossing occurs easily, i.e., the exciplex has a TADF property. Therefore, the exciplex has a function of converting triplet excitation energy into singlet excitation energy by upconversion (Route $A_7$ in FIG. 5C). The singlet excitation energy of the exciplex can rapidly be transferred to the compound 132 (Route $A_8$ in FIG. 5C). At this time, $S_E \geq S_G$ is preferably satisfied. In Route $A_8$, the exciplex serves as an energy donor and the compound 132 serves as an energy acceptor. Specifically, when the level of energy with a wavelength of the line obtained by extrapolating a tangent to the fluorescent spectrum of the exciplex at a tail on the short wavelength side is $S_E$ and the level of energy with a wavelength of the absorption edge of the absorption spectrum of the compound 132 is $S_G$, $S_E \geq S_G$ is preferably satisfied.

Note that in order to improve the TADF property, it is preferable that the T1 levels of both of the compound 131 and the compound 133, that is, $T_{C1}$ and $T_{C3}$ be higher than or equal to $T_E$. As the index for them, the emission peak wavelengths of the phosphorescent spectra of the compound 131 and the compound 133 on the shortest wavelength side are each preferably less than or equal to the maximum emission peak wavelength of the exciplex. When the level of energy with a wavelength of the line obtained by extrapolating a tangent to the fluorescent spectrum of the exciplex at a tail on the short wavelength side is $S_E$ and the levels of energies with wavelengths of the lines obtained by extrapolating tangents to the phosphorescent spectra of the compound 131 and the compound 133 at a tail on the short wavelength side are $T_{C1}$ and $T_{C3}$, respectively, $S_E - T_{C1} \leq 0.2$ eV and $S_E - T_{C3} \leq 0.2$ eV are preferably satisfied.

Triplet excitation energy generated in the light-emitting layer 130a is transferred through Route $A_6$ and from the S1 level of the exciplex to the S1 level of the guest material (Route $A_8$), resulting in light emission of the guest material. Thus, the use of a combination of materials that form an exciplex in the light-emitting layer 130a can improve the emission efficiency of the fluorescent light-emitting device.

In the light-emitting device of one embodiment of the present invention, a guest material in which a luminophore has protecting groups is used as the compound 132. Such a structure can inhibit energy transfer by the Dexter mechanism that is represented by Route $A_9$ as described above, leading to inhibition of deactivation of triplet excitation energy. Thus, a fluorescent light-emitting device with high emission efficiency can be obtained.

The above-described processes through Routes $A_6$ to $A_8$ may be referred to as ExSET (Exciplex-Singlet Energy Transfer) or ExEF (Exciplex-Enhanced Fluorescence) in this specification and the like. In other words, in the light-emitting layer 130a, excitation energy is supplied from the exciplex to the fluorescent material.

Structure Example 3 of Light-Emitting Layer 130a

In this structure example, the case where a phosphorescent material is used as the compound 133 of the light-emitting device utilizing the above ExEF will be described. That is, the case where a phosphorescent material is used as one of the compounds that form an exciplex will be described.

In this structure example, a compound containing a heavy atom is used as one of the compounds that form an exciplex. Thus, intersystem crossing between a singlet state and a triplet state is promoted. Thus, an exciplex capable of transition from a triplet excited state to a singlet ground state (i.e., capable of exhibiting phosphorescence) can be formed. In this case, unlike in the case of a typical exciplex, the triplet excitation energy level ($T_E$) of the exciplex is the level of an energy donor; thus, $T_E$ is preferably higher than or equal to the singlet excitation energy level ($S_G$) of the compound 132, which is a light-emitting material. Specifically, $T_E$ $S_G$ is preferably satisfied when $T_E$ is the level of energy with a wavelength of the line obtained by extrapolating a tangent to the emission spectrum of the exciplex, one of the compounds of which contains a heavy atom, at a tail on the short wavelength side and $S_G$ is the level of energy with a wavelength of the absorption edge of the absorption spectrum of the compound 132.

With such energy level correlation, the triplet excitation energy of the formed exciplex can be transferred from the triplet excitation energy level ($T_E$) of the exciplex to the singlet excitation energy level ($S_G$) of the compound 132. Note that it is sometimes difficult to clearly distinguish fluorescence and phosphorescence from each other in an emission spectrum because the S1 level ($S_E$) and the T1 level ($T_E$) of the exciplex are energy levels adjacent to each other. In that case, fluorescence and phosphorescence can be sometimes distinguished from each other by the emission lifetime.

Note that the phosphorescent material used in the above structure preferably contains a heavy atom such as Ir, Pt, Os, Ru, or Pd. In contrast, the quantum yield can be either high or low because a phosphorescent material serves as an energy donor in this structure example. That is, energy transfer from the triplet excitation energy level of the exciplex to the singlet excitation energy level of the guest material is acceptable as long as it is allowable transition. The energy transfer from the phosphorescent material or the exciplex formed using a phosphorescent material to the guest material is preferred, in which case energy transfer from the triplet excitation energy level of the energy donor to the singlet excitation energy level of the guest material (energy acceptor) is allowable transition. Thus, without through the process of Route $A_7$ in FIG. 5C, the triplet excitation energy of the exciplex can be transferred to the S1 level ($S_G$) of the guest material through the process of Route $A_5$. That is, triplet and singlet excitation energy can be transferred to the S1 level of the guest material only through the processes of Route $A_6$ and Route $A_8$. In Route $A_8$, the exciplex serves as an energy donor and the compound 132 serves as an energy acceptor.

In the light-emitting device of one embodiment of the present invention, a guest material in which a luminophore has protecting groups is used as the compound 132. Such a structure can inhibit energy transfer by the Dexter mechanism that is represented by Route $A_9$ as described above, leading to inhibition of deactivation of triplet excitation energy. Thus, a fluorescent light-emitting device with high emission efficiency can be obtained.

Structure Example 4 of Light-Emitting Layer 130a

In this structure example, the case where a material having a TADF property is used as the compound 133 of the light-emitting device utilizing the above ExEF will be described with reference to FIG. 5D.

Figure 5D:
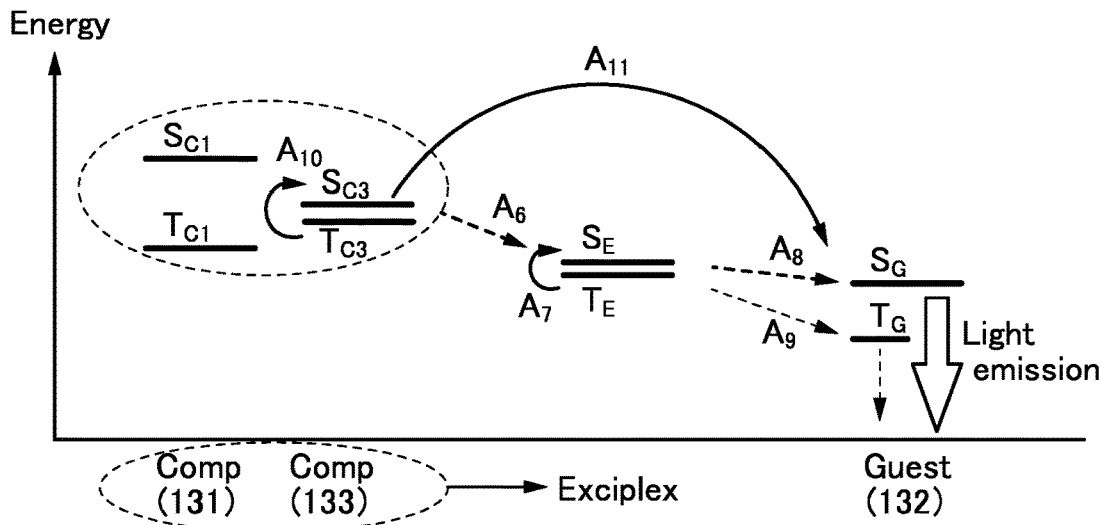

Since the compound 133 is the TADF material, the compound 133 that does not form an exciplex has a function of converting triplet excitation energy into singlet excitation energy by upconversion (Route $A_{10}$ in FIG. 5D). The singlet excitation energy of the compound 133 can be rapidly transferred to the compound 132 (Route $A_{11}$ in FIG. 5D). At this time, $S_{C3} \geq S_G$ is preferably satisfied.

As described in the above structure example of the light-emitting layer, the light-emitting device of one embodiment of the present invention has a pathway where the triplet excitation energy is transferred to the compound 132 serving as a guest material through Route $A_6$ to Route $A_8$ in FIG. 5D and a pathway where the triplet excitation energy is transferred to the compound 132 through Route $A_{10}$ and Route $A_{11}$ in FIG. 5D. A plurality of pathways through each of which the triplet excitation energy is transferred to the fluorescent material can further improve the emission efficiency. In Route $A_8$, the exciplex serves as an energy donor and the compound 132 serves as an energy acceptor. In Route $A_{11}$, the compound 133 serves as an energy donor and the compound 132 serves as an energy acceptor.

In this structure example, the exciplex and the compound 133 serve as energy donors, and the compound 132 serves as an energy acceptor.

Structure Example 5 of Light-Emitting Layer 130a

Figure 6A:
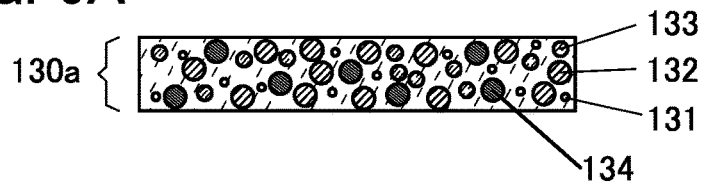
FIG. 6A is a schematic cross-sectional view of a light-emitting layer of a light-emitting device of one embodiment of the present invention.

FIG. 6A illustrates the case where four kinds of materials are used in the light-emitting layer 130a. The light-emitting layer 130a in FIG. 6A contains the compound 131, the compound 132, the compound 133, and a compound 134. In one embodiment of the present invention, the compound 133 has a function of converting triplet excitation energy into light emission. In this structure example, the case where the compound 133 is a phosphorescent compound is described. The compound 132 is a guest material that emits fluorescence. The compound 131 is an organic compound that forms an exciplex together with the compound 134.

Figure 6B:
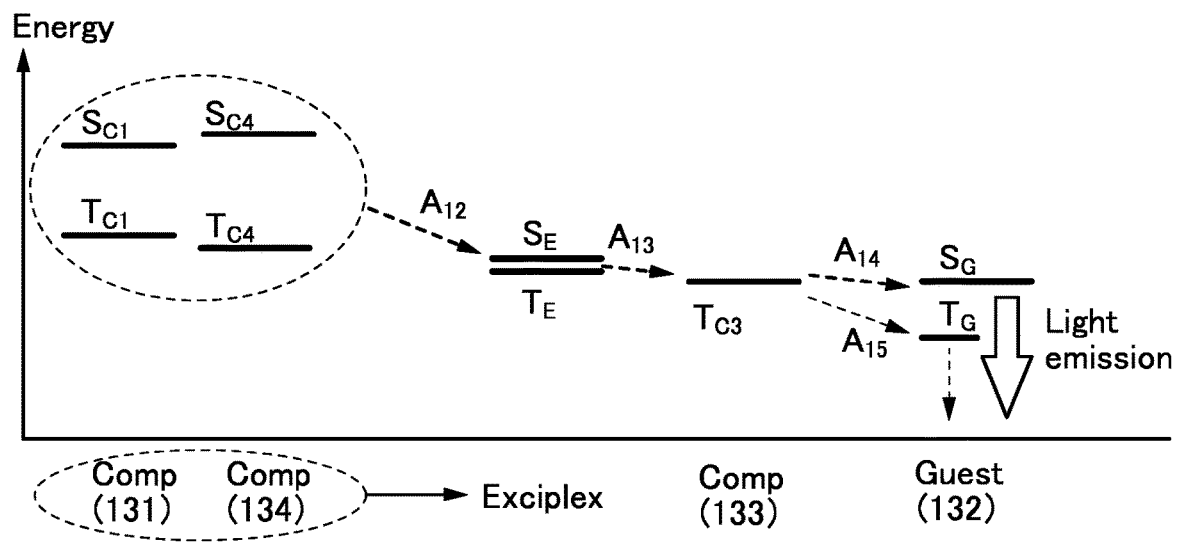
FIG. 6B and FIG. 6C are diagrams illustrating the correlation between energy levels of the light-emitting layer of the light-emitting device of one embodiment of the present invention.

FIG. 6B shows the correlation between the energy levels of the compound 131, the compound 132, the compound 133, and the compound 134 in the light-emitting layer 130a. The following explains what the terms and numerals in FIG. 6B represent, and the other terms and numerals are the same as those in FIG. 5C.

$S_{C4}$: S1 level of compound 134
$T_{C4}$: T1 level of compound 134

In the light-emitting device of one embodiment of the present invention described in this structure example, the compound 131 and the compound 134 contained in the light-emitting layer 130a form an exciplex. The S1 level ($S_E$) of the exciplex and the T1 level ($T_E$) of the exciplex are energy levels adjacent to each other (see Route $A_{12}$ in FIG. 6B).

As described above, when the exciplex formed through the above process loses excitation energy, the two substances that have formed the exciplex individually behave as the original separate substances.

Because the excitation energy levels ($S_E$ and $T_E$) of the exciplex are lower than the S1 levels ($S_{C1}$ and $S_{C4}$) of the substances (the compound 131 and the compound 134) that form an exciplex, an excited state can be formed with lower excitation energy. Accordingly, the driving voltages of the light-emitting device 150 and the light-emitting device 152 can be reduced.

Here, when the compound 133 is a phosphorescent material, intersystem crossing between a singlet state and a triplet state is allowed. Hence, both the singlet excitation energy and the triplet excitation energy of the exciplex are rapidly transferred to the compound 133 (Route $A_{13}$). At this time, $T_E \geq T_{C3}$ is preferably satisfied. In addition, the triplet excitation energy of the compound 133 can be efficiently converted into the singlet excitation energy of the compound 132 (Route $A_{14}$). Here, $T_E \geq T_{C3} \geq S_G$ as shown in FIG. 6B is preferable, in which case the excitation energy of the compound 133 is efficiently transferred as the singlet excitation energy to the compound 132, which is the guest material. Specifically, when the level of energy with a wavelength of the line obtained by extrapolating a tangent to the phosphorescent spectrum of the compound 133 at a tail on the short wavelength side is $T_{C3}$ and the level of energy with a wavelength of the absorption edge of the absorption spectrum of the compound 132 is $S_G$, $T_{C3} \geq S_G$ is preferably satisfied. In Route $A_{14}$, the compound 133 serves as an energy donor and the compound 132 serves as an energy acceptor.

Although any combination of the compound 131 and the compound 134 that can form an exciplex is acceptable, it is further preferable that one of them be a compound having a hole-transport property and the other be a compound having an electron-transport property.

In order that an exciplex can be efficiently formed, the combination of the compound 131 and the compound 134 is preferably such a combination that the HOMO level of the compound 131 is higher than the HOMO level of the compound 134 and the LUMO level of the compound 131 is higher than the LUMO level of the compound 134, or such a combination that the HOMO level of the compound 134 is higher than the HOMO level of the compound 131 and the LUMO level of the compound 134 is higher than the LUMO level of the compound 131.

The correlation between the energy levels of the compound 131 and the compound 134 is not limited to that in FIG. 6B. In other words, the singlet excitation energy level ($S_{C1}$) of the compound 131 may be higher or lower than the singlet excitation energy level ($S_{C4}$) of the compound 134. The triplet excitation energy level ($T_{C1}$) of the compound 131 may be higher or lower than the triplet excitation energy level ($T_{C4}$) of the compound 134.

In the light-emitting device of one embodiment of the present invention, the compound 131 preferably has a π-electron deficient skeleton. Such a composition lowers the LUMO level of the compound 131, which is suitable for formation of an exciplex.

In the light-emitting device of one embodiment of the present invention, the compound 131 preferably has a π-electron rich skeleton. Such a composition increases the HOMO level of the compound 131, which is suitable for formation of an exciplex.

In the light-emitting device of one embodiment of the present invention, a guest material in which a luminophore has protecting groups is used as the compound 132. Such a structure can inhibit energy transfer by the Dexter mechanism that is represented by Route $A_{15}$ as described above, leading to inhibition of deactivation of triplet excitation energy. Thus, a fluorescent light-emitting device with high emission efficiency can be obtained. In addition, the concentration of the compound 133 serving as an energy donor can be increased. As a result, increasing the rate of energy transfer by the Förster mechanism and inhibiting energy transfer by the Dexter mechanism, which are originally conflicting phenomena, can be concurrently caused. By increasing the rate of energy transfer due to the Förster mechanism, the excitation lifetime of the energy acceptor in the light-emitting layer is shortened, leading to an improvement in the reliability of the light-emitting device. When the compound 133 serving as an energy donor is added to the light-emitting layer, the concentration of the compound 133 with respect to the host material is preferably higher than or equal to 2 wt % and lower than or equal to 50 wt %, further preferably higher than or equal to 5 wt % and lower than or equal to 30 wt %, and still further preferably higher than or equal to 5 wt % and lower than or equal to 20 wt %. With such a structure, the rate of energy transfer by the Förster mechanism can be increased; thus, a light-emitting device with high emission efficiency can be obtained.

Note that the above-described processes through Routes $A_{12}$ and $A_{13}$ may be referred to as ExTET (Exciplex-Triplet Energy Transfer) in this specification and the like. In other words, in the light-emitting layer 130a, excitation energy is supplied from the exciplex to the compound 133. Thus, this structure example can be referred to as a structure in which a fluorescent material having protecting groups is mixed in a light-emitting layer capable of utilizing ExTET.

Structure Example 6 of Light-Emitting Layer 130a

In this structure example, the case where a material having a TADF property is used as the compound 134 described in the above structure example 5 of light-emitting layer will be described.

Figure 6C:
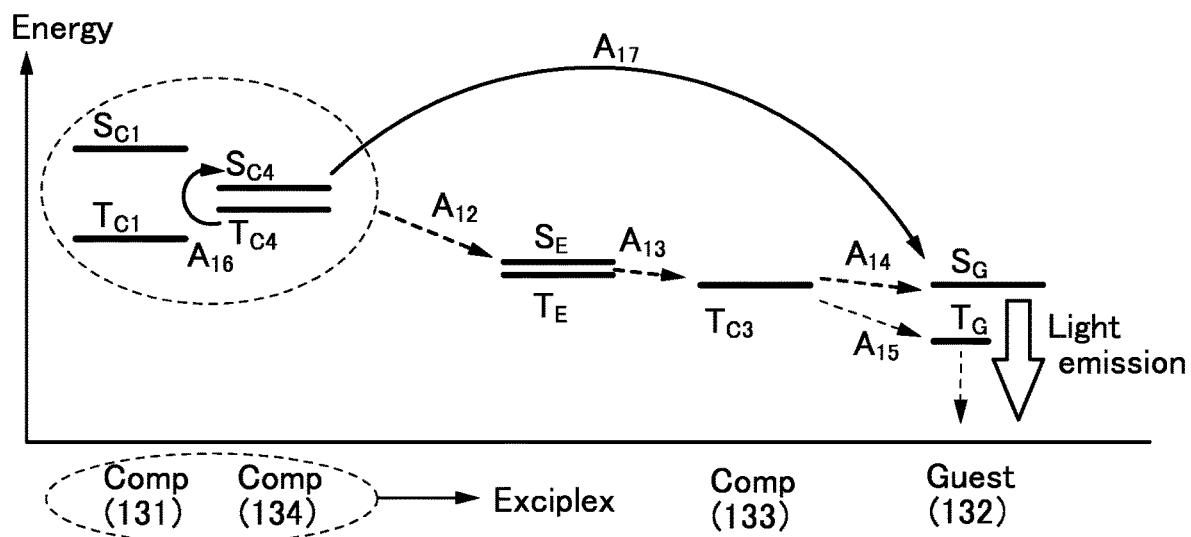

FIG. 6C illustrates the case where four kinds of materials are used in the light-emitting layer 130a. The light-emitting layer 130a in FIG. 6C contains the compound 131, the compound 132, the compound 133, and the compound 134. In one embodiment of the present invention, the compound 133 has a function of converting triplet excitation energy into light emission. The compound 132 is a guest material that emits fluorescence. The compound 131 is an organic compound that forms an exciplex together with the compound 134.

Here, since the compound 134 is the TADF material, the compound 134 that does not form an exciplex has a function of converting triplet excitation energy into singlet excitation energy by upconversion (Route $A_{16}$ in FIG. 6C). The singlet excitation energy of the compound 134 can be rapidly transferred to the compound 132 (Route $A_{17}$ in FIG. 6C). At this time, $S_{C4} \geq S_G$ is preferably satisfied. Specifically, when the level of energy with a wavelength of the line obtained by extrapolating a tangent to the fluorescent spectrum of the compound 134 at a tail on the short wavelength side is $S_{C4}$ and the level of energy with a wavelength of the absorption edge of the absorption spectrum of the compound 132 is $S_G$, $S_{C4} \geq S_G$ is preferably satisfied.

As described in the above structure example of the light-emitting layer, the light-emitting device of one embodiment of the present invention has a pathway where the triplet excitation energy is transferred to the compound 132 serving as a guest material through Route $A_{12}$ to Route $A_{14}$ in FIG. 6B and a pathway where the triplet excitation energy is transferred to the compound 132 through Route $A_{16}$ and Route $A_{17}$ in FIG. 6C. A plurality of pathways through each of which the triplet excitation energy is transferred to the fluorescent material can further improve the emission efficiency. In Route $A_{14}$, the compound 133 serves as an energy donor and the compound 132 serves as an energy acceptor. In Route $A_{17}$, the compound 134 serves as an energy donor and the compound 132 serves as an energy acceptor.

Structure Example 7 of Light-Emitting Layer 130a

Figure 7A:
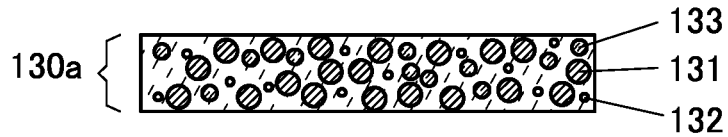
FIG. 7A is a schematic cross-sectional view of a light-emitting layer of a light-emitting device of one embodiment of the present invention.
Figure 7B:
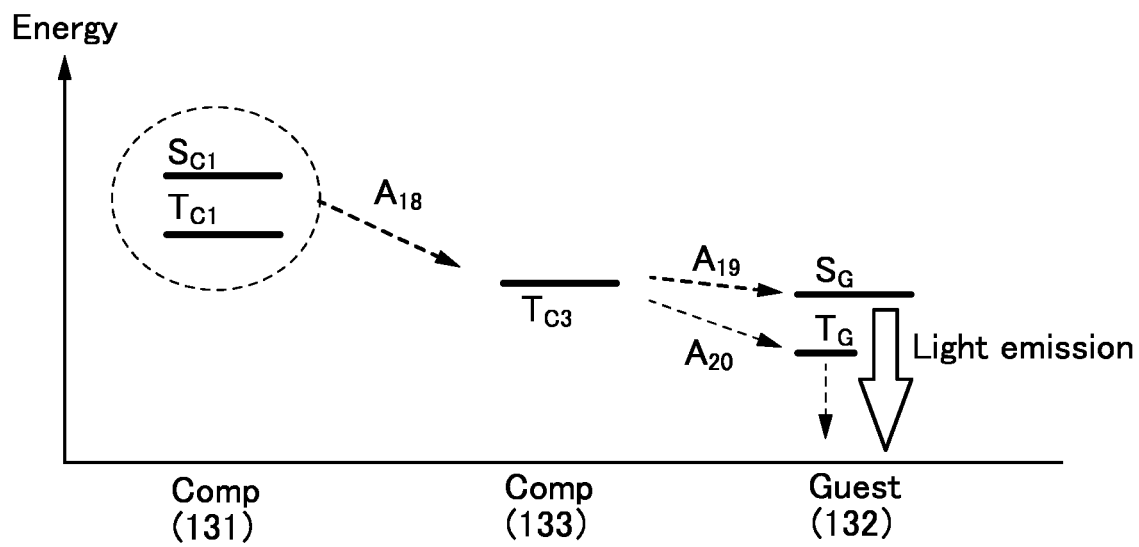
FIG. 7B and FIG. 7C are diagrams illustrating the correlation between energy levels of the light-emitting layer of the light-emitting device of one embodiment of the present invention.

FIG. 7B shows an example of the correlation between energy levels in the light-emitting layer 130a of the light-emitting device 150 and the light-emitting device 152 of one embodiment of the present invention. The light-emitting layer 130a illustrated in FIG. 7A contains the compound 131, the compound 132, and also the compound 133. In one embodiment of the present invention, the compound 132 is a fluorescent material having protecting groups. The compound 133 has a function of converting triplet excitation energy into light emission. In this structure example, the case where the compound 133 is a phosphorescent material is described.

The following explains what the terms and numerals in FIG. 7B and FIG. 7C described later represent.
Comp (131): compound 131
Comp (133): compound 133
Guest (132): compound 132
$S_{C1}$: S1 level of compound 131
$T_{C1}$: T1 level of compound 131
$T_{C3}$: T1 level of compound 133
$T_G$: T1 level of compound 132
$S_G$: S1 level of compound 132

In the light-emitting device of one embodiment of the present invention, when carrier recombination mainly occurs in the compound 131 contained in the light-emitting layer 130a, singlet excitons and triplet excitons are generated. Since the compound 133 is a phosphorescent material, selecting materials that have a relation of $T_{C3} \leq T_{C1}$ allows both of the singlet excitation energy and the triplet excitation energy generated in the compound 131 to be transferred to the $T_{C3}$ level of the compound 133 (Route $A_{18}$ in FIG. 7B). Some of the carriers can be recombined in the compound 133.

Note that the phosphorescent material used in the above structure preferably contains a heavy atom such as Ir, Pt, Os, Ru, or Pd. In contrast, the quantum yield can be either high or low because a phosphorescent material serves as an energy donor also in this structure example as described above. A phosphorescent material is preferably used as the compound 133, in which case energy transfer from the triplet excitation energy level of the energy donor to the singlet excitation energy level of the guest material (energy acceptor) is allowable transition. Thus, the triplet excitation energy of the compound 133 can be transferred to the S1 level ($S_G$) of the guest material through the process of Route $A_{19}$. In Route $A_{19}$, the compound 133 serves as an energy donor and the compound 132 serves as an energy acceptor.

In that case, $T_{C3} \geq S_G$ is preferable because the excitation energy of the compound 133 is efficiently transferred to the singlet excited state of the compound 132, which is the guest material. Specifically, when the level of energy with a wavelength of the line obtained by extrapolating a tangent to the phosphorescent spectrum of the compound 133 at a tail on the short wavelength side is $T_{C3}$ and the level of energy with a wavelength of the absorption edge of the absorption spectrum of the compound 132 is $S_G$, $T_{C3} \geq S_G$ is preferably satisfied.

In the light-emitting device of one embodiment of the present invention, a guest material in which a luminophore has protecting groups is used as the compound 132. Such a structure can inhibit energy transfer by the Dexter mechanism that is represented by Route $A_{20}$ as described above, leading to inhibition of deactivation of triplet excitation energy. Thus, a fluorescent light-emitting device with high emission efficiency can be obtained.

Structure Example 8 of Light-Emitting Layer 130a

Figure 7C:
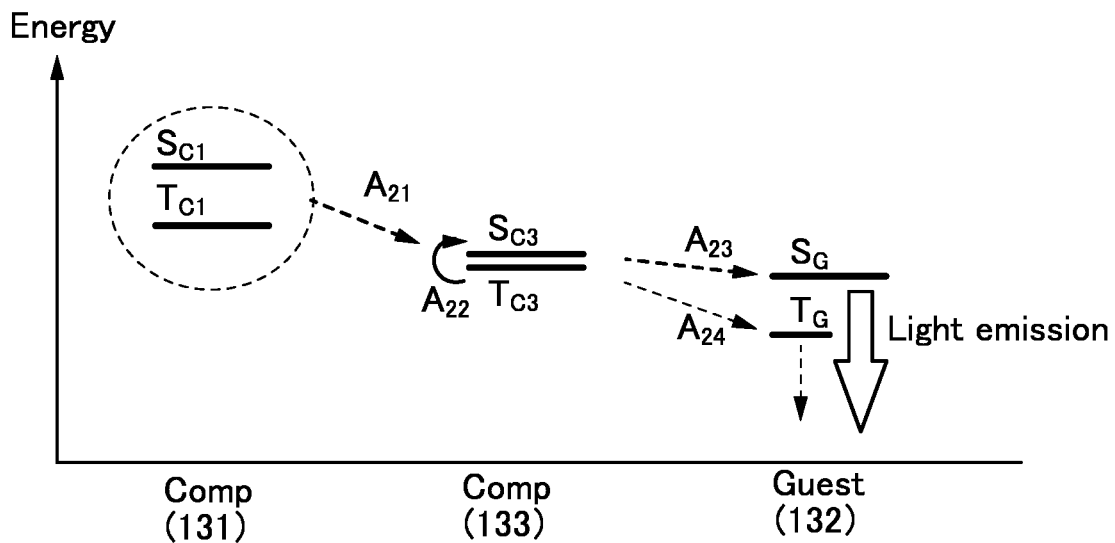

FIG. 7C shows an example of the correlation between energy levels in the light-emitting layer 130a of the light-emitting device 150 and the light-emitting device of one embodiment of the present invention. The light-emitting layer 130a illustrated in FIG. 7A contains the compound 131, the compound 132, and also the compound 133. In one embodiment of the present invention, the compound 132 is a fluorescent material having protecting groups. The compound 133 has a function of converting triplet excitation energy into light emission. In this structure example, the case where the compound 133 is a compound having a TADF property is described.

The following explains what the terms and numerals in FIG. 7C represent, and the other terms and numerals are the same as those in FIG. 7B.

$S_{C3}$: S1 level of compound 133

In the light-emitting device of one embodiment of the present invention, when carrier recombination mainly occurs in the compound 131 contained in the light-emitting layer 130a, singlet excitons and triplet excitons are generated. Selecting materials that have a relation of $S_{C3} \leq S_{C1}$ and $T_{C3} \leq T_{C1}$ allows both of the singlet excitation energy and the triplet excitation energy generated in the compound 131 to be transferred to the $S_{C3}$ and $T_{C3}$ levels of the compound 133 (Route $A_{21}$ in FIG. 7C). Some of the carriers can be recombined in the compound 133.

Here, the compound 133 is the TADF material and thus has a function of converting triplet excitation energy into singlet excitation energy by upconversion (Route $A_{22}$ in FIG. 7C). The singlet excitation energy of the compound 133 can be rapidly transferred to the compound 132 (Route $A_{23}$ in FIG. 7C). At this time, $S_{C3} \geq S_G$ is preferably satisfied. Specifically, when the level of energy with a wavelength of the line obtained by extrapolating a tangent to the fluorescent spectrum of the compound 133 at a tail on the short wavelength side is $S_{C3}$ and the level of energy with a wavelength of the absorption edge of the absorption spectrum of the compound 132 is $S_G$, $S_{C3} \geq S_G$ is preferably satisfied. Through the processes of Route $A_{21}$ to Route $A_{23}$, triplet excitation energy in the light-emitting layer 130a can be converted into fluorescence of the compound 132. In Route $A_{23}$, the compound 133 serves as an energy donor and the compound 132 serves as an energy acceptor.

In the light-emitting device of one embodiment of the present invention, a guest material in which a luminophore has protecting groups is used as the compound 132. Such a structure can inhibit energy transfer by the Dexter mechanism that is represented by Route $A_{24}$ as described above, leading to inhibition of deactivation of triplet excitation energy. Thus, a fluorescent light-emitting device with high emission efficiency can be obtained.

Structure Example 1 of Light-Emitting Layer 130b

Next, a light emission mechanism of the light-emitting layer 130b, which is a phosphorescent light-emitting layer, will be described below.

Figure 8A:
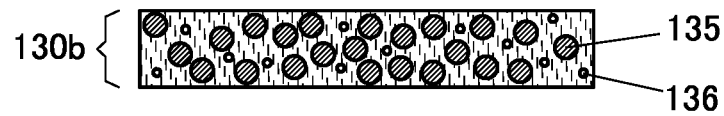
FIG. 8A is a schematic cross-sectional view of a light-emitting layer of a light-emitting device of one embodiment of the present invention.
Figure 8B:
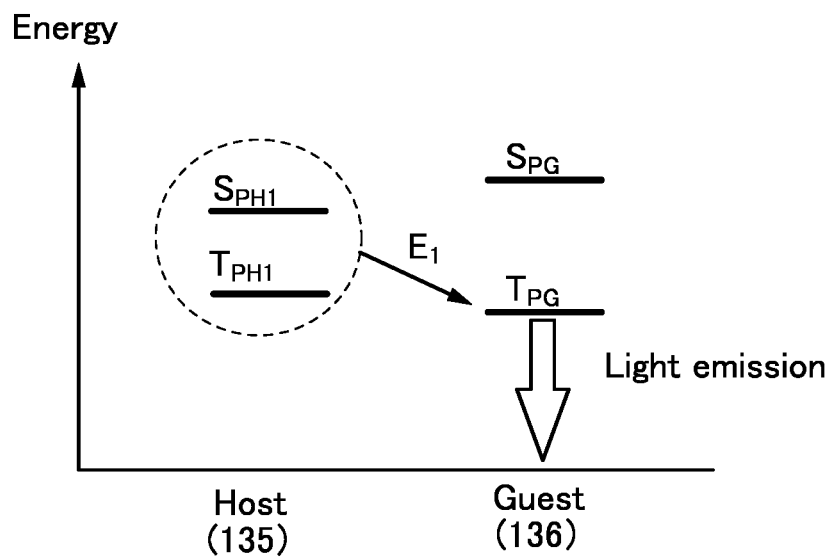
FIG. 8B and FIG. 8C are diagrams illustrating the correlation between energy levels of the light-emitting layer of the light-emitting device of one embodiment of the present invention.

FIG. 8B shows an example of the correlation between energy levels in the light-emitting layer 130b of the light-emitting device 150 and the light-emitting device 152 of one embodiment of the present invention. The light-emitting layer 130b illustrated in FIG. 8A, FIG. 8B, and FIG. 8C contains at least a compound 135 and a compound 136. The compound 136 has a function of converting triplet excitation energy into light emission. In one embodiment of the present invention, the compound 136 is preferably a phosphorescent material. The structure example in FIG. 8A, FIG. 8B, and FIG. 8C shows the case where the compound 136 is a phosphorescent material.

Figure 8C:
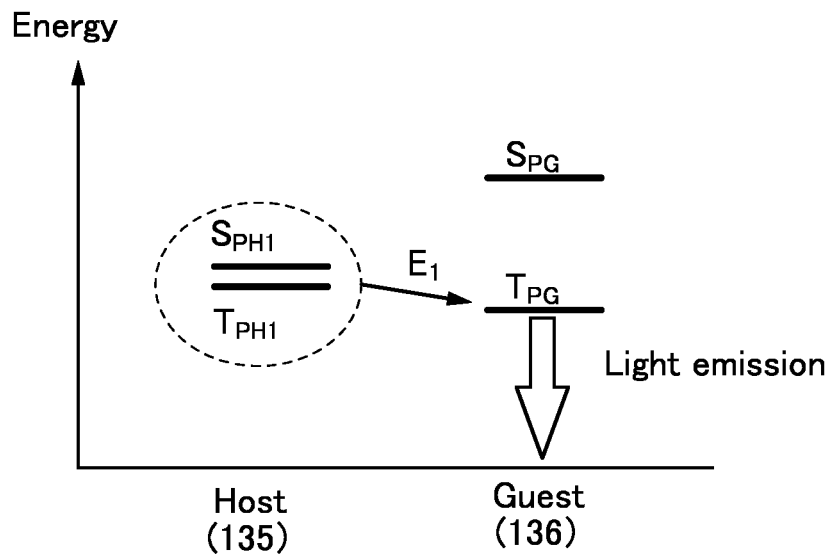

The following explains what the terms and numerals in FIG. 8B and FIG. 8C represent.

Host (135): compound 135
Guest (136): compound 136
$S_{PH1}$: S1 level of compound 135
$T_{PH1}$: T1 level of compound 135
$T_{PG}$: T1 level of compound 136
$S_{PG}$: S1 level of compound 136

In the light-emitting device of one embodiment of the present invention, when carrier recombination mainly occurs in the compound 135 contained in the light-emitting layer 130b, singlet excitons and triplet excitons are generated. Since the compound 136 is a phosphorescent material, selecting materials that have a relation of $T_{PH3} \leq T_{GP1}$ allows both of the singlet excitation energy and the triplet excitation energy generated in the compound 135 to be transferred to the $T_{PG1}$ level of the compound 136 (Route $E_1$ in FIG. 8B and FIG. 8C). Some of the carriers can be recombined in the compound 136.

In order that the compound 136 can emit light efficiently, the longest wavelength absorption band in the absorption spectrum of the compound 136 preferably has an overlap with the emission spectrum of the compound 135. In all the absorption bands in the absorption spectrum of the phosphorescent material, the longest wavelength absorption band contributes to light emission most greatly. Examples of the emission spectrum exhibited by the compound 135 include a fluorescence spectrum, which originates from a singlet excited state of the compound, and a phosphorescence spectrum, which originates from a triplet excited state of the compound. Thus, in order that the compound 136 can emit light efficiently, both the fluorescence spectrum and the phosphorescence spectrum exhibited by the compound 135 preferably have an overlap with the longest wavelength absorption band of the compound 136. The overlap allows the excitation energy of the compound 135 to be converted into the excitation energy of the compound 136. Such a structure makes it possible to efficiently convert both the singlet excitation energy and the triplet excitation energy generated in the light-emitting layer 130b into light emission of the compound 136.

In order that the fluorescence spectrum and the phosphorescence spectrum of the compound 135 can overlap with the longest wavelength absorption band of the compound 136 sufficiently, the difference between the energy value of the fluorescence spectrum peak of the compound 135 and the peak value of the longest wavelength (the lowest energy side) absorption band in the absorption spectrum is preferably less than or equal to 0.2 eV, further preferably less than or equal to 0.1 eV. Such a structure offers a light-emitting layer with high emission efficiency. Note that there is no limitation on the magnitude relationship between the energy value of the fluorescence spectrum peak and the longest wavelength (the lowest energy side) absorption band in the absorption spectrum. In other words, the energy value of the fluorescence spectrum peak may be larger or smaller than the longest wavelength (the lowest energy side) absorption band in the absorption spectrum.

As illustrated in FIG. 8C, the compound 135 is preferably a material having a small energy difference between the S1 level and the T1 level. Such a structure allows reducing of the driving voltage of the light-emitting device while maintaining high emission efficiency. Examples of a material having a small energy difference between the S1 level and the T1 level include a TADF material and an exciplex.

Structure Example 2 of Light-Emitting Layer 130b

Figure 9A:
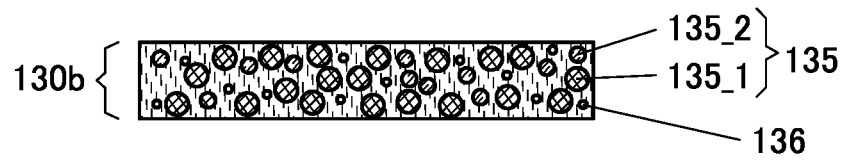
FIG. 9A is a schematic cross-sectional view of a light-emitting layer of a light-emitting device of one embodiment of the present invention.
Figure 9B:
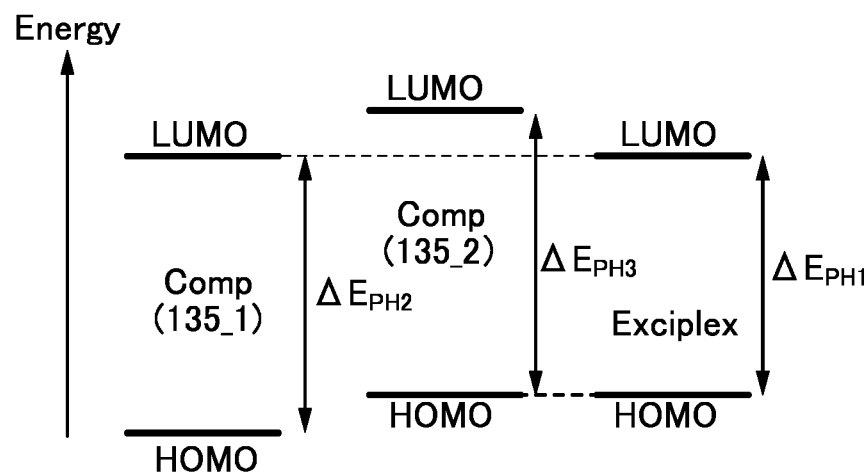
FIG. 9B and FIG. 9C are diagrams illustrating the correlation between energy levels of the light-emitting layer of the light-emitting device of one embodiment of the present invention.
Figure 9C:
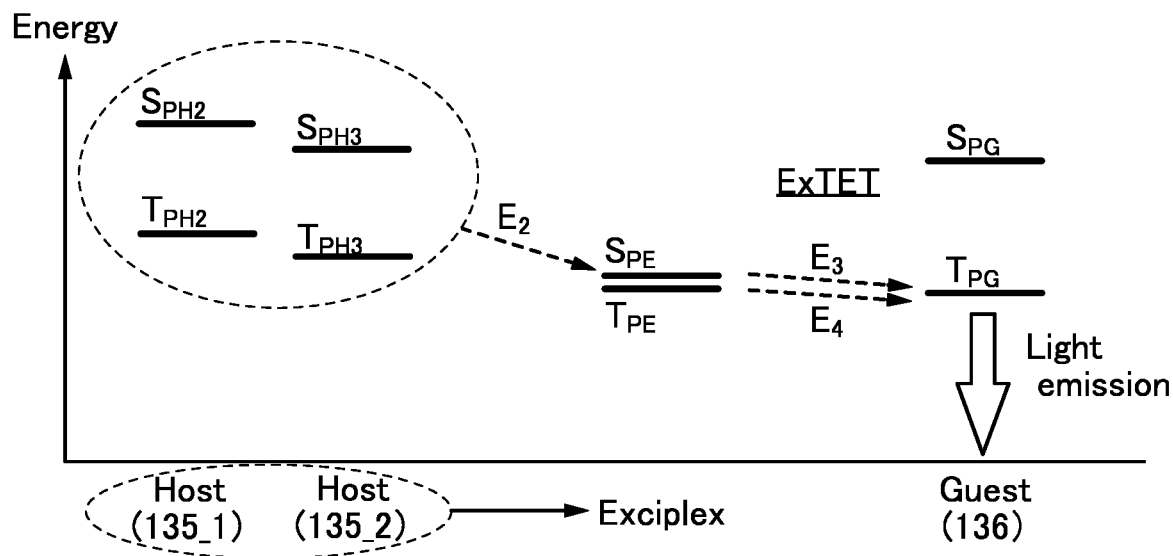

FIG. 9B and FIG. 9C show an example of the correlation between energy levels in the light-emitting layer 130b of the light-emitting device 150 and the light-emitting device 152 of one embodiment of the present invention. The light-emitting layer 130b illustrated in FIG. 9A, FIG. 9B, and FIG. 9C contains at least a compound 135_1, a compound 135_2, and the compound 136. The compound 136 has a function of converting triplet excitation energy into light emission. In one embodiment of the present invention, the compound 136 is preferably a phosphorescent material. The structure example in FIG. 9A, FIG. 9B, and FIG. 9C shows the case where the compound 136 is a phosphorescent material. The compound 135_1 and the compound 135_2 form an exciplex in combination.

Like a combination of the compound 131 and the compound 133 in FIG. 5A and FIG. 5B, a combination of the compound 135_1 and the compound 135_2 is preferably a combination that can form an exciplex; further preferably, one of them is a compound having a function of transporting holes (hole-transport property) and the other is a compound having a function of transporting electrons (electron-transport property). The structure in FIG. 9B is the same as that in FIG. 5B except the reference numerals of the compounds, and the structures of the compound 135_1 and the compound 135_2 are similar to those of the compound 131 and the compound 133 in FIG. 5B. Thus, detailed description of FIG. 9B is omitted.

As to terms and reference numerals in FIG. 9B, Comp (135_1) represents the compound 135_1, Comp (135_2) represents the compound 135_2, $\Delta E_{PH2}$ represents the energy difference between the LUMO level and the HOMO level of the compound 135_1, $\Delta E_{PH3}$ represents the energy difference between the LUMO level and the HOMO level of the compound 135_2, and $\Delta E_{PH1}$ represents the energy difference between the LUMO level of the compound 135_1 and the HOMO level of the compound 135_2.

The following explains what the terms and numerals in FIG. 9C represent.
Host (135_1): compound 135_1
Host (135_2): compound 135_2
Guest (136): compound 136
$S_{PH2}$: S1 level of compound 135_1
$T_{PH2}$: T1 level of compound 135_1
$S_{PH3}$: S1 level of compound 135_2
$T_{PH3}$: T1 level of compound 135_2
$T_{PG}$: T1 level of compound 136
$S_{PG}$: S1 level of compound 136
$S_{PE}$: S1 level of exciplex
$T_{PE}$: T1 level of exciplex One of the compound 135_1 and the compound 135_2 receives a hole and the other receives an electron to readily form an exciplex (see Route $E_2$ in FIG. 9C). Alternatively, one of the compounds brought into an excited state immediately interacts with the other compound to form an exciplex. Because the excitation energy levels ($S_{PE}$ and $T_{PE}$) of the exciplex are lower than the S1 levels ($S_{PH1}$ and $S_{PH2}$) of the host materials (the compound 135_1 and the compound 135_2) that form an exciplex, the excited state of the compound 135 can be formed with lower excitation energy. Accordingly, the driving voltage of the light-emitting device can be reduced.

Both of the energies ($S_{PE}$) and ($T_{PE}$) of the exciplex are then transferred to the T1 level of the compound 136 (the phosphorescent compound); thus, light emission is obtained (see Routes $E_3$ and $E_4$ in FIG. 9C).

The above-described processes through Routes $E_1$ to $E_4$ may be referred to as ExTET in this specification and the like. In other words, in the light-emitting layer 130b, excitation energy is given from the exciplex to the compound 136. Thus, this structure example is a structure in which ExTET is applied to the light-emitting layer 130b.

In order that the compound 136 can emit light efficiently, the longest wavelength absorption band in the absorption spectrum of the compound 136 preferably has an overlap with the emission spectrum of the exciplex. The S1 level and the T1 level of the exciplex are known to be close to each other. Hence, when at least one of the fluorescence spectrum and the phosphorescence spectrum of the exciplex overlaps with the longest wavelength absorption band of the compound 136, both the singlet excitation energy and the triplet excitation energy generated in the light-emitting layer 130b can be efficiently converted into light emission of the compound 136.

In order that the fluorescence spectrum or the phosphorescence spectrum of the exciplex can overlap with the longest wavelength absorption band in the absorption spectrum of the compound 136 sufficiently, the difference between the energy value of the fluorescence spectrum peak of the exciplex and the peak value of the longest wavelength (the lowest energy side) absorption band in the absorption spectrum is preferably less than or equal to 0.2 eV, further preferably less than or equal to 0.1 eV. Such a structure offers a phosphorescent light-emitting layer with high emission efficiency. Note that there is no limitation on the magnitude relationship between the energy value of the fluorescence spectrum peak of the exciplex and the longest wavelength (the lowest energy side) absorption band in the absorption spectrum of the compound 136. In other words, the energy value of the fluorescence spectrum peak of the exciplex may be larger or smaller than the peak value of the longest wavelength (the lowest energy side) absorption band in the absorption spectrum of the compound 136.

Structure Example 1 of Light-Emitting Layer 130a and Light-Emitting Layer 130b

Figure 10A:
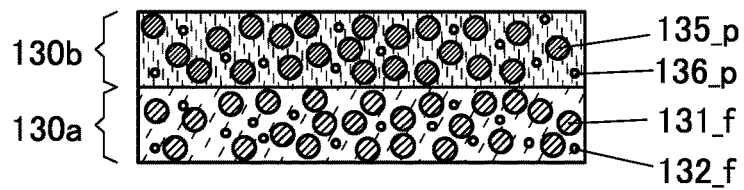
FIG. 10A is a schematic cross-sectional view of a light-emitting layer of a light-emitting device of one embodiment of the present invention.
Figure 10B:
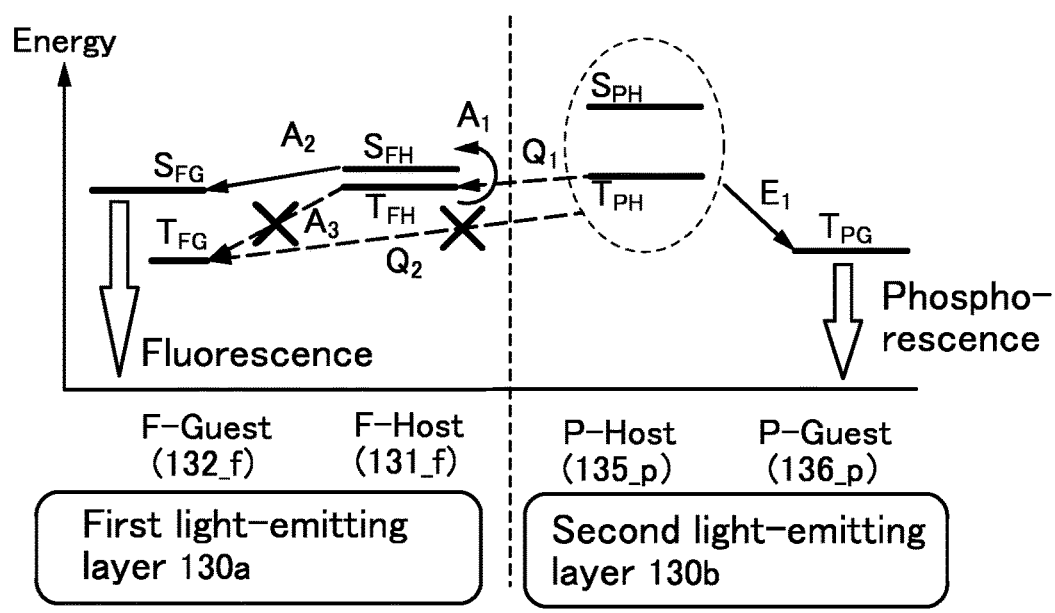
FIG. 10B and FIG. 10C are diagrams illustrating the correlation between energy levels of the light-emitting layer of the light-emitting device of one embodiment of the present invention.

The light-emitting device of one embodiment of the present invention includes both of the aforementioned light-emitting layer 130a and light-emitting layer 130b. FIG. 10B shows an example of the correlation between energy levels in the light-emitting layer 130a and the light-emitting layer 130b of the light-emitting device 150 and the light-emitting device 152 of one embodiment of the present invention. In FIG. 10A, the light-emitting layer 130a and the light-emitting layer 130b are close to each other and the light-emitting layer 130a includes a compound 131_f and a compound 132_f. The light-emitting layer 130b includes a compound 135_p and a compound 136_p. In one embodiment of the present invention, the compound 132_f is a fluorescent material having protecting groups. The compound 131_f has a function of converting triplet excitation energy into light emission. This structure example shows the case where the compound 131_f is a material having a TADF property and the compound 136_p is a phosphorescent material. That is, in this structure example, the light-emitting layer 130a has the structure shown in Structure example 1 of light-emitting layer 130a and the light-emitting layer 130b has the structure shown in Structure example 1 of light-emitting layer 130b. Note that the energy transfer through Route $A_1$ to Route $A_3$ and Route $E_1$ is as described above.

The following explains what the terms and numerals in FIG. 10B represent.

F-Host (131_f): compound 131_f
F-Guest (132_f): compound 132_f
P-Host (135_p): compound 135_p
P-Guest (136_p): compound 136_p
$S_{FH}$: S1 level of compound 131_f
$T_{FH}$: T1 level of compound 131_f
$S_{FG}$: S1 level of compound 132_f
$T_{FG}$: T1 level of compound 132_f
$S_{PH}$: S1 level of compound 135_p
$T_{PH}$: T1 level of compound 135_p
$T_{PG}$: T1 level of compound 136_p As illustrated in FIG. 10A, the light-emitting layer 130a and the light-emitting layer 130b are close to each other. When a fluorescent light-emitting layer and a phosphorescent light-emitting layer are close to each other, in general, triplet excitation energy generated in the phosphorescent light-emitting layer is transferred to a host material (see Route $Q_1$ in FIG. 10B) or a guest material (see Route $Q_2$ in FIG. 10B) in the fluorescent light-emitting layer and deactivated. That is, the fluorescent light-emitting layer and the phosphorescent light-emitting layer that are close to each other have a problem of a decrease in light emission efficiency. This is because a substance having a condensed aromatic hydrocarbon ring typified by an anthracene skeleton is used as a host material and a guest material in a general fluorescent light-emitting layer. The substance having a condensed aromatic hydrocarbon ring tends to have a low T1 level. Without such a skeleton, a fluorescent light-emitting layer having favorable characteristics has been difficult to fabricate.

The triplet excited state has a long relaxation time and thus the diffusion length of an exciton is long; hence, even when excitons are generated in a light-emitting layer away from a fluorescent light-emitting layer, the excitons might be transferred to the fluorescent light-emitting layer and deactivated.

Figure 10C:
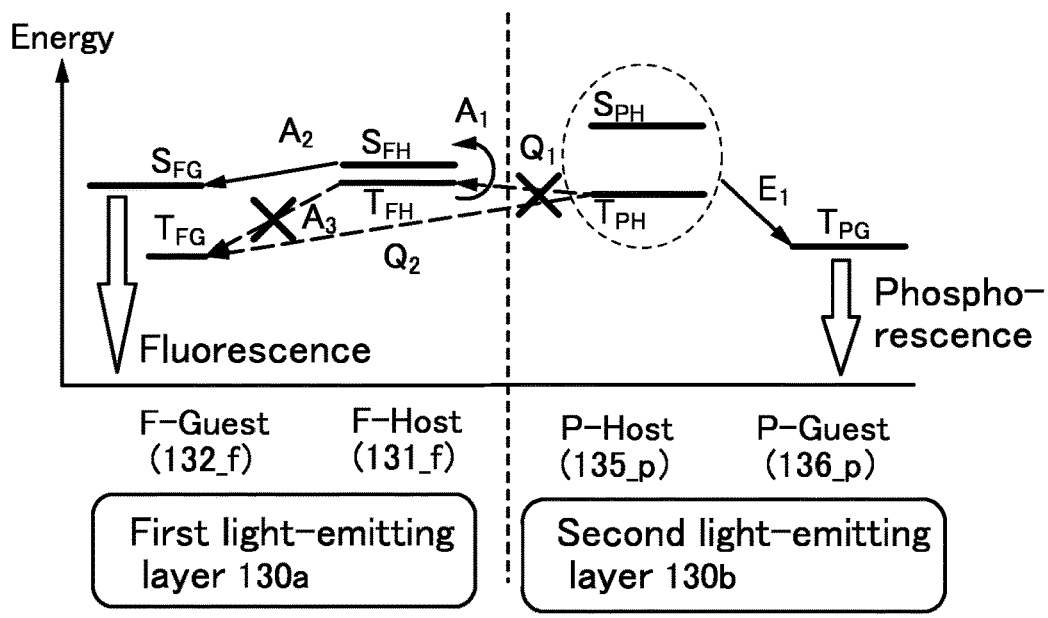

Here, the light-emitting device of one embodiment of the present invention uses a compound having a function of converting triplet excitation energy into light emission so that triplet excitation energy generated in the light-emitting layer 130a is transferred to the compound 132_f. FIG. 10B and FIG. 10C show an example in which a material having a TADF property is used as the compound 131_f. Furthermore, in FIG. 10B, a compound satisfying $T_{FH} \leq T_{PH}$ is used as the compound 135_p. In that case, the triplet excitation energy transferred to $T_{FH}$ through Route $Q_1$, which has been a problem, passes through Route $A_1$ and Route $A_2$ and is converted into fluorescence. That is, Route $Q_1$ does not serve as a deactivation pathway. Also in the case where a phosphorescent compound is used as the compound 131_f, the triplet excitation energy transferred to $T_{FH}$ through Route $Q_1$ is converted into fluorescence (see Route $A_{19}$ in FIG. 7B). Note that the singlet excitation energy and the triplet excitation energy generated in the light-emitting layer 130b as the phosphorescent light-emitting layer are also converted into phosphorescence through Route $E_1$.

In the light-emitting device of one embodiment of the present invention, a fluorescent material having protecting groups is used as the compound 132_f. This can inhibit triplet excitation energy transfer from the compound 131_f by the Dexter mechanism. In addition, triplet excitation energy transfer from the phosphorescent host material to the fluorescent guest material, which is energy transfer by the Dexter mechanism shown as Route $Q_2$, is also inhibited.

That is, although the fluorescent light-emitting layer and the phosphorescent light-emitting layer are close to each other, the triplet excitation energy of the phosphorescent light-emitting layer can be inhibited in the light-emitting device of one embodiment of the present invention. Accordingly, both fluorescence and phosphorescence can be obtained with high efficiency. Note that the ratio between fluorescence and phosphorescence can be changed by adjusting the light-emitting region in the light-emitting device. Hence, the use of a fluorescent material and a phosphorescent material that exhibit different emission colors allows fine adjustment of emission colors.

Note that in the case where $T_{FH} \leq T_{PG}$, the triplet excitation energy of the compound 136_p is transferred to the compound 131_f and thus is not deactivated; however, phosphorescence might be obtained with difficulty. Therefore, $T_{PG} \leq T_{FH}$ is preferably satisfied in one embodiment of the present invention. Particularly when a phosphorescent compound is used as the compound 131_f, the structure with $S_{FG} \leq T_{FH}$ is preferable as described above. That is, $T_{PG} \leq S_{FG} \leq T_{FH}$ is preferably satisfied. Thus, in the light-emitting device of one embodiment of the present invention, the emission color of the fluorescent material preferably has a shorter wavelength than the emission color of the phosphorescent material. The peak wavelength of the emission spectrum of the fluorescent material is preferably shorter than that of the phosphorescent material.

Structure Example 2 of Light-Emitting Layer 130a and Light-Emitting Layer 130b

Figure 11A:
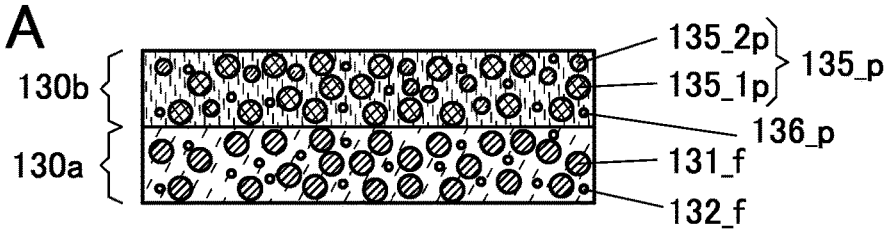
FIG. 11A is a schematic cross-sectional view of a light-emitting layer of a light-emitting device of one embodiment of the present invention.
Figure 11B:
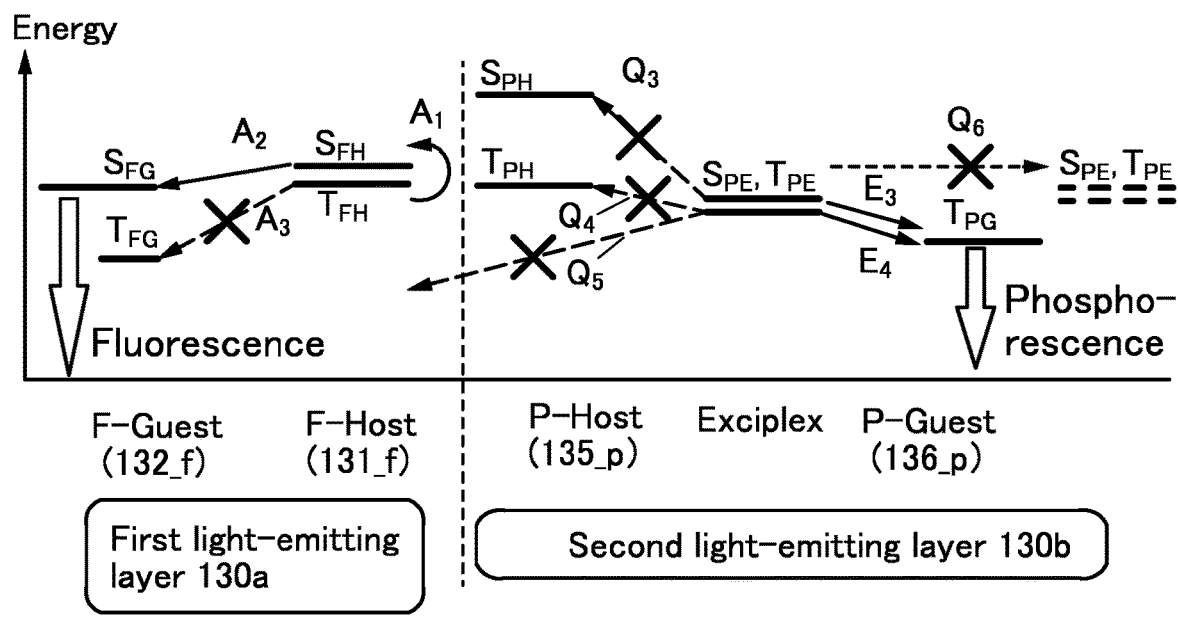
FIG. 11B is a diagram illustrating the correlation between energy levels of the light-emitting layer of the light-emitting device of one embodiment of the present invention.

FIG. 11B shows an example of the correlation between energy levels in the light-emitting layer 130a and the light-emitting layer 130b of the light-emitting device 150 and the light-emitting device 152 of one embodiment of the present invention. In FIG. 11A, the light-emitting layer 130a and light-emitting layer 130b are close to each other and the light-emitting layer 130a includes the compound 131_f and the compound 132_f. The light-emitting layer 130b includes the compound 135_p and the compound 136_p, and the compound 135_p includes a compound 135_1p and a compound 135_2p. In one embodiment of the present invention, the compound 132_f is a fluorescent material having protecting groups. The compound 131_f has a function of converting triplet excitation energy into light emission. This structure example shows the case where the compound 131_f is a material having a TADF property, the compound 136_p is a phosphorescent material, and the compound 135_1p and the compound 135_2p form an exciplex in combination. That is, in this structure example, the light-emitting layer 130a has the structure shown in Structure example 1 of light-emitting layer 130a and the light-emitting layer 130b has the structure shown in Structure example 2 of light-emitting layer 130b. Note that the energy transfer through Route $A_1$ to Route $A_3$ and Routes $E_3$ and $E_4$ is as described above. Note that for simplicity, FIG. 11B shows only the excitation levels of the compound 135_p as the excitation levels of the host material in the light-emitting layer 130b; in practice, each of the compound 135_1p and the compound 135_2p has the singlet level and the triplet level.

The following explains what the terms and numerals in FIG. 11B represent.

F-Host (131_f): compound 131_f
F-Guest (132_f): compound 132_f
P-Host (135_p): compound 135_p
P-Guest (136_p): compound 136_p
$S_{FH}$: S1 level of compound 131_f
$T_{FH}$: T1 level of compound 131_f
$S_{FG}$: S1 level of compound 132_f
$T_{FG}$: T1 level of compound 132_f
$S_{PH}$: S1 level of compound 135_p
$T_{PH}$: T1 level of compound 135_p
$T_{PG}$: T1 level of compound 136_p
$S_{PE}$: S1 level of exciplex
$T_{PE}$: T1 level of exciplex The light-emitting layer 130a and the light-emitting layer 130b are close to each other as illustrated in FIG. 11A; in this structure example as in FIG. 10B and FIG. 10C, a material having a function of converting triplet excitation energy into light emission is used as the compound 131_f and a fluorescent material having protecting groups is used as the compound 132_f, so that the triplet excitation energy generated in the light-emitting layer 130b can be inhibited from being quenched in the light-emitting layer 130b (see Route $Q_5$ in FIG. 11B).

In this structure example, ExTET is applied to the light-emitting layer 130b, which is a phosphorescent light-emitting layer. Accordingly, an exciplex is formed by the compound 135_1p and the compound 135_2p in the light-emitting layer 130b, so that almost all of the singlet and triplet excitons generated in the light-emitting layer 130b probably exist as exciplexes. The selection of a material that satisfies $T_{PH}$ $S_PE$ (or $T_PE$) prevents transfer of the singlet and triplet excitation energy of the exciplex to the compound 135_p (Routes $Q_3$ and $Q_4$ in FIG. 11B). In addition, the energy transfer from the exciplex to another exciplex is not caused because the exciplex is in an excited state (Route $Q_6$ in FIG. 11B). Hence, in the phosphorescent light-emitting layer to which ExTET is applied, the diffusion distance between the singlet excitation energy and the triplet excitation energy is extremely small. Thus, the singlet and triplet excitation energy generated in the light-emitting layer 130b is unlikely to be diffused into the light-emitting layer 130a and is efficiently converted into phosphorescence.

That is, the material having a function of converting triplet excitation energy into light emission is used as the compound 131_f and the fluorescent material having protecting groups is used as the compound 132_f in the fluorescent light-emitting layer, and furthermore, ExTET is applied to the phosphorescent light-emitting layer; thus, deactivation of the triplet excitation energy can be further inhibited in the light-emitting device.

Note that the light-emitting device of one embodiment of the present invention includes, as an example, a combination of the light-emitting layer 130a and the light-emitting layer 130b described in Structure example 1 of light-emitting layer 130a with reference to FIG. 2 and Structure example 1 of light-emitting layer 130b with reference to FIG. 8 or Structure example 2 of light-emitting layer 130b with reference to FIG. 9; however, the light-emitting device of one embodiment of the present invention is not limited thereto. For example, the light-emitting layer 130a can have any of the structures described in Structure examples 1 to 8 of light-emitting layer 130a, and the light-emitting layer 130b can have any of the structures described in Structure examples 1 and 2 of light-emitting layer 130b. That is, the structure of the light-emitting layer 130a and the structure of the light-emitting layer 130b can be combined as appropriate. Note that the combination in the light-emitting device of one embodiment of the present invention is not limited to the above.

As illustrated in FIG. 1B, the separation layer 120 can be provided between the light-emitting layer 130a and the light-emitting layer 130b. The separation layer 120 has a function of inhibiting transfer of triplet excitation energy generated in the light-emitting layer 130b to the light-emitting layer 130a. The thickness of the separation layer 120 is preferably more than or equal to 1 nm because the energy transfer by the Dexter mechanism is significantly caused with a thickness of 1 nm or less. In contrast, the too thick separation layer 120 makes it difficult to adjust a recombination region in the light-emitting device 152. Thus, the thickness of the separation layer 120 is preferably more than or equal to 1 nm and less than or equal to 20 nm, further preferably more than or equal to 2 nm and less than or equal to 10 nm.

<Energy Transfer Mechanism>

Here, the Förster mechanism and the Dexter mechanism will be described. As to supply of excitation energy from a first material in an excited state to a second material in a ground state, an intermolecular energy transfer process between the first material and the second material will be described here; the same can be applied to the case where one of them is an exciplex.

<<Förster Mechanism>>

In the Förster mechanism, energy transfer does not require direct intermolecular contact and energy is transferred through a resonant phenomenon of dipolar oscillation between a first material and a second material. By the resonant phenomenon of dipolar oscillation, the first material provides energy to the second material, and thus, the first material in an excited state is brought into a ground state and the second material in a ground state is brought into an excited state. Note that the rate constant $k_{h^* \to g}$ of the Förster mechanism is expressed by Equation (1).

[Equation 1]

$$k_{h^* \to g} = \frac{9000c^4 K^2 \phi \ln 10}{128\pi^5 n^4 N \tau R^6} \int \frac{f'_h(v)\varepsilon_g(v)}{v^4} dv \quad (1)$$

In Equation (1), ν denotes a frequency; $f_h(v)$, a normalized emission spectrum of the first material (a fluorescent spectrum in the case where energy transfer from a singlet excited state is discussed, or a phosphorescent spectrum in the case where energy transfer from a triplet excited state is discussed); $\varepsilon_g(v)$, a molar absorption coefficient of the second material; N, Avogadro's number; n, a refractive index of a medium; R, an intermolecular distance between the first material and the second material; τ, a measured lifetime of an excited state (fluorescence lifetime or phosphorescence lifetime); c, the speed of light; φ, a luminescence quantum yield (a fluorescence quantum yield in the case where energy transfer from a singlet excited state is discussed, or a phosphorescence quantum yield in the case where energy transfer from a triplet excited state is discussed); and $K^2$, a coefficient (0 to 4) of orientation of a transition dipole moment between the first material and the second material. Note that $K^2=2/3$ in random orientation.

In the case where the first material is used as the energy donor and the second material is used as the energy acceptor and the emission colors of the first material and the second material are close to each other, the overlap between $f_h(v)$ and $\varepsilon_g(v)$ decreases according to Equation (1) shown above ($\varepsilon_g(v)$ exists on the longer wavelength side than the emission spectrum of the second material); thus, $k_{h^* \to g}$ decreases. However, in the light-emitting device of one embodiment of the present invention, the energy donor concentration in the light-emitting layer can be increased as mentioned above, so that the value of R in Equation (1) can be increased, which inhibits a decrease in $k_{h^* \to g}$. Thus, a fluorescent material having an emission color close to that of the energy donor can be used as a light-emitting material in the light-emitting device of one embodiment of the present invention. Note that the light-emitting device of one embodiment of the present invention can also use an energy donor and an energy acceptor that have different emission colors.

<<Dexter Mechanism>>

In the Dexter mechanism, the first material and the second material are close to a contact effective range where their orbitals overlap, and the first material in an excited state and the second material in a ground state exchange their electrons, which leads to energy transfer. Note that the rate constant $k_{h^* \to g}$ of the Dexter mechanism is expressed by Equation (2).

[Equation 2]

$$k_{h^* \to g} = \left(\frac{2\pi}{h}\right) K^2 \exp\left(-\frac{2R}{L}\right) \int f'_h(v) \varepsilon'_g(v) dv \quad (2)$$

In Equation (2), h denotes a Planck constant; K, a constant having an energy dimension; v, a frequency; $f_h(v)$, a normalized emission spectrum of the first material (the fluorescent spectrum in the case where energy transfer from a singlet excited state is discussed, or the phosphorescent spectrum in the case where energy transfer from a triplet excited state is discussed); $\varepsilon'_g(v)$, a normalized absorption spectrum of the second material; L, an effective molecular radius; and R, an intermolecular distance between the first material and the second material.

Here, the efficiency of energy transfer $\phi_{ET}$ from the first material to the second material is expressed by Equation (3). Note that $k_r$ denotes a rate constant of a light-emission process (fluorescence in the case where energy transfer from a singlet excited state is discussed, or phosphorescence in the case where energy transfer from a triplet excited state is discussed) of the first material; $k_n$, a rate constant of a non-light-emission process (thermal deactivation or intersystem crossing) of the second material; and τ, a measured lifetime of an excited state of the first material.

[Equation 3]

$$\phi_{ET} = \frac{k_{h^* \to g}}{k_r + k_n + k_{h^* \to g}} = \frac{k_{h^* \to g}}{\left(\frac{1}{\tau}\right) + k_{h^* \to g}} \quad (3)$$

According to Equation (3), it is found that the energy transfer efficiency $\phi_{ET}$ can be increased by increasing the rate constant $k_{h^* \to g}$ of energy transfer so that another competing rate constant $k_r+k_n$ (=1/τ) becomes relatively small.

<<Concept for Promoting Energy Transfer>>

First, energy transfer by the Förster mechanism is considered. When Equation (1) is substituted into Equation (3), τ can be eliminated. Thus, in the case of the Förster mechanism, the energy transfer efficiency $\phi_{ET}$ does not depend on the lifetime τ of the excited state of the first material. Furthermore, it can be said that high energy transfer efficiency $\phi_{ET}$ is obtained when the emission quantum yield φ is high.

Furthermore, it is preferable that the emission spectrum of the first material largely overlap with the absorption spectrum of the second material (absorption corresponding to transition from a singlet ground state to a singlet excited state). Moreover, it is preferable that the molar absorption coefficient of the second material be also high. This means that the emission spectrum of the first material overlaps with the absorption band of the second material which is on the longest wavelength side. Note that since direct transition from the singlet ground state to the triplet excited state of the second material is forbidden, the molar absorption coefficient of the second material in the triplet excited state can be ignored. Thus, a process of energy transfer from an excited state of the first material to a triplet excited state of the second material by the Förster mechanism can be ignored, and only a process of energy transfer to a singlet excited state of the second material is considered.

The rate of energy transfer by the Förster mechanism is inversely proportional to the 6th power of the intermolecular distance R between the first material and the second material, according to Equation (1). As described above, when R is less than or equal to 1 nm, energy transfer by the Dexter mechanism is dominant. Therefore, to increase the rate of energy transfer by the Förster mechanism while inhibiting energy transfer by the Dexter mechanism, the intermolecular distance is preferably greater than or equal to 1 nm and less than or equal to 10 nm. This requires the above protecting groups to be not too bulky; thus, the number of carbon atoms of the protecting groups is preferably 3 to 10.

Next, energy transfer by the Dexter mechanism is considered. According to Equation (2), in order to increase the rate constant $k_{h^* \to g}$, it is preferable that the emission spectrum of the first material (the fluorescence spectrum in the case where energy transfer from a singlet excited state is discussed, or the phosphorescence spectrum in the case where energy transfer from a triplet excited state is discussed) largely overlap with an absorption spectrum of the second material (absorption corresponding to transition from a singlet ground state to a singlet excited state). Therefore, the energy transfer efficiency can be optimized by making the emission spectrum of the first material overlap with the absorption band of the second material which is on the longest wavelength side.

When Equation (2) is substituted into Equation (3), it is found that the energy transfer efficiency $\phi_{ET}$ in the Dexter mechanism depends on r. In the Dexter mechanism, which is a process of energy transfer based on the electron exchange, as well as the energy transfer from the singlet excited state of the first material to the singlet excited state of the second material, energy transfer from the triplet excited state of the first material to the triplet excited state of the second material occurs.

In the light-emitting device of one embodiment of the present invention in which the second material is a fluorescent material, the efficiency of energy transfer to the triplet excited state of the second material is preferably low. That is, the efficiency of energy transfer based on the Dexter mechanism from the first material to the second material is preferably low and the efficiency of energy transfer based on the Förster mechanism from the first material to the second material is preferably high.

As described above, the energy transfer efficiency in the Förster mechanism does not depend on the lifetime τ of the excited state of the first material. In contrast, the energy transfer efficiency in the Dexter mechanism depends on the excitation lifetime τ of the first material; to reduce the energy transfer efficiency in the Dexter mechanism, the excitation lifetime τ of the first material is preferably short.

Thus, in one embodiment of the present invention, an exciplex, a phosphorescent material, or a TADF material is used as the first material. These materials each have a function of converting triplet excitation energy into light emission. The energy transfer efficiency of the Förster mechanism depends on the emission quantum yield of the energy donor; thus, the excitation energy of the first material capable of converting the triplet excited state energy into light emission, such as a phosphorescent compound, an exciplex, or a TADF material, can be transferred to the second material by the Förster mechanism. Meanwhile, with the structure of one embodiment of the present invention, reverse intersystem crossing from the triplet excited state to the singlet excited state of the first material (exciplex or TADF material) can be promoted, and the excitation lifetime τ of the triplet excited state of the first material can be short. Furthermore, transition from the triplet excited state to the singlet ground state of the first material (phosphorescent material or exciplex using a phosphorescent material) can be promoted, and the excitation lifetime τ of the triplet excited state of the first material can be short. As a result, the energy transfer efficiency from the triplet excited state of the first material to the triplet excited state of the fluorescent material (the second material) in the Dexter mechanism can be reduced.

In the light-emitting device of one embodiment of the present invention, a fluorescent material having protecting groups is used as the second material, as described above. Therefore, the intermolecular distance between the first material and the second material can be large. In the light-emitting device of one embodiment of the present invention, a material having a function of converting triplet excitation energy into light emission is used as the first material, and a fluorescent material having protecting groups is used as the second material, whereby the efficiency of energy transfer by the Dexter mechanism can be reduced. As a result, non-radiative decay of the triplet excitation energy in the light-emitting layer 130a can be inhibited, so that a light-emitting device with high emission efficiency can be provided.

Materials

Next, the components of the light-emitting device of one embodiment of the present invention will be described in detail below.

<<Light-Emitting Layer 130a>>

Materials that can be used for the light-emitting layer 130a are described below. In the light-emitting layer 130a of the light-emitting device of one embodiment of the present invention, an energy acceptor having a function of converting triplet excitation energy into light emission and an energy donor including a luminophore and protecting groups are used. As the material having a function of converting triplet excitation energy into light emission, a TADF material, an exciplex, and a phosphorescent material are given. Note that the material that can be used for the compound 131 can also be used for the compound 131_f, and the material that can be used for the compound 132 can also be used for the compound 132_f.

Examples of the luminophore included in the compound 132 serving as an energy acceptor include a phenanthrene skeleton, a stilbene skeleton, an acridone skeleton, a phenoxazine skeleton, and a phenothiazine skeleton. Specifically, fluorescent compounds having a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton are preferable because of their high fluorescence quantum yields.

The protecting group is preferably an alkyl group having 1 to 10 carbon atoms, a cycloalkyl group having 3 to 10 carbon atoms, a branched-chain alkyl group having 3 to 10 carbon atoms, or a trialkylsilyl group having 3 to 12 carbon atoms.

Examples of the alkyl group having 1 to 10 carbon atoms include a methyl group, an ethyl group, a propyl group, a pentyl group, and a hexyl group; a branched-chain alkyl group having 3 to 10 carbon atoms, which is described later, is particularly preferable. Note that the alkyl group is not limited thereto.

Examples of the cycloalkyl group having 3 to 10 carbon atoms include a cyclopropyl group, a cyclobutyl group, a cyclohexyl group, a norbornyl group, and an adamantyl group. The cycloalkyl group is not limited thereto. In the case where the cycloalkyl group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7 carbon atoms, such as a cyclopentyl group, a cyclohexyl group, a cycloheptyl group, or a 8,9,10-trinorbornanyl group, and an aryl group having 6 to 12 carbon atoms, such as a phenyl group, a naphthyl group, or a biphenyl group.

Examples of the branched-chain alkyl group having 3 to 10 carbon atoms include an isopropyl group, a sec-butyl group, an isobutyl group, a tert-butyl group, an isopentyl group, a sec-pentyl group, a tert-pentyl group, a neopentyl group, an isohexyl group, a 3-methylpentyl group, a 2-methylpentyl group, a 2-ethylbutyl group, a 1,2-dimethylbutyl group, and a 2,3-dimethylbutyl group. The branched-chain alkyl group is not limited thereto.

Examples of the trialkylsilyl group having 3 to 12 carbon atoms include a trimethylsilyl group, a triethylsilyl group, and a tert-butyl dimethylsilyl group. The trialkylsilyl group is not limited thereto.

In the molecular structure of the energy acceptor, it is preferable that two or more diarylamino groups be bonded to a luminophore and aryl groups of the diarylamino groups each have at least one protecting group. It is further preferable that at least two protecting groups be bonded to each of the aryl groups. This is because a larger number of protecting groups more effectively inhibit energy transfer by the Dexter mechanism in the case where the guest material is used for the light-emitting layer. To inhibit an increase in molecular weight and keep the sublimation property, the diarylamino groups are preferably diphenylamino groups. Note that a structure in which the luminophore and the diarylamino group are bonded to each other through a nitrogen atom of the diarylamino group is preferable.

Furthermore, when two or more diarylamino groups are bonded to a luminophore, a fluorescent material whose emission color can be adjusted and which has a high quantum yield can be obtained. The diarylamino groups are preferably bonded to the luminophore at symmetric positions. With such a structure, the fluorescent material can have a high quantum yield.

The protecting groups may be introduced to the luminophore via the aryl groups of the diarylamino groups, not directly introduced to the luminophore. Such a structure is preferably employed, in which case the protecting groups can be arranged to cover the luminophore, allowing the host material and the luminophore to be away from each other from any direction. In the case where the protecting groups are not directly bonded to the luminophore, four or more protecting groups are preferably introduced to one luminophore.

Furthermore, it is preferable that at least one of atoms of the plurality of protecting groups be positioned over one plane of the luminophore, that is, the condensed aromatic ring or the condensed heteroaromatic ring, and at least one of atoms of the plurality of protecting groups be positioned over the other plane of the condensed aromatic ring or the condensed heteroaromatic ring, as shown in FIG. 3. The following structure is given as a specific method. In other words, the condensed aromatic ring or the condensed heteroaromatic ring, which is a luminophore, is bonded to two or more diphenylamino groups, and the phenyl groups of the two or more diphenylamino groups each independently have protecting groups at the 3-position and the 5-position.

Such a structure enables a steric configuration in which the protecting groups at the 3-position or the 5-position of the phenyl groups are positioned over the condensed aromatic ring or the condensed heteroaromatic ring, which is a luminophore, as shown in FIG. 4. As a result, the upper and lower planes of the condensed aromatic ring or the condensed heteroaromatic ring can be efficiently covered, inhibiting energy transfer by the Dexter mechanism.

As the energy acceptor material described above, the organic compound represented by General Formula (G1) or (G2) shown below can be favorably used.

[Chemical Formula 2]

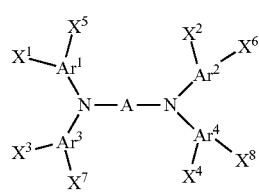

(G1)

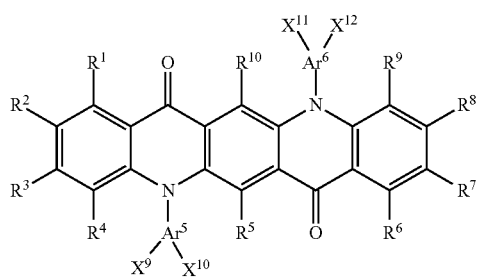

(G2)

In General Formulae (G1) and (G2), A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^6$ each independently represent a substituted or unsubstituted aromatic hydrocarbon group having 6 to 13 carbon atoms, $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 12 carbon atoms, and $R^1$ to $R^{10}$ each independently represent any one of hydrogen, an alkyl group having 3 to 10 carbon atoms, a substituted or unsubstituted cycloalkyl group having 3 to 10 carbon atoms, and a trialkylsilyl group having 3 to 12 carbon atoms.

Examples of the aromatic hydrocarbon group having 6 to 13 carbon atoms include a phenyl group, a biphenyl group, a naphthyl group, and a fluorenyl group. Note that the aromatic hydrocarbon group is not limited thereto. In the case where the aromatic hydrocarbon group has a substituent, examples of the substituent include an alkyl group having 1 to 7 carbon atoms, such as a methyl group, an ethyl group, a propyl group, an isopropyl group, a butyl group, an isobutyl group, a sec-butyl group, a tert-butyl group, a pentyl group, or a hexyl group, a cycloalkyl group having 5 to 7 carbon atoms, such as a cyclopentyl group, a cyclohexyl group, a cycloheptyl group, or an 8,9,10-trinorbornanyl group, and an aryl group having 6 to 12 carbon atoms, such as a phenyl group, a naphthyl group, or a biphenyl group.

In General Formula (G1), the substituted or unsubstituted condensed aromatic ring having 10 to 30 carbon atoms or the substituted or unsubstituted condensed heteroaromatic ring having 10 to 30 carbon atoms represents the luminophore; any of the above skeletons can be used. In General Formulae (G1) and (G2), $X^1$ to $X^{12}$ represent protecting groups.

In General Formula (G2), the protecting groups are bonded to a quinacridone skeleton, which is a luminophore, via aromatic hydrocarbon groups. With this structure, the protecting groups can be arranged to cover the luminophore; thus, energy transfer by the Dexter mechanism can be inhibited. Note that any of the protecting groups may be directly bonded to the luminophore.

As the energy acceptor material, an organic compound represented by General Formula (G3) or (G4) shown below can be suitably used.

[Chemical Formula 3]

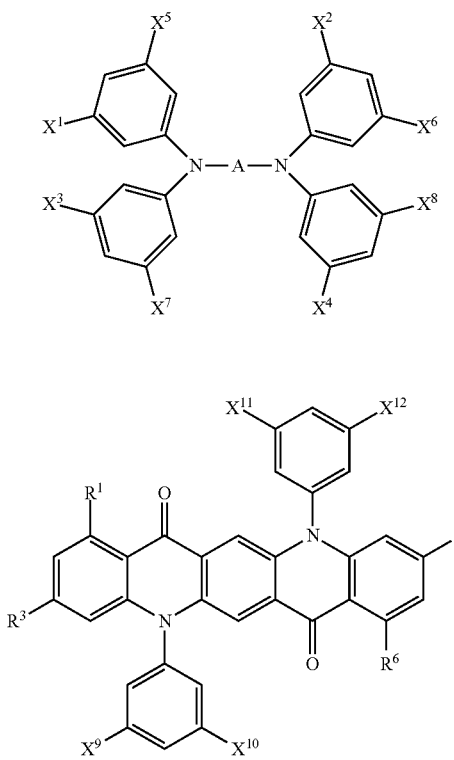

(G3)

(G4)

[Chemical Formula 4]

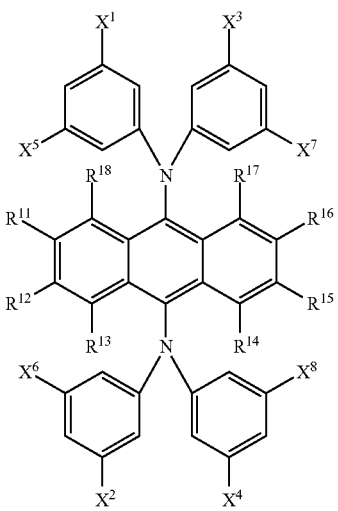

(G5)

In General Formulae (G3) and (G4), A represents a substituted or unsubstituted condensed aromatic ring having 10 to 30 carbon atoms or a substituted or unsubstituted condensed heteroaromatic ring having 10 to 30 carbon atoms, and $X^1$ to $X^{12}$ each independently represent any one of a branched-chain alkyl group having 3 to 10 carbon atoms, a substituted or unsubstituted cycloalkyl group having 3 to 10 carbon atoms, and a trialkylsilyl group having 3 to 12 carbon atoms. $R^1$, $R^3$, $R^6$, and $R^8$ each independently represent any one of hydrogen, an alkyl group having 3 to 10 carbon atoms, a substituted or unsubstituted cycloalkyl group having 3 to 10 carbon atoms, and a trialkylsilyl group having 3 to 12 carbon atoms.

The protecting groups are each preferably bonded to the luminophore via a phenylene group. With this structure, the protecting groups can be arranged to cover the luminophore; thus, energy transfer by the Dexter mechanism can be inhibited. In the case where the protecting groups are each bonded to the luminophore via a phenylene group and two protecting groups are bonded to the phenylene group, the two protecting groups are preferably bonded to the phenylene group at the meta-positions as shown in General Formulae (G3) and (G4). With such a structure, the luminophore can be efficiently covered; thus, energy transfer by the Dexter mechanism can be inhibited. An example of the organic compound represented by General Formula (G3) is 2tBu-mmtBuDPhA2Anth described above. That is, in one embodiment of the present invention, General Formulae (G3) is a particularly preferable example.

As the energy acceptor material, an organic compound represented by General Formula (G5) shown below can be suitably used.

In General Formula (G5), $X^1$ to $X^8$ each independently represent any one of a branched-chain alkyl group having 3 to 10 carbon atoms, a substituted or unsubstituted cycloalkyl group having 3 to 10 carbon atoms, and a trialkylsilyl group having 3 to 12 carbon atoms, and $R^{11}$ to $R^{18}$ each independently represent any one of hydrogen, a branched-chain alkyl group having 3 to 10 carbon atoms, a substituted or unsubstituted cycloalkyl group having 3 to 10 carbon atoms, a trialkylsilyl group having 3 to 12 carbon atoms, and a substituted or unsubstituted aryl group having 6 to 25 carbon atoms.

Examples of the aryl group having 6 to 25 carbon atoms include a phenyl group, a naphthyl group, a biphenyl group, a fluorenyl group, and a spirofluorenyl group. Note that an aryl group having 6 to 25 carbon atoms is not limited thereto. In the case where the aryl group has a substituent, examples of the substituent include the alkyl group having 1 to 10 carbon atoms, the branched-chain alkyl group having 3 to 10 carbon atoms, the substituted or unsubstituted cycloalkyl group having 3 to 10 carbon atoms, and the trialkylsilyl group having 3 to 12 carbon atoms, which are described above.

An anthracene compound has a high emission quantum yield and a small area of the luminophore; therefore, the upper and lower planes of anthracene can be efficiently covered with the protecting groups. An example of the organic compound represented by General Formula (G5) is 2tBu-mmtBuDPhA2Anth described above.

Examples of the compounds represented by General Formulae (G1) to (G5) are shown by Structural Formulae (102) to (105) and (200) to (284) below. Note that the compounds represented by General Formulae (G1) to (G5) are not limited thereto. The compounds represented by Structural Formulae (102) to (105) and (200) to (284) can be suitably used as a fluorescent material of the light-emitting device of one embodiment of the present invention. Note that the fluorescent material is not limited thereto.

[Chemical Formula 5]
(102)
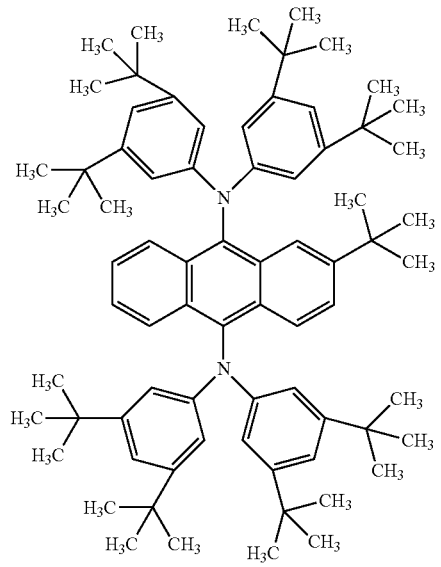
(103)
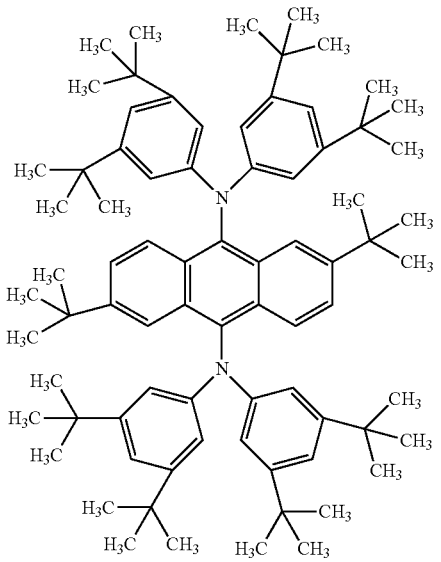
(104)
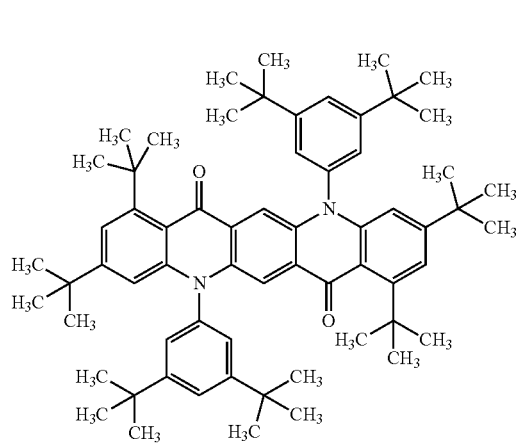
(105)
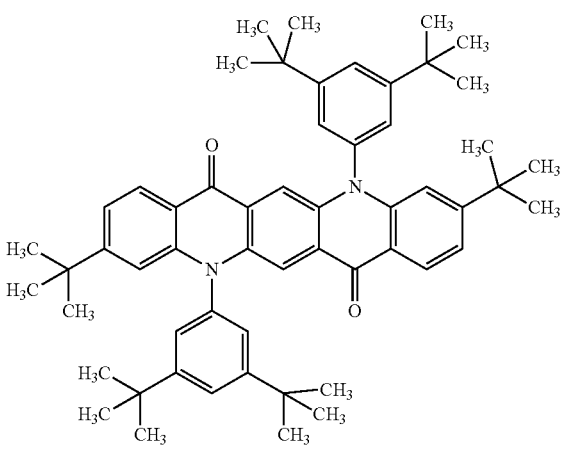

[Chemical Formula 6]
(200)
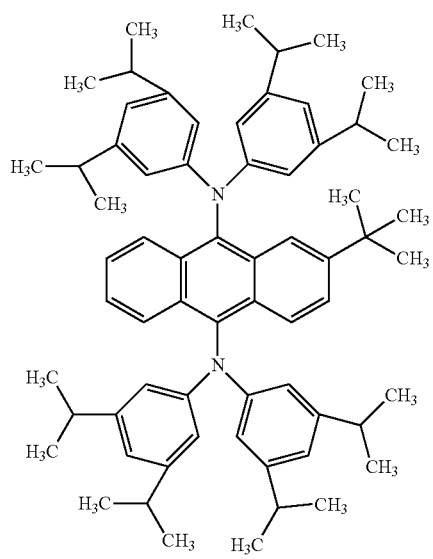
(201)
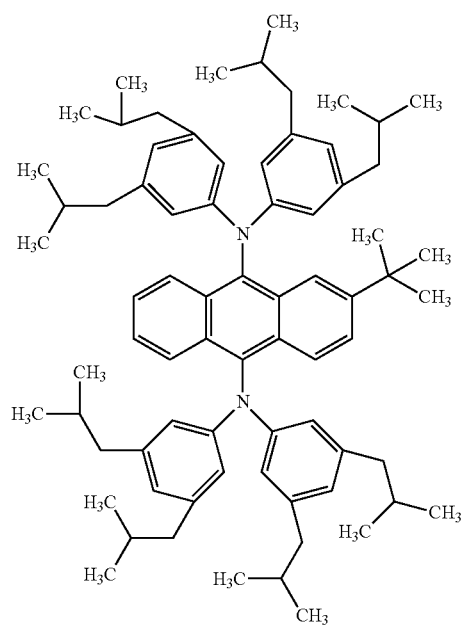
(202)
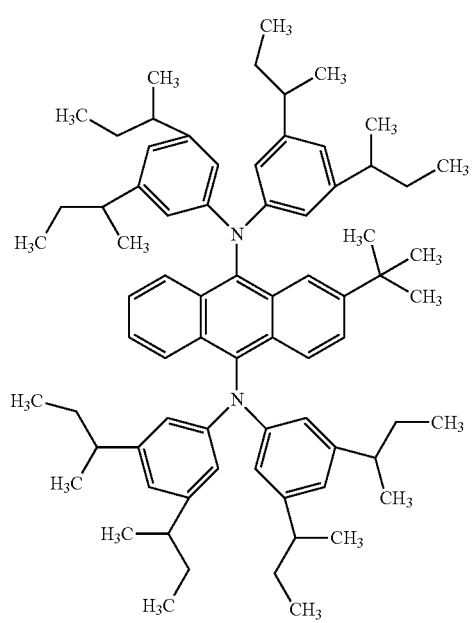
(203)
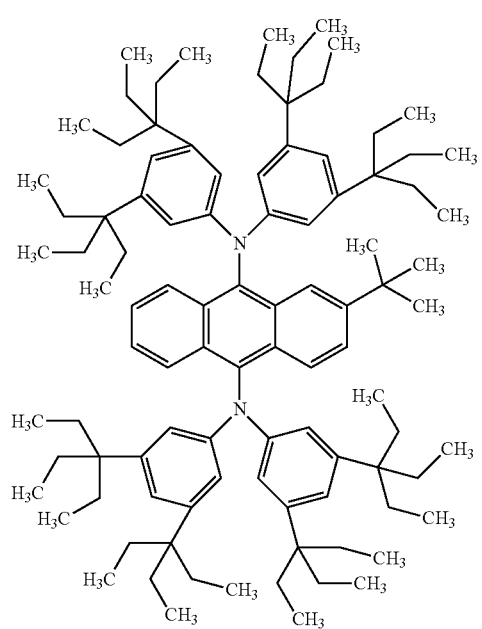

[Chemical Formula 7]
(204)
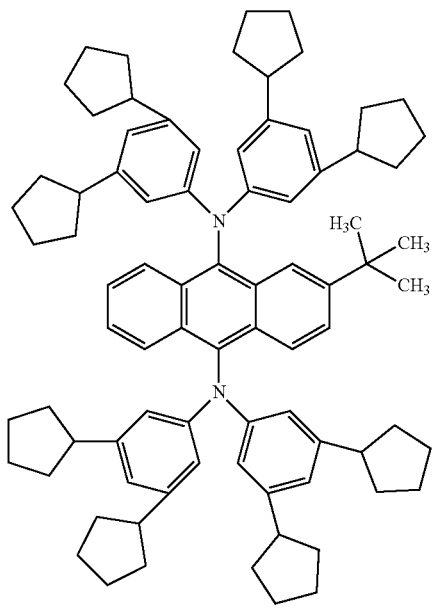
(205)
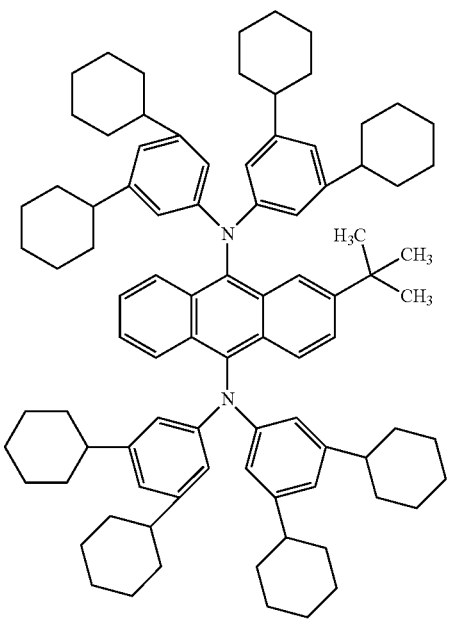
-continued
(206)
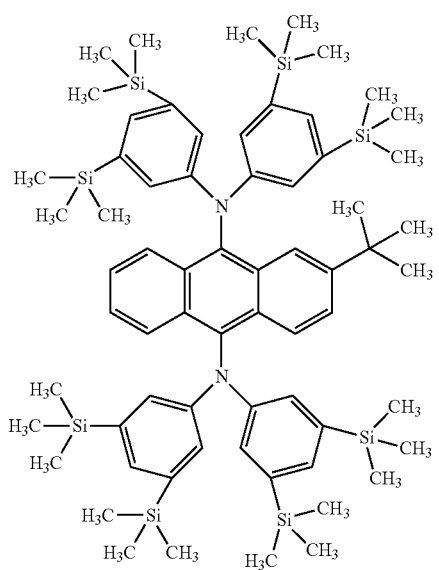
(207)
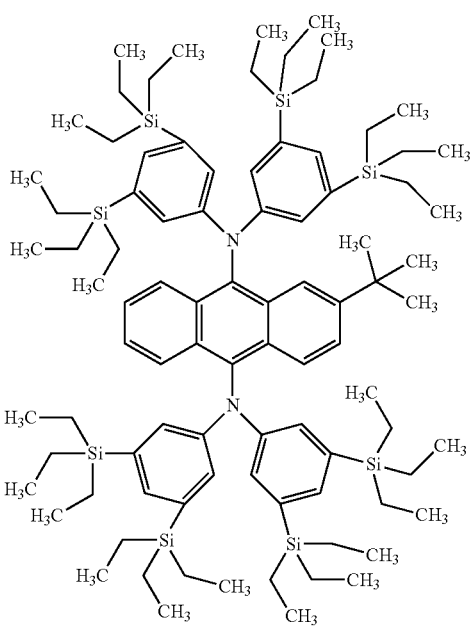

[Chemical Formula 8]
(208)
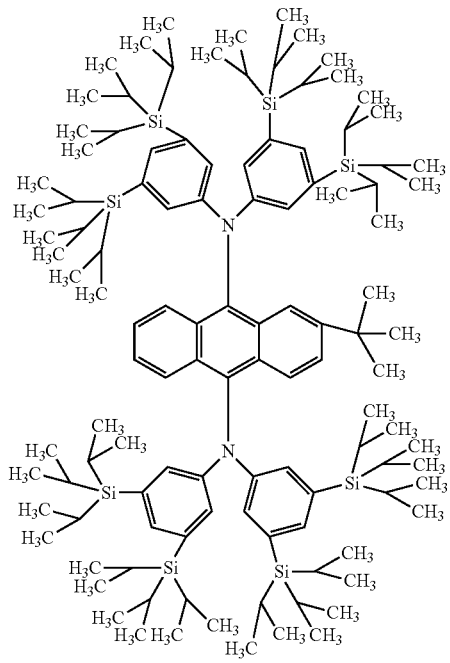
(209)
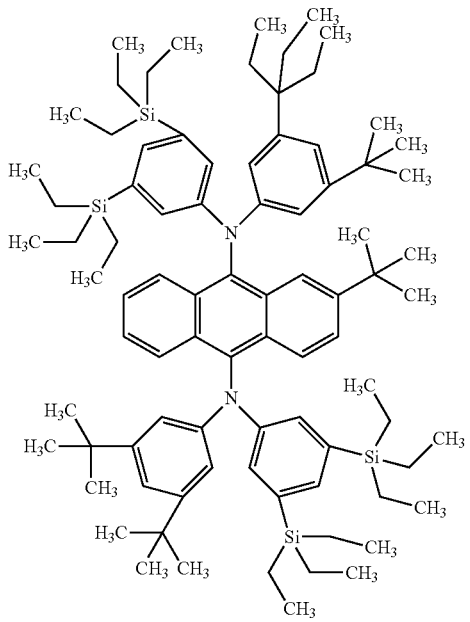
(210)
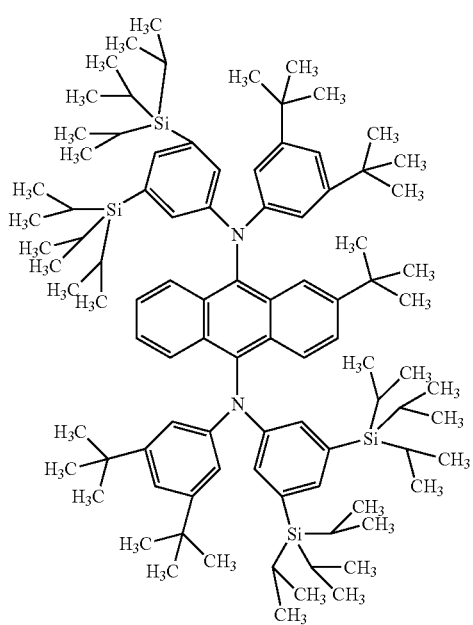
(211)
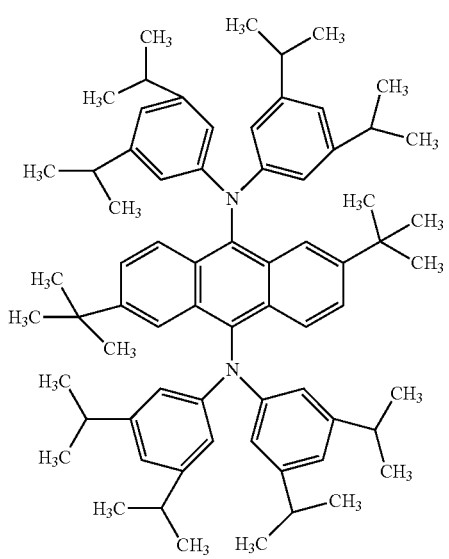

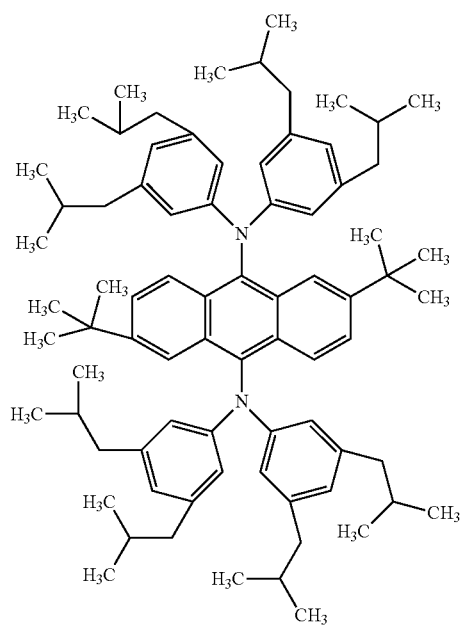
(212)
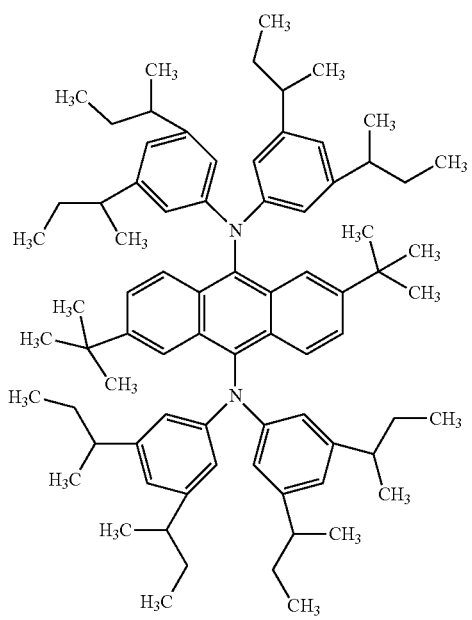
(213)
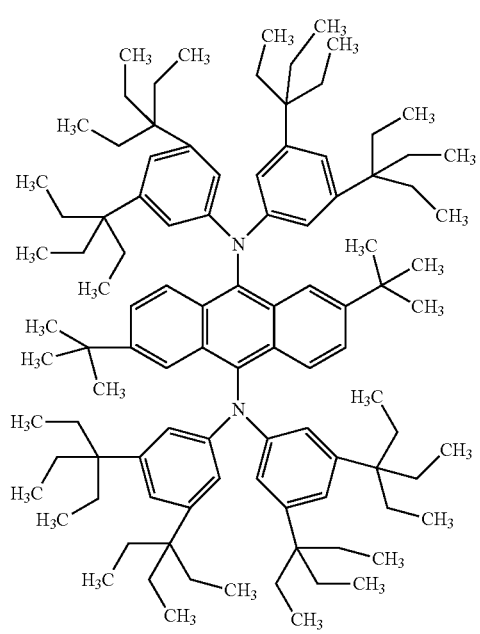
(214)
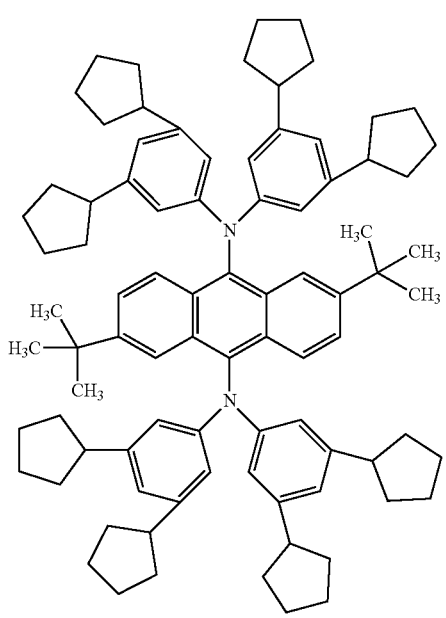
(215)

[Chemical Formula 10]
(216) 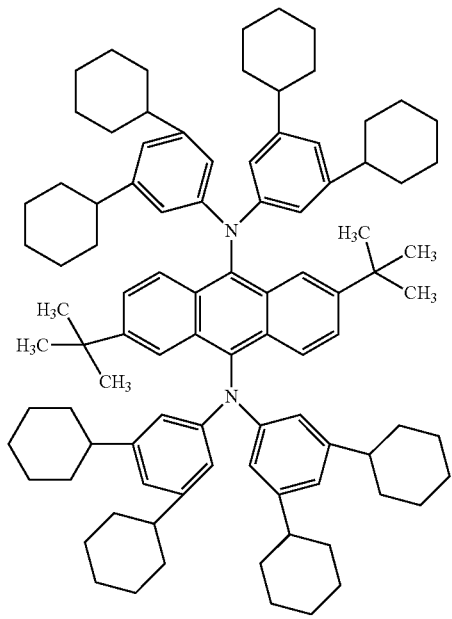
(217) 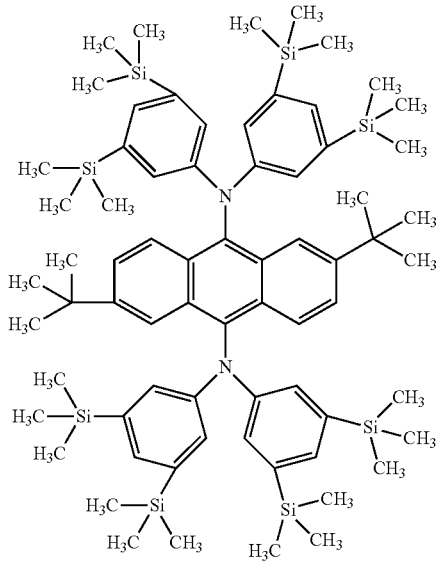
(218) 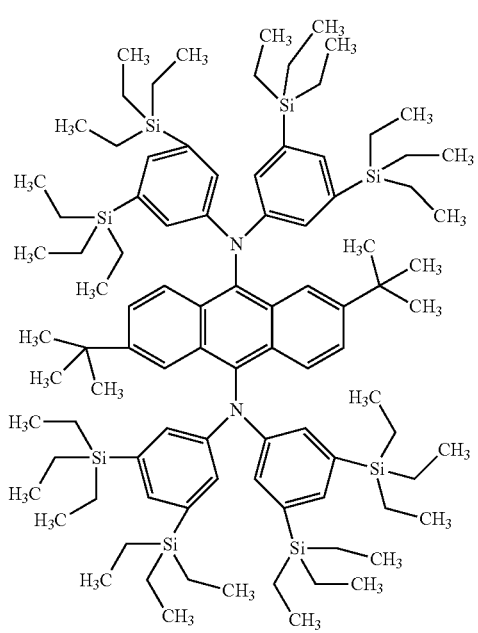
(219) 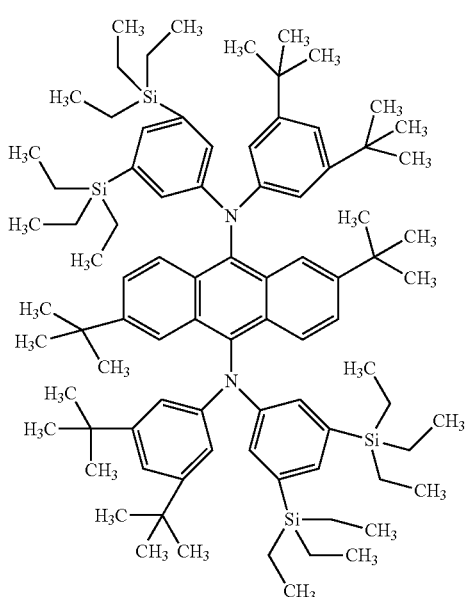

[Chemical Formula 11]
(220) 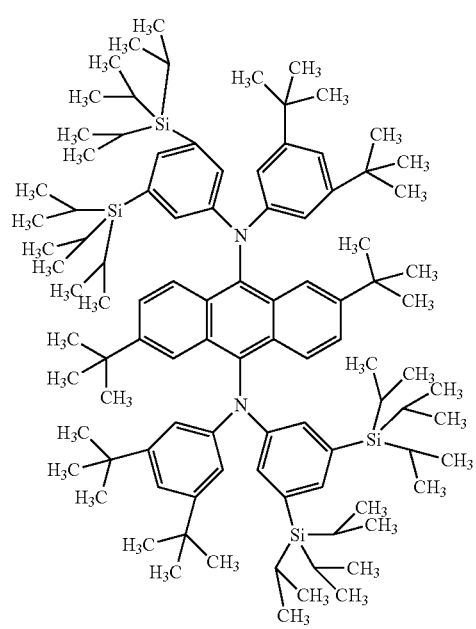
(221) 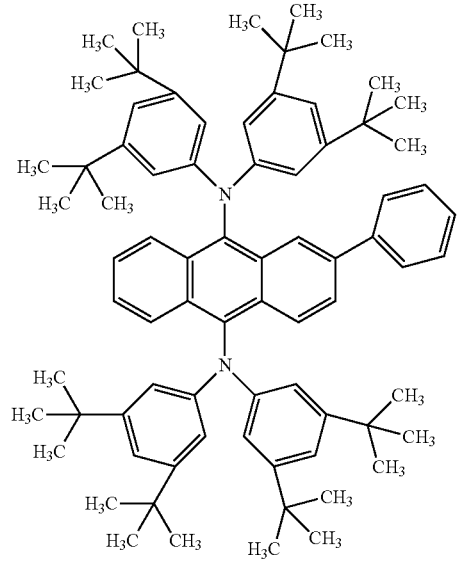
(224) 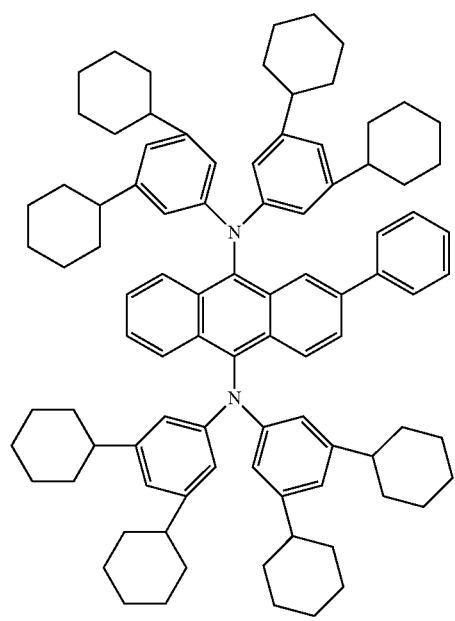
(223) 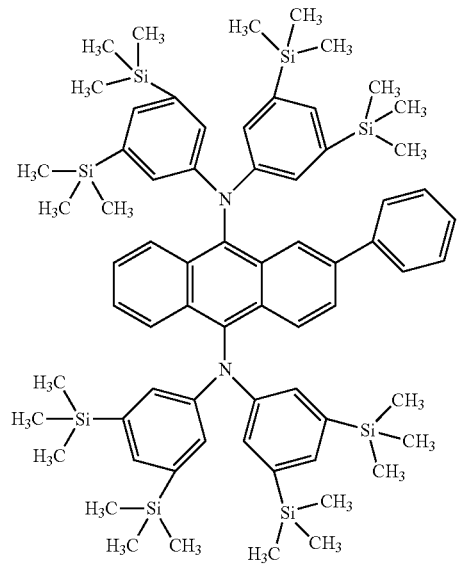

[Chemical Formula 12]
(224) 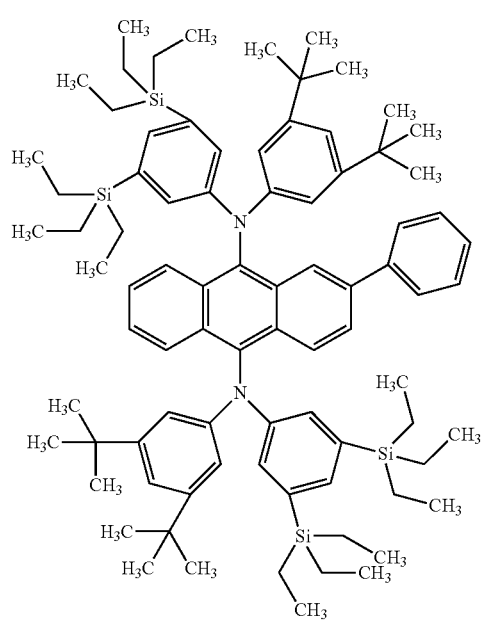
(225) 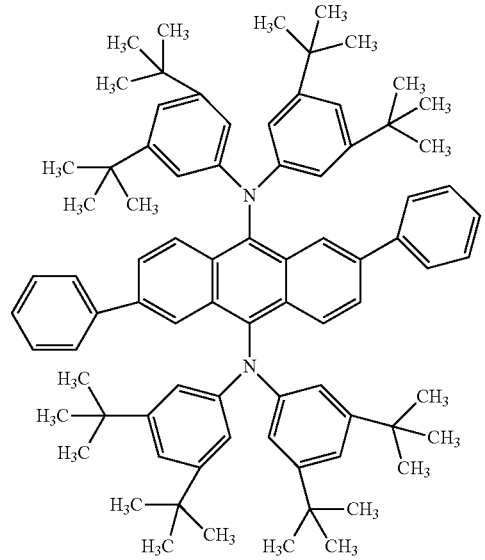
(226) 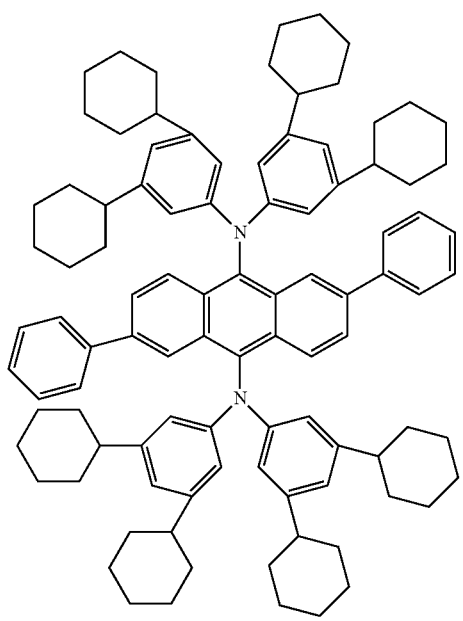
(227) 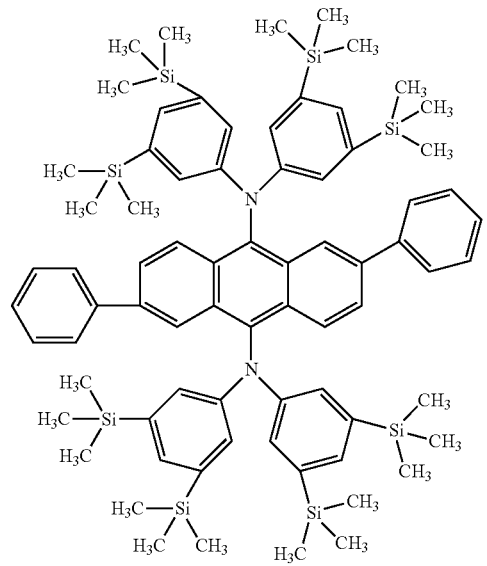

[Chemical Formula 13]
(228) 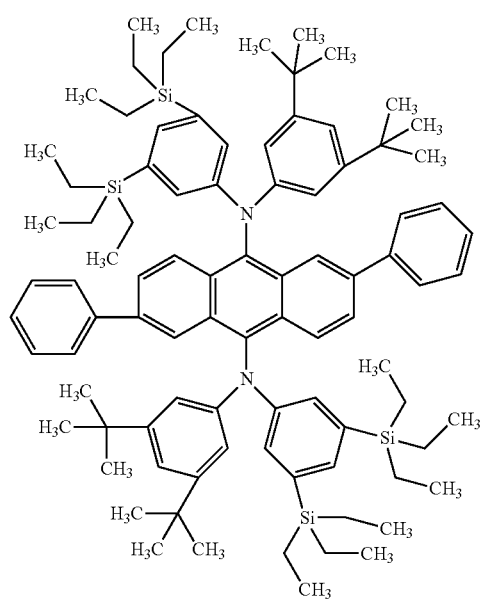
(229) 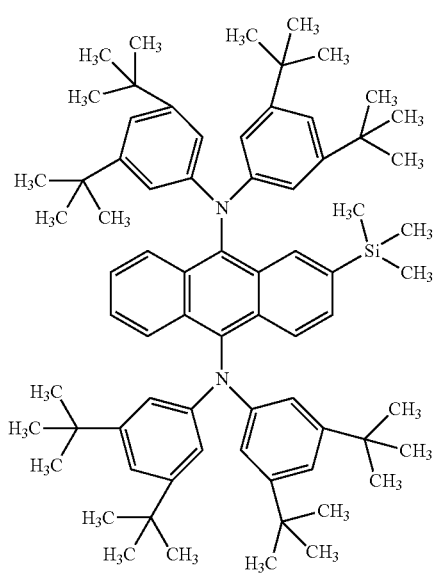
(230) 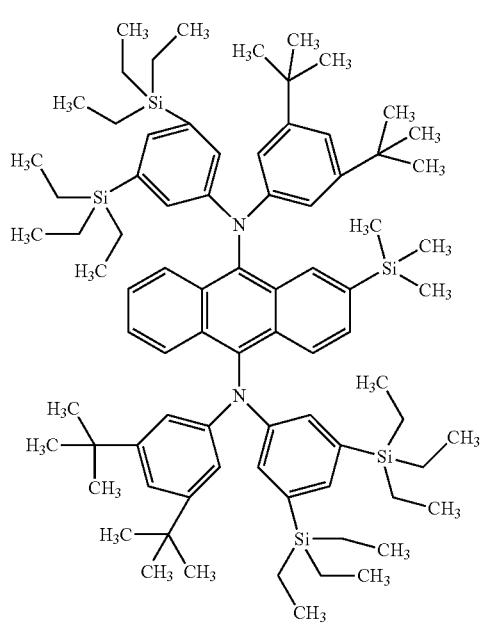
(231) 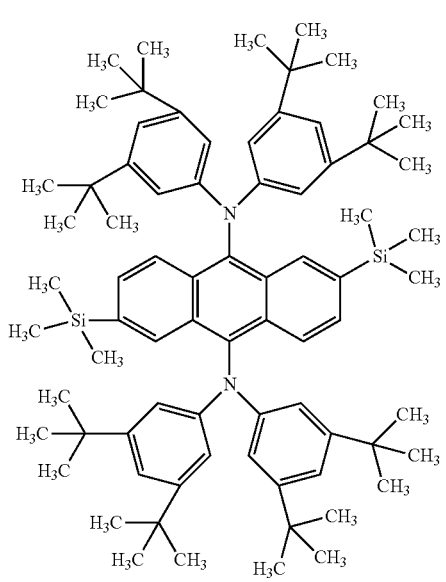

[Chemical Formula 14]
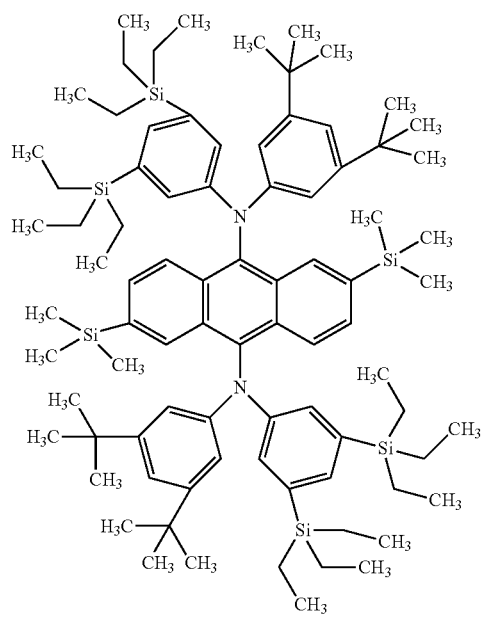
(232)
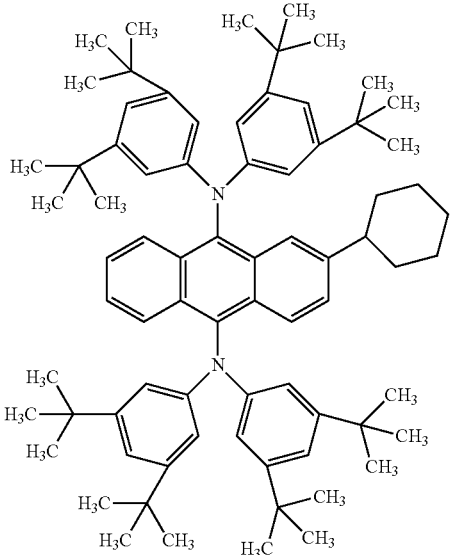
(233)
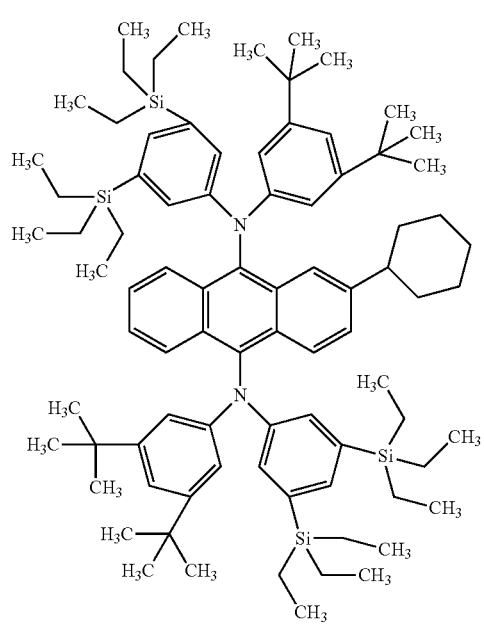
(234)
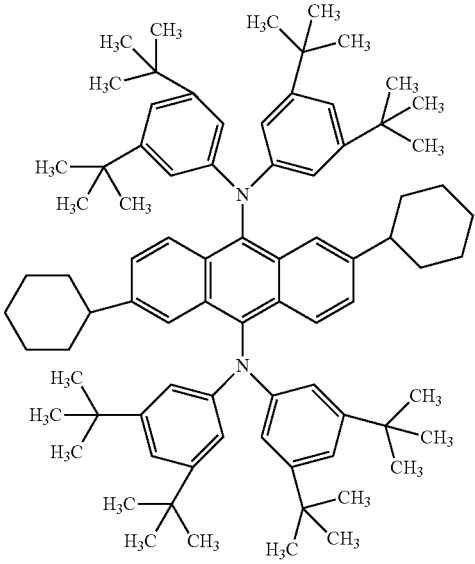
(235)

[Chemical Formula 15]
(236)
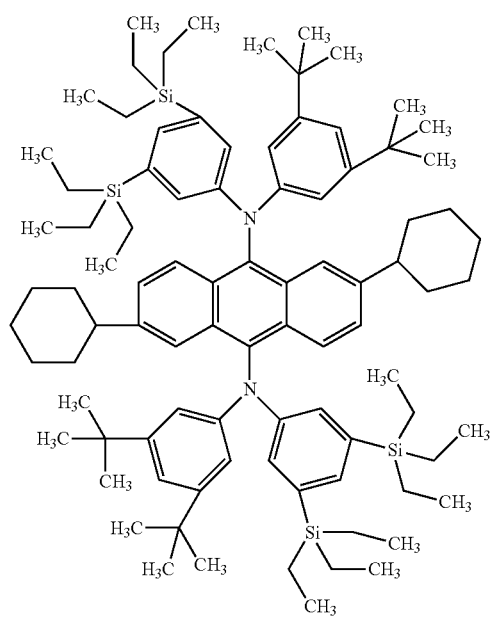
(237)
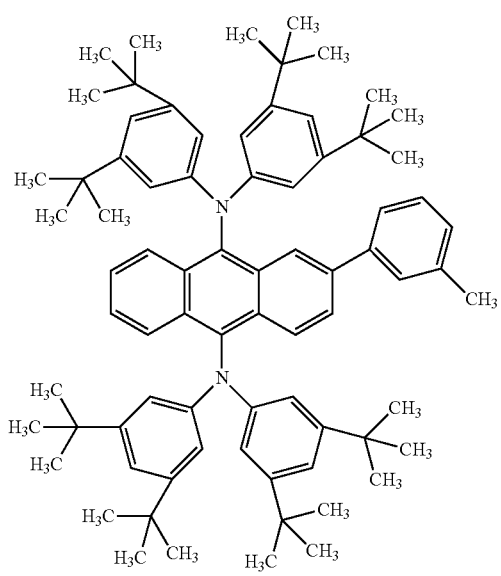
(238)
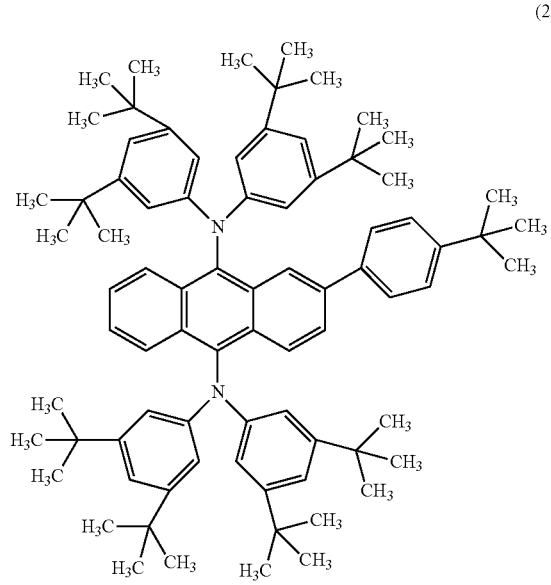
(239)
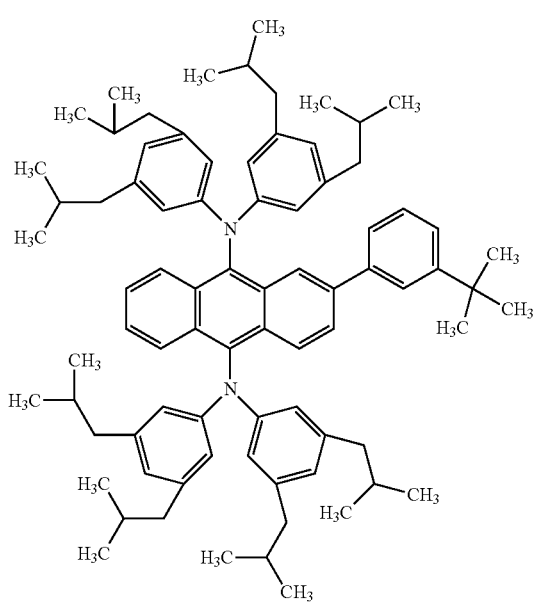

[Chemical Formula 16]
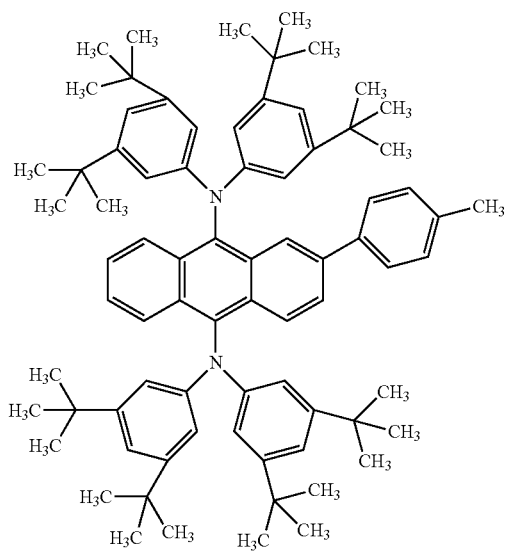
(240)
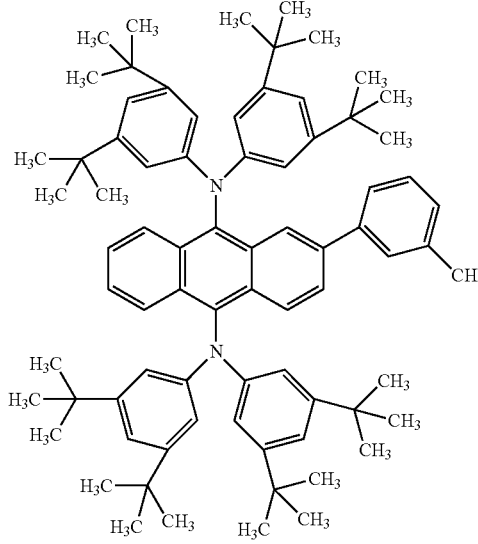
(241)
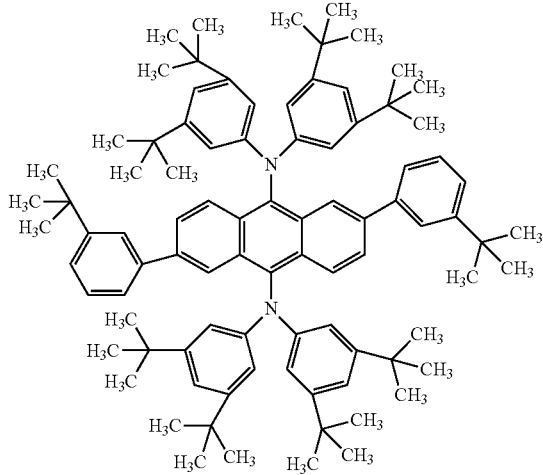
(242)
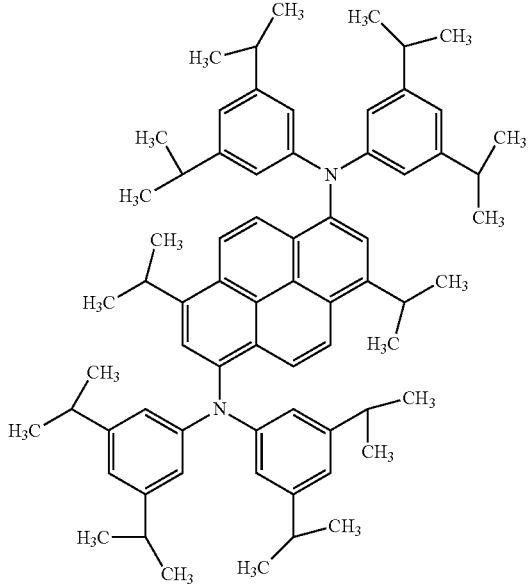
(243)

-continued
(244)
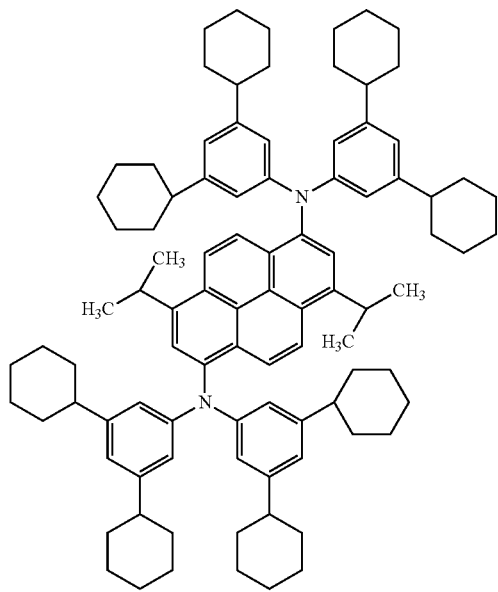
(245)
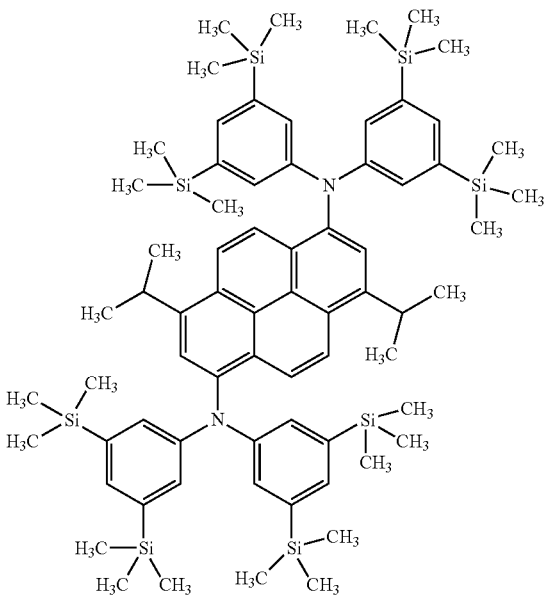
[Chemical Formula 17]
(246)
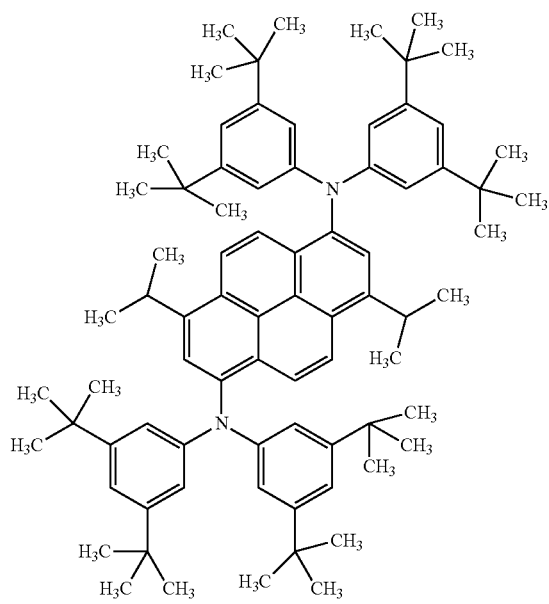
(247)
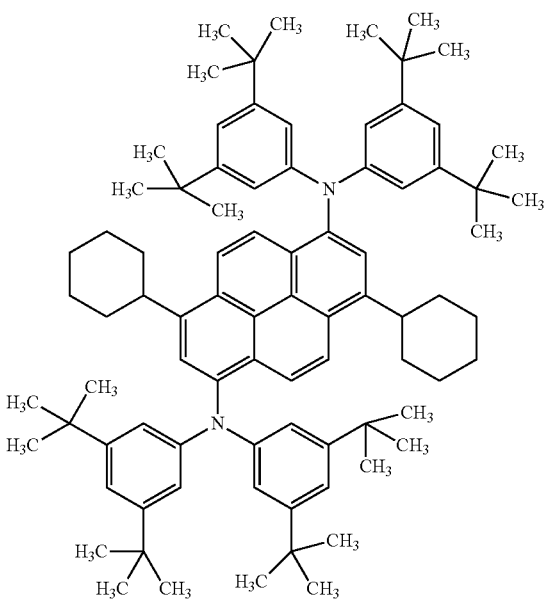

(248)
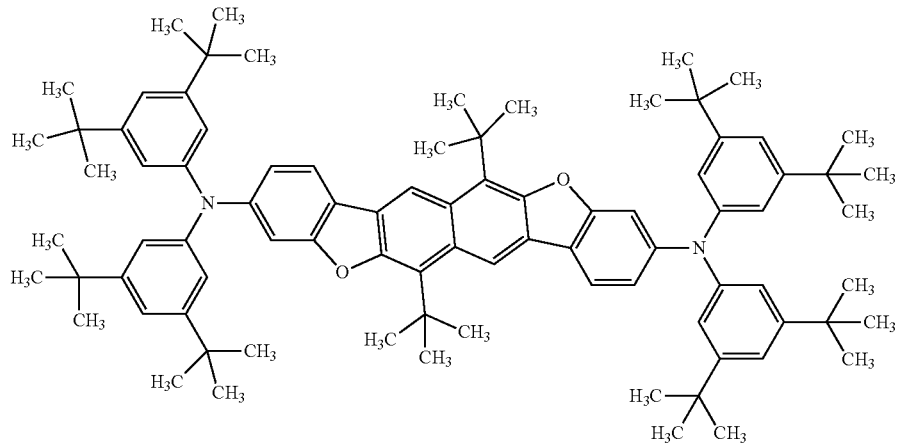
(249)
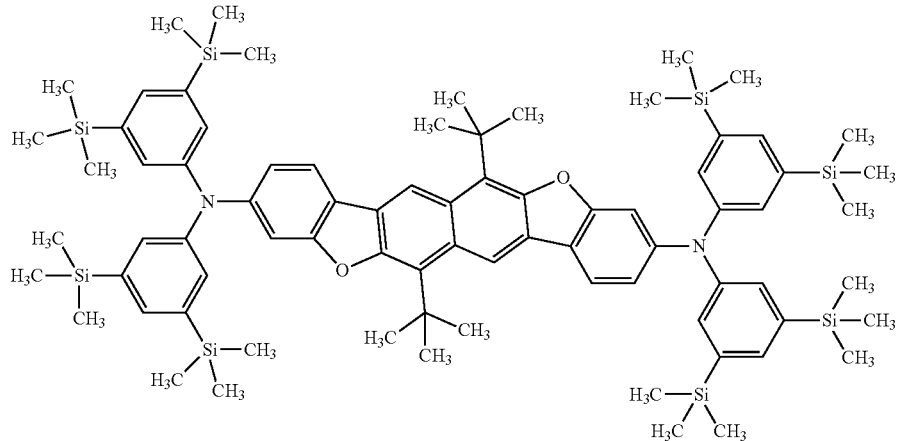
[Chemical Formula 18]
(250)
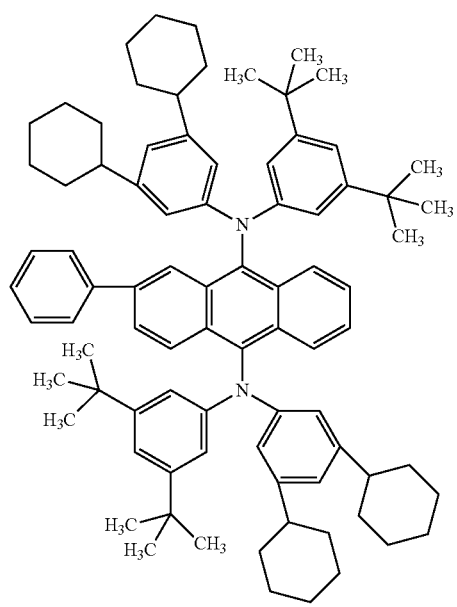
(251)
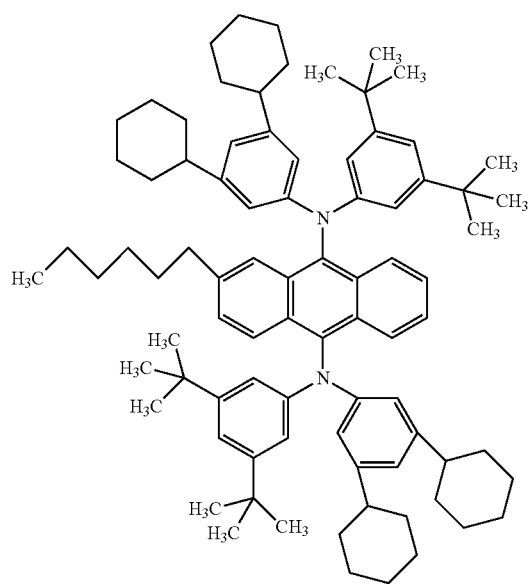

71 72
-continued
(252)
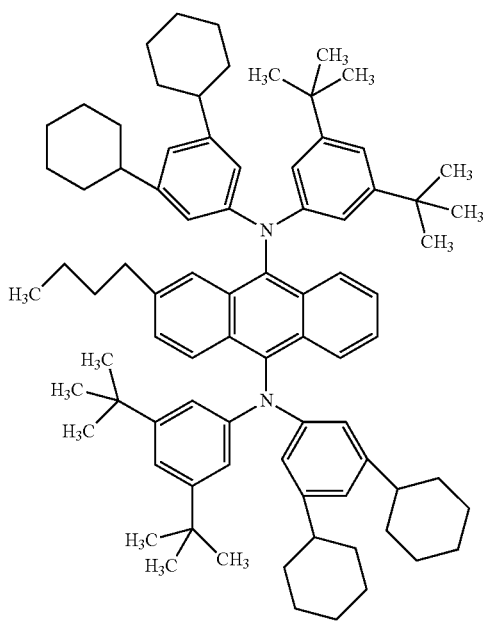
(253)
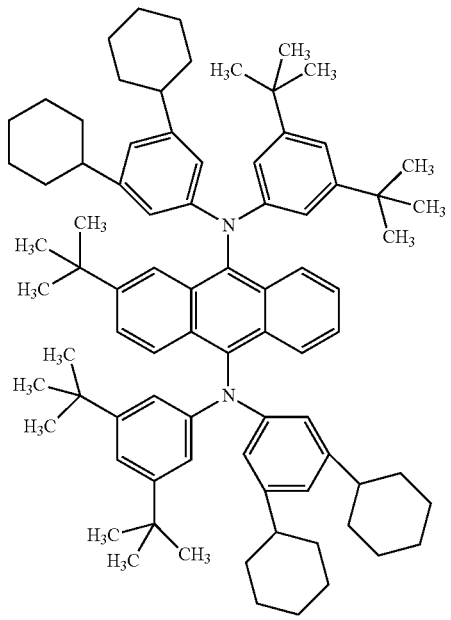
[Chemical Formula 19]
(254)
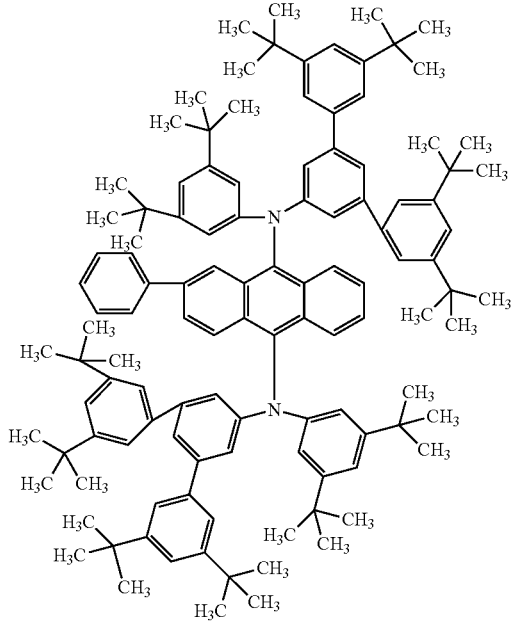
(255)
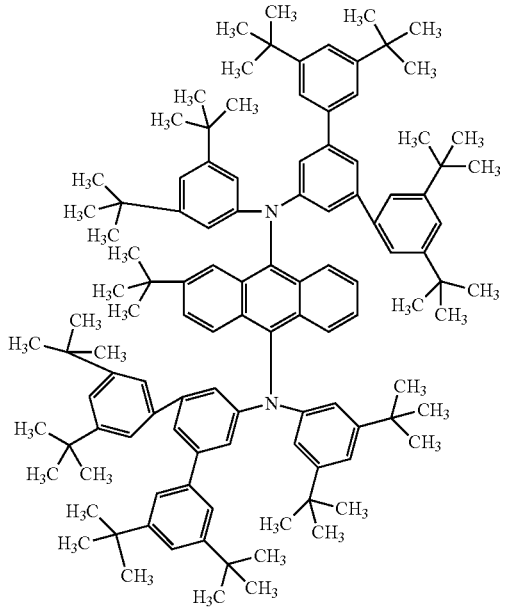

(256)
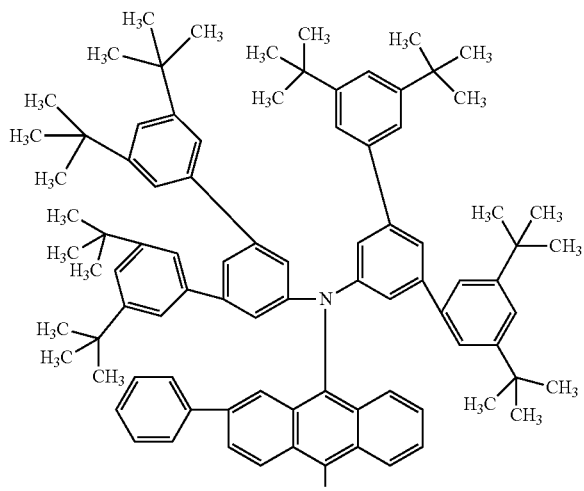
[Chemical Formula 20]
(257)
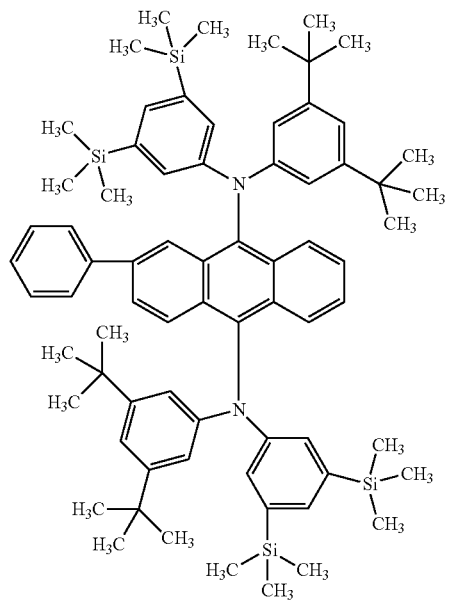
(258)
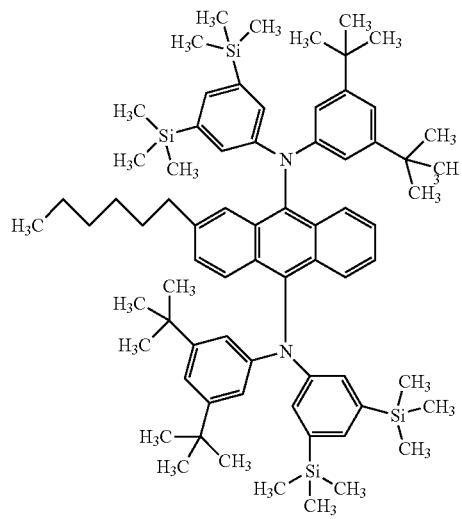

-continued
(259)
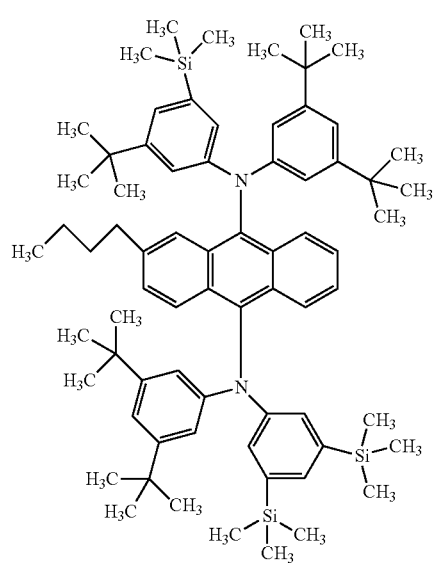
(260)
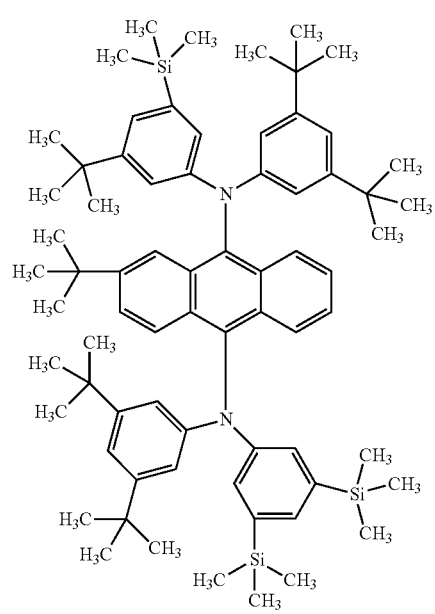
[Chemical Formula 21]
(261)
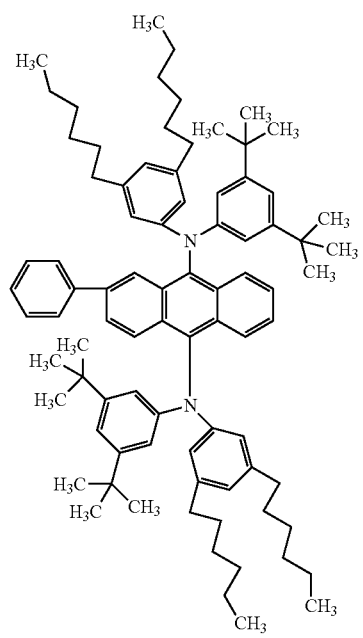
(262)
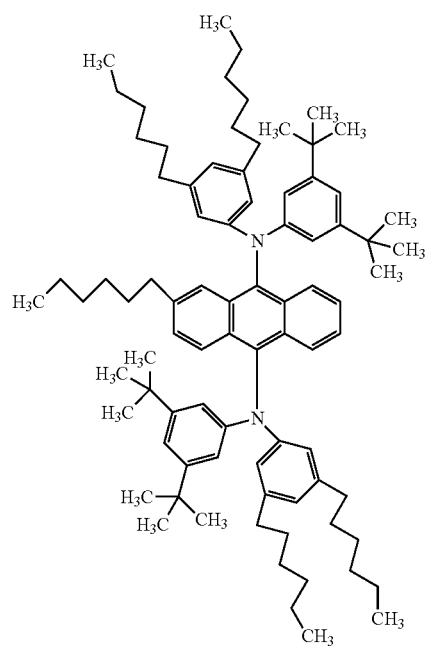

-continued
(262)
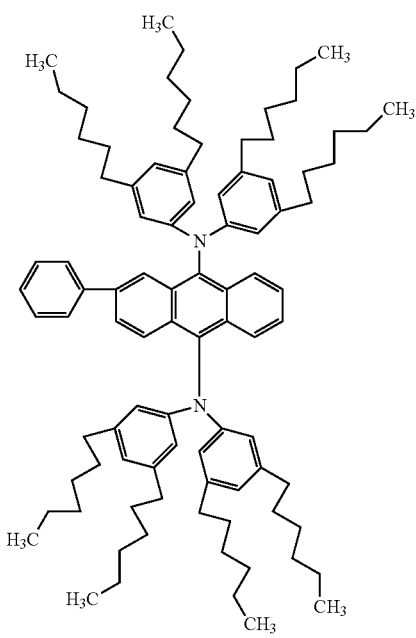
(263)
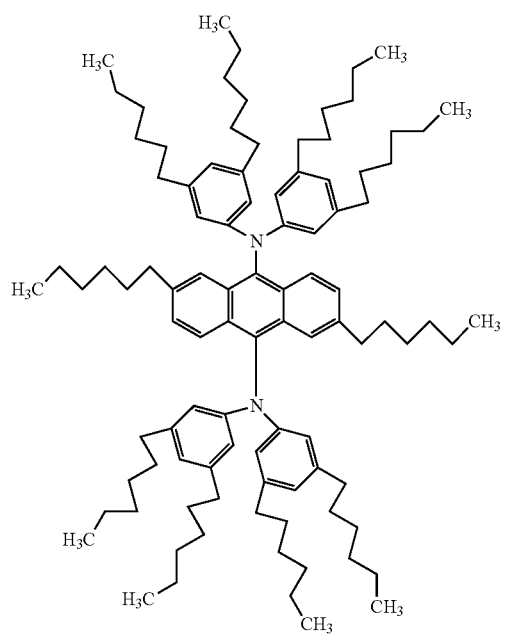
[Chemical Formula 22]
(264)
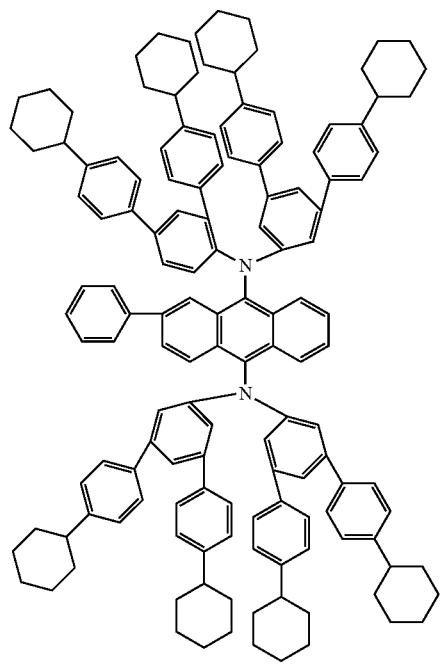
(265)
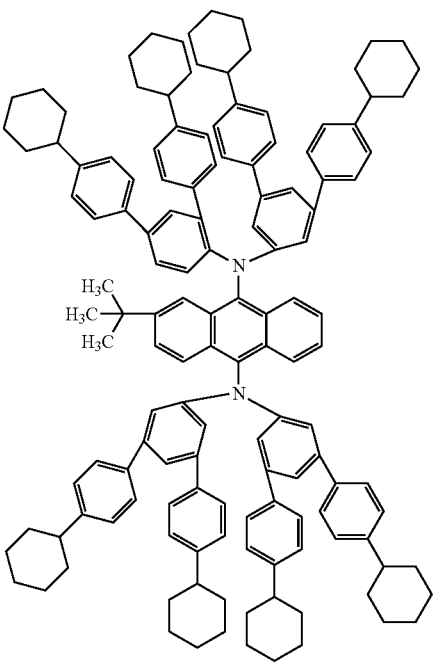

79 80
-continued
(267)
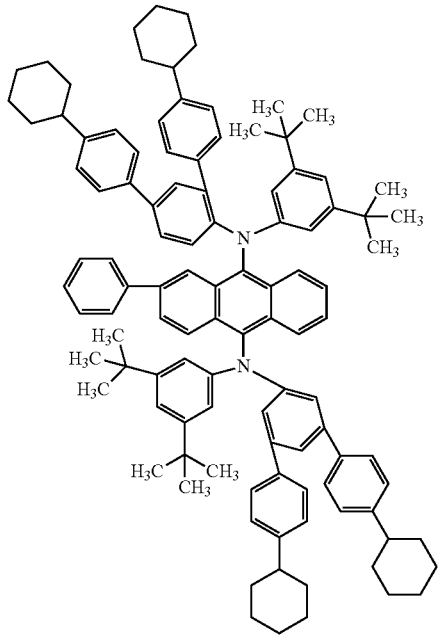
(268)
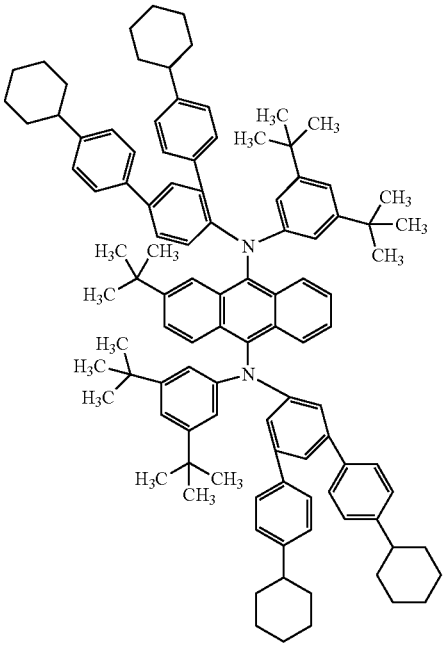
[Chemical Formula 23]
(269)
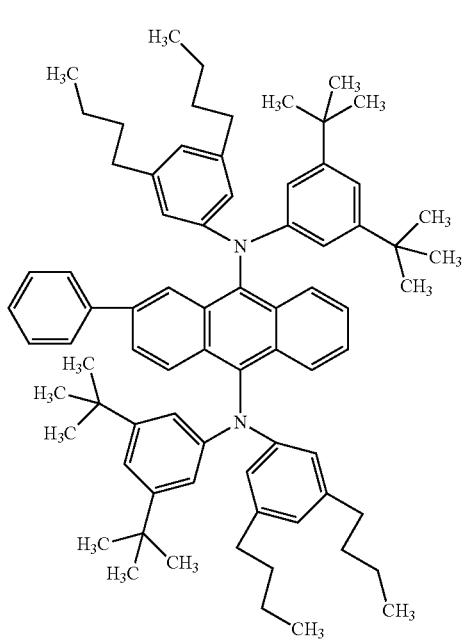
(270)
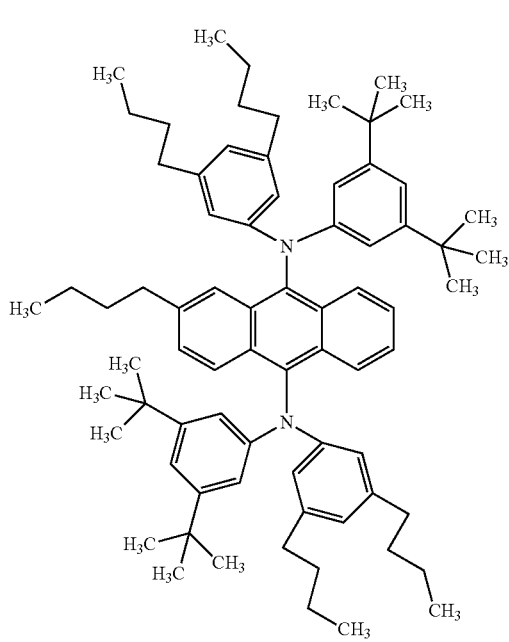

(271)
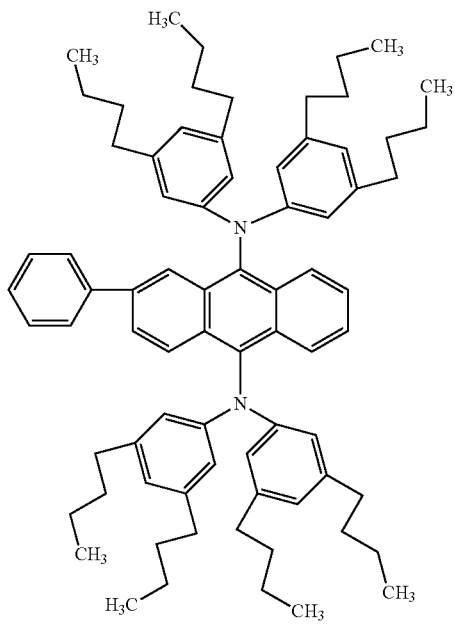
(272)
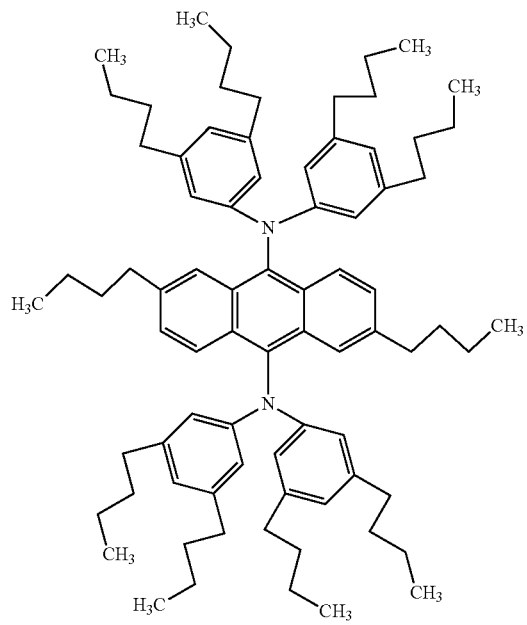
[Chemical Formula 24]
(273)
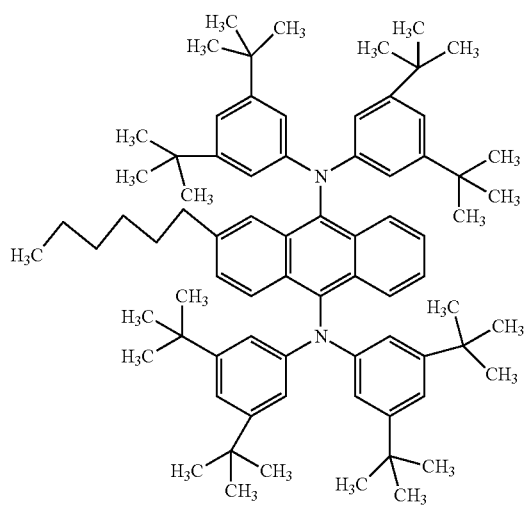
(274)
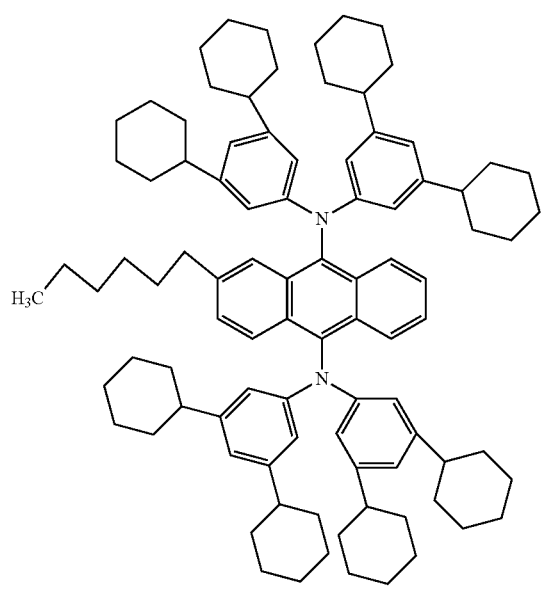

-continued
(275)
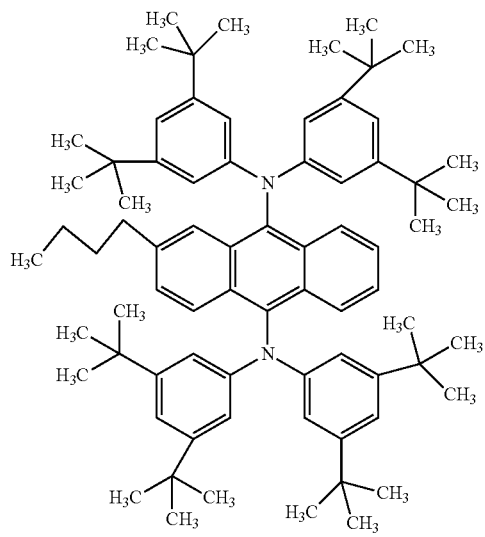
(276)
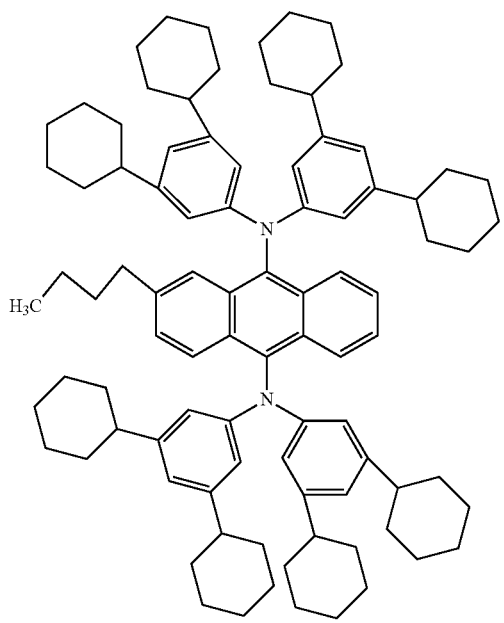
[Chemical Formula 25]
(277)
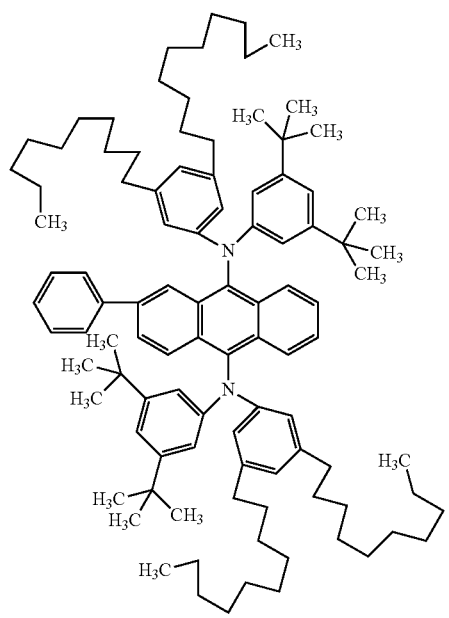
(278)
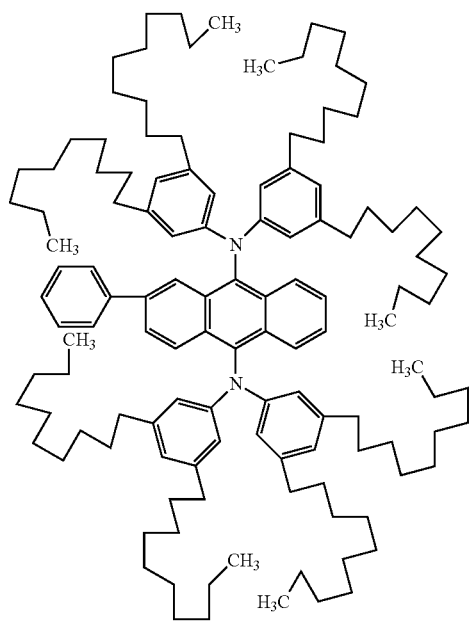

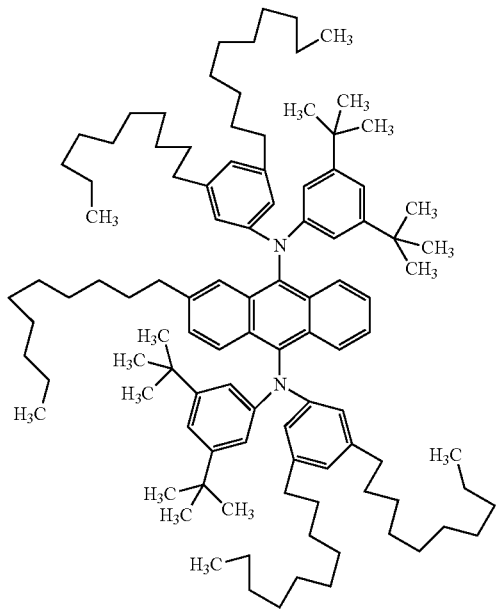
(279)
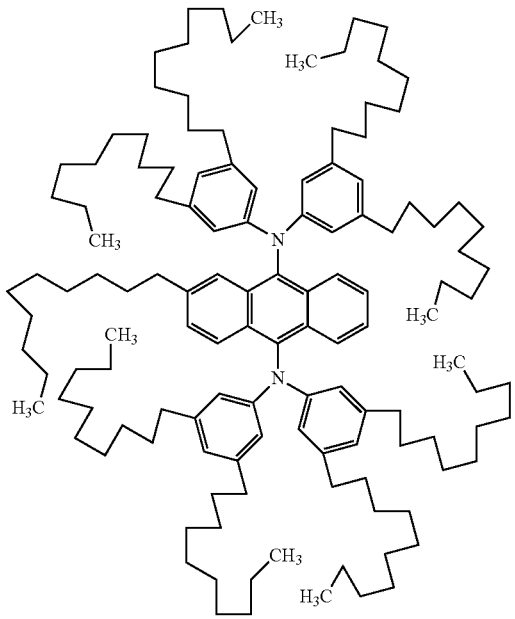
(280)
[Chemical Formula 26]
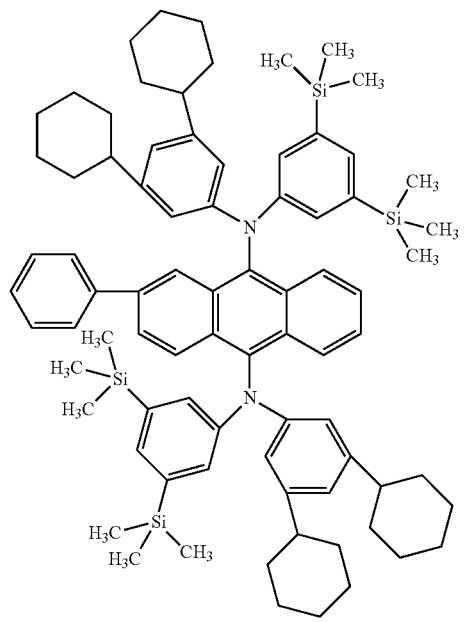
(281)
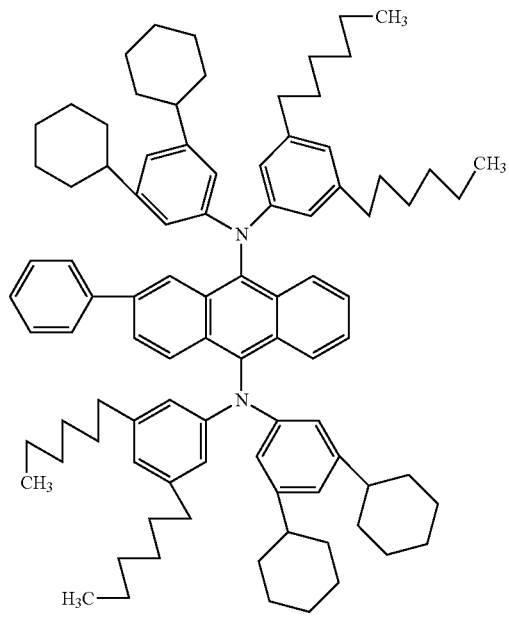
(282)

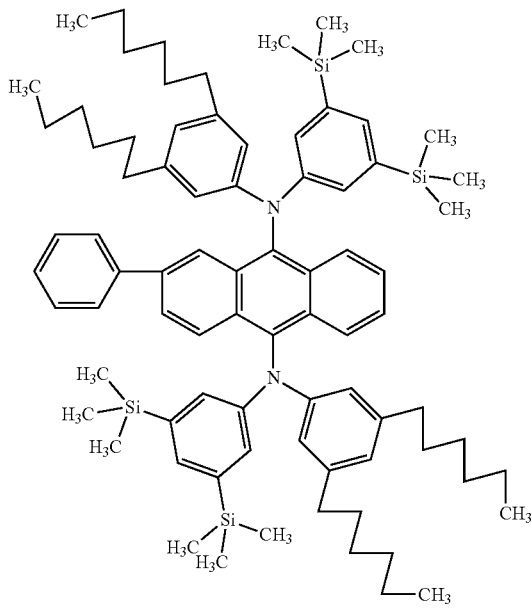

(283)

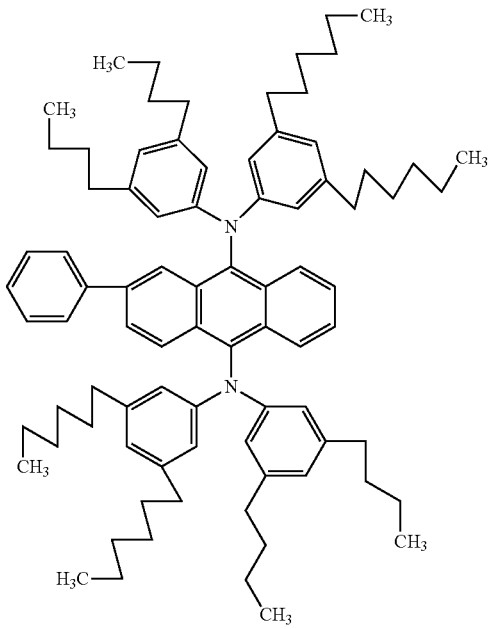

(284)

Examples of materials that can be suitably used as a fluorescent material of the light-emitting device of one embodiment of the present invention are shown by Structural Formulae (100) and (101). Note that the fluorescent material is not limited thereto.

[Chemical Formula 27]

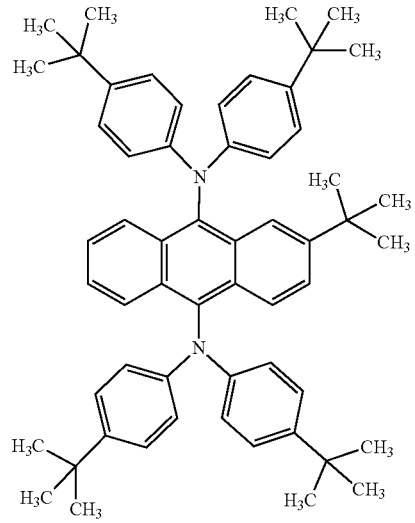

(100)

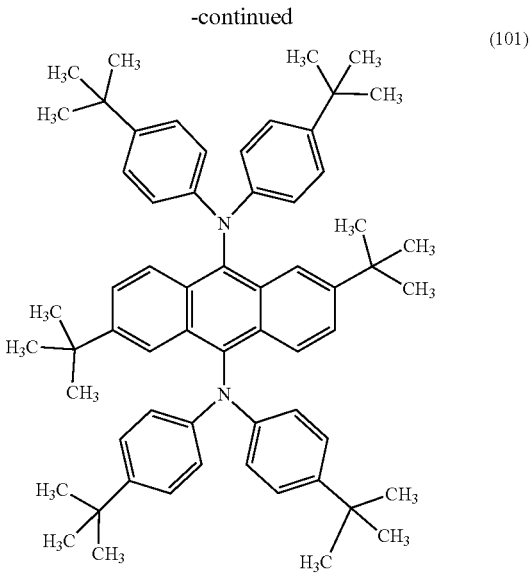

(101)

In the case where the compound 133 serves as an energy donor, a TADF material can be used, for example. The energy difference between the S1 level and the T1 level of the compound 133 is preferably small, specifically, greater than 0 eV and less than or equal to 0.2 eV.

In the case where the compound 133 is a TADF material, the compound 133 preferably has a skeleton with a hole-transport property and a skeleton with an electron-transport property. Alternatively, the compound 133 preferably has a π-electron rich skeleton or an aromatic amine skeleton, and a π-electron deficient skeleton. In that case, a donor-acceptor excited state is easily formed in a molecule. Furthermore, to improve both the donor property and the acceptor property in the molecule of the compound 133, the skeleton with an electron-transport property and the skeleton with a hole-transport property are preferably directly bonded to each other. Alternatively, the π-electron deficient skeleton is preferably directly bonded to the π-electron rich skeleton or the aromatic amine skeleton. By improving both the donor property and the acceptor property in the molecule, an overlap between a region where the HOMO is distributed and a region where the LUMO is distributed in the compound 133 can be small, and the energy difference between the singlet excitation energy level and the triplet excitation energy level of the compound 133 can be small. Moreover, the triplet excitation energy level of the compound 133 can be kept high.

In the case where a TADF material is composed of one kind of material, the following materials can be used, for example.

First, a fullerene, a derivative thereof, an acridine derivative such as proflavine, eosin, and the like can be given. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

-continued

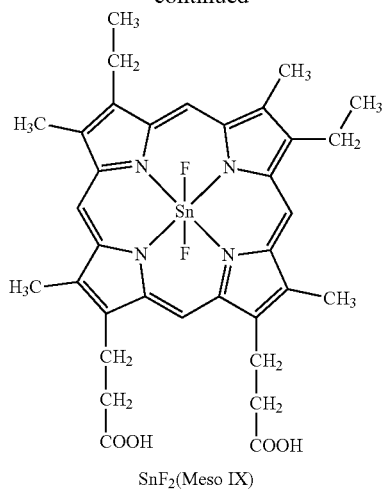

$SnF_2$(Meso IX)

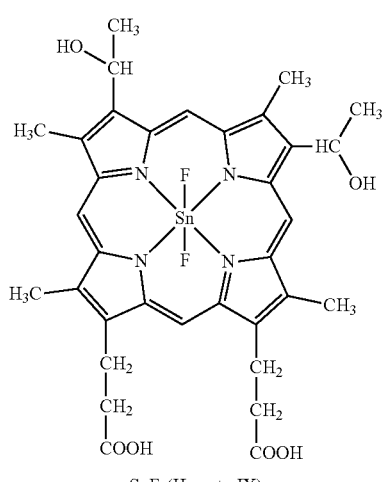

$SnF_2$(Hemato IX)

[Chemical Formula 28]

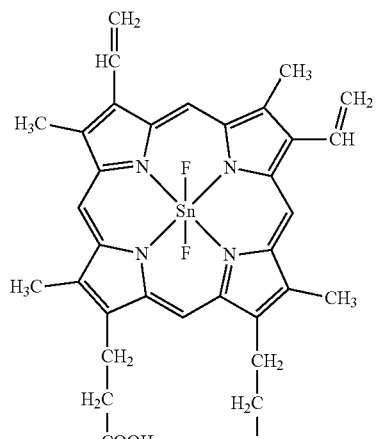

$SnF_2$(Proto IX)

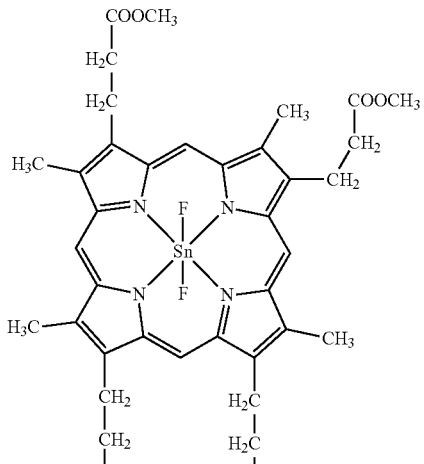

$SnF_2$(Copro III-4Me)

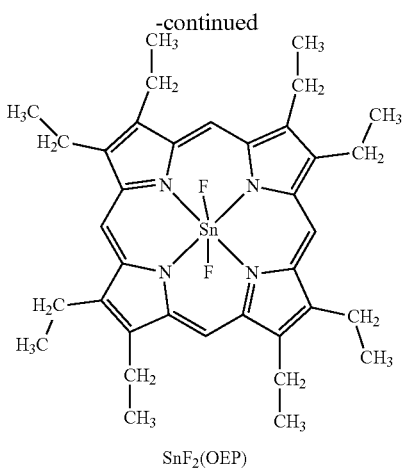

SnF₂(OEP)

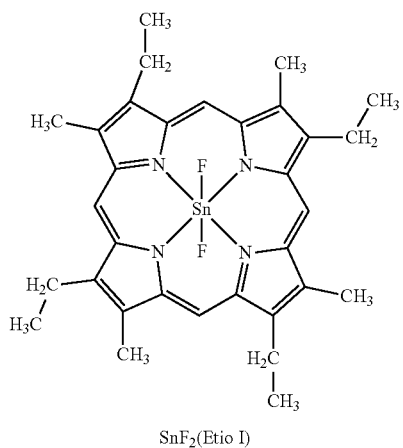

SnF₂(Etio I)

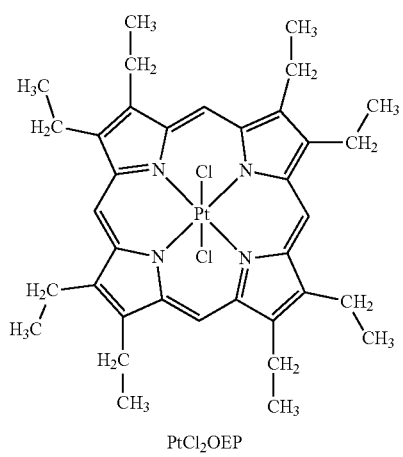

PtCl₂OEP

As a thermally activated delayed fluorescent material composed of one kind of material, a heterocyclic compound having one or both of a π-electron rich skeleton and a π-electron deficient skeleton can also be used. Specific examples include 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), 4-(9'-phenyl-3,3'-bi-9H-carbazol-9-yl)benzofuro[3,2-d]pyrimidine (abbreviation: 4PCCzBfpm), 4-[4-(9'-phenyl-3,3'-bi-9H-carbazol-9-yl)phenyl]benzofuro[3,2-d]pyrimidine (abbreviation: 4PCCzPBfpm), or 9-[3-(4,6-diphenyl-1,3,5-triazin-2-yl)phenyl]-9'-phenyl-2,3'-bi-9H-carbazole (abbreviation: mPCCzPTzn-02). The heterocyclic compound is preferable because of its high electron-transport property and hole-transport property due to the π-electron rich heteroaromatic ring and the π-electron deficient heteroaromatic ring contained therein. Among skeletons having a π-electron deficient heteroaromatic ring, a pyridine skeleton, a diazine skeleton (a pyrimidine skeleton, a pyrazine skeleton, or a pyridazine skeleton), and a triazine skeleton are particularly preferable because of their high stability and reliability. In particular, a benzofuropyrimidine skeleton, a benzothienopyrimidine skeleton, a benzofuropyrazine skeleton, and a benzothienopyrazine skeleton are preferable because of their high acceptor property and reliability. Among skeletons having a π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. Note that a dibenzofuran skeleton and a dibenzothiophene skeleton are preferable as the furan skeleton and the thiophene skeleton, respectively. Furthermore, as a pyrrole skeleton, an indole skeleton, a carbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferable because the donor property of the π-electron rich heteroaromatic ring and the acceptor property of the π-electron deficient heteroaromatic ring are both improved and the difference between the level of the singlet excited state and the level of the triplet excited state becomes small. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a boron-containing skeleton such as phenylborane or boranthrene, an aromatic ring or a heteroaromatic ring having a nitrile group or a cyano group, such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 29]
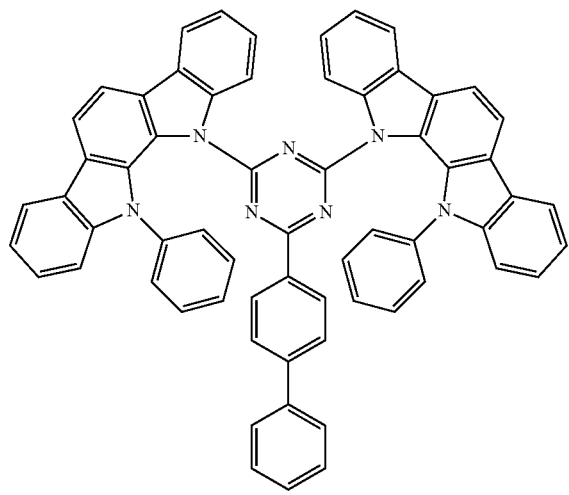
PIC-TRZ
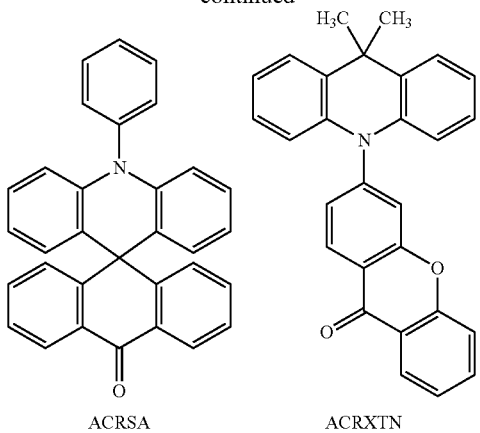
ACRSA　　ACRXTN
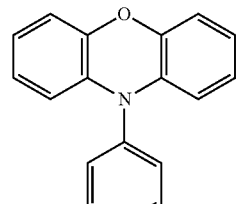
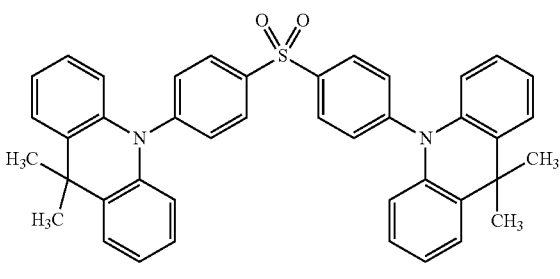
DMAC-DPS
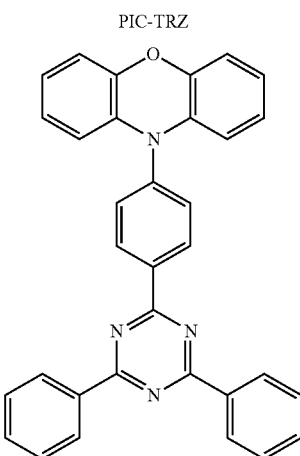
PXZ-TRZ
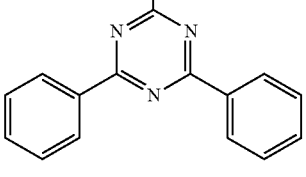
PPZ-3TPT
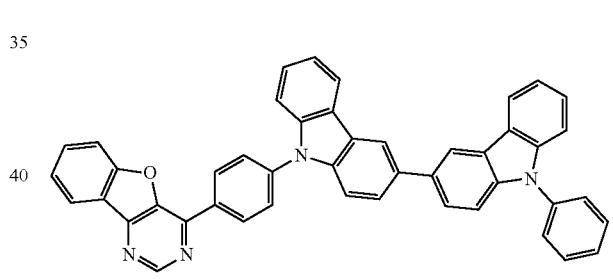
4PCCzPBfpm
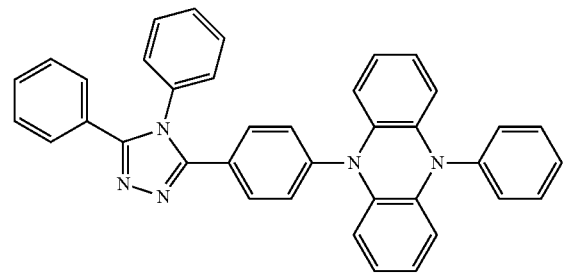
PCCzPTzn
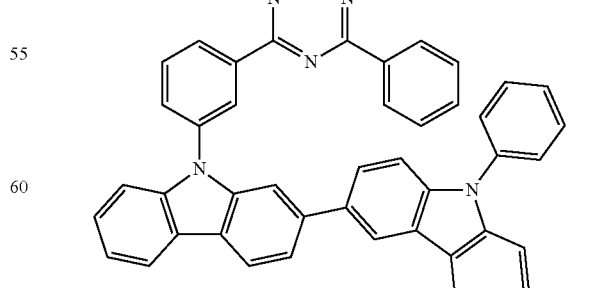
mPCCzPTzn-02

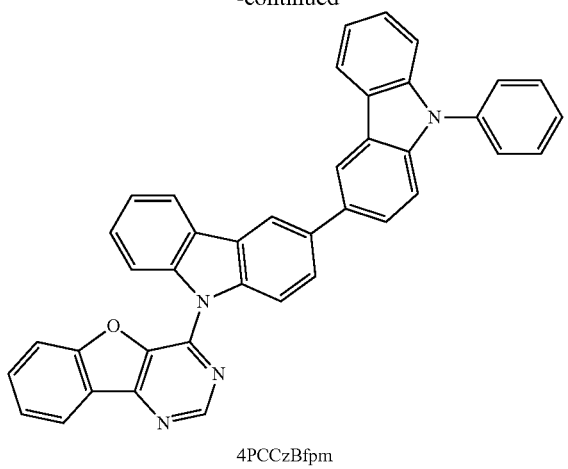

4PCCzBfpm

In the case where the compound 133 does not have a function of converting triplet excitation energy into light emission, a combination of the compound 131 and the compound 133 or the compound 131 and the compound 134 is preferably, but is not particularly limited to, a combination that forms an exciplex. It is preferable that one have a function of transporting electrons and the other have a function of transporting holes. It is also preferable that one have a π-electron deficient heteroaromatic ring and the other have a π-electron rich heteroaromatic ring.

Examples of the compound 131 include, in addition to zinc- and aluminum-based metal complexes, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, and a phenanthroline derivative. Other examples include an aromatic amine and a carbazole derivative.

In addition, the following hole-transport materials and electron-transport materials can be used.

A material having a property of transporting more holes than electrons can be used as the hole-transport material, and a material having a hole mobility of $1 \times 10^{-6}$ cm$^2$/Vs or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compound, which is a material having a high hole-transport property, include N,N'-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis{4-[bis(3-methylphenyl)amino]phenyl}-N,N-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B).

Specific examples of the carbazole derivative include 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Other examples of the carbazole derivative include 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon having a hole mobility of $1 \times 10^{-6}$ cm$^2$/Vs or higher and having 14 to 42 carbon atoms is particularly preferably used.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N-bis(4-butylphenyl)-N,N-bis(phenyl)benzidine] (abbreviation: Poly-TPD).

Examples of the material having a high hole-transport property include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H- carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N-diphenylbenzene-1,3-diamine (abbreviation: PCA2B), N,N,N''-triphenyl-N,N,N''-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl] fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N-bis[4-(carbazol-9-yl)phenyl]-N,N-diphenyl-9,9-dimethylfluorene-2,7-diamine (abbreviation: YGA2F). It is also possible to use an amine compound, a carbazole compound, a thiophene compound, a furan compound, a fluorene compound, a triphenylene compound, a phenanthrene compound, or the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 4-{3-[3-(9-phenyl-9H-fluoren-9-yl)phenyl]phenyl}dibenzofuran (abbreviation: mmDBFFLBi-II), 4,4',4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), or 4-[3-(triphenylen-2-yl)phenyl] dibenzothiophene (abbreviation: mDBTPTp-II). The substances given here are mainly substances having a hole mobility of $1\times10^{-6}$ cm$^2$/Vs or higher. However, other substances may also be used as long as they have a property of transporting more holes than electrons.

A material having a property of transporting more electrons than holes can be used as the electron-transport material, and a material having an electron mobility of $1\times10^{-6}$ cm$^2$/Vs or higher is preferable. A π-electron deficient heteroaromatic compound such as a nitrogen-containing heteroaromatic compound, a metal complex, or the like can be used as the material that easily accepts electrons (the material having an electron-transport property). Specific examples include metal complexes having a quinoline ligand, a benzoquinoline ligand, an oxazole ligand, and a thiazole ligand; an oxadiazole derivative; a triazole derivative; a phenanthroline derivative; a pyridine derivative; a bipyridine derivative; and a pyrimidine derivative.

Examples include metal complexes having a quinoline skeleton or a benzoquinoline skeleton, such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), bis(2-methyl-8-quinolinolato)(4-phenylphenolato) aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolato]zinc(II) (abbreviation: ZnPBO) or bis[2-(2-benzothiazolyl)phenolato]zinc(II) (abbreviation: ZnBTZ), or the like can be used. Furthermore, other than the metal complexes, it is possible to use a heterocyclic compound such as 2-(4-biphenylyl)-5-(4-tert-butylphenyl)-1,3,4-oxadiazole (abbreviation: PBD), 1,3-bis [5-(p-tert-butylphenyl)-1,3,4-oxadiazol-2-yl]benzene (abbreviation: OXD-7), 9-[4-(5-phenyl-1,3,4-oxadiazol-2-yl) phenyl]-9H-carbazole (abbreviation: CO11), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), 2,9-bis(naphthalen-2-yl)-4,7-diphenyl-1,10-phenanthroline (abbreviation: NBPhen), orbathocuproine (abbreviation: BCP); a heterocyclic compound having a diazine skeleton, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl) phenyl]dibenzo[f,h]quinoxaline (abbreviation: 7mDBTPDBq-II), 6-[3-(dibenzothiophen-4-yl)phenyl] dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl] pyrimidine (abbreviation: 4,6mDBTP2Pm-II), or 4,6-bis[3-(9H-carbazol-9-yl)phenyl]pyrimidine (abbreviation: 4,6mCzP2Pm); a heterocyclic compound having a triazine skeleton, such as 2-{4-[3-(N-phenyl-9H-carbazol-3-yl)-9H-carbazol-9-yl]phenyl}-4,6-diphenyl-1,3,5-triazine (abbreviation: PCCzPTzn); a heterocyclic compound having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); or a heteroaromatic compound such as 4,4'-bis(5-methylbenzoxazol-2-yl)stilbene (abbreviation: BzOs). Furthermore, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ cm$^2$/Vs or higher. Note that other substances may also be used as long as their electron-transport properties are higher than their hole-transport properties.

As the compound 133 or the compound 134, a material that can form an exciplex together with the compound 131 is preferably used. Specifically, the hole-transport materials and electron-transport materials given above can be used. In that case, it is preferable that the compound 131 and the compound 133, the compound 131 and the compound 134, and the compound 132 (fluorescent material) be selected such that the emission peak of the exciplex formed by the compound 131 and the compound 133 or the compound 131 and the compound 134 overlaps with an absorption band on the longest wavelength side (low energy side) of the compound 132 (fluorescent material). This makes it possible to provide a light-emitting device with drastically improved emission efficiency.

A phosphorescent material can be used as the compound 133. Examples of the phosphorescent material include an iridium-, rhodium-, or platinum-based organometallic complex and metal complex. Another example is a platinum complex or organoiridium complex having a porphyrin ligand; in particular, an organoiridium complex such as an iridium-based ortho-metalated complex is preferable, for example. Examples of an ortho-metalated ligand include a 4H-triazole ligand, a 1H-triazole ligand, an imidazole ligand, a pyridine ligand, a pyrimidine ligand, a pyrazine ligand, and an isoquinoline ligand. In that case, the compound 133 (phosphorescent material) has an absorption band of triplet MLCT (Metal to Ligand Charge Transfer) transition. It is preferable that the compound 133 and the compound 132 (fluorescent material) be selected such that the emission peak of the compound 133 overlaps with an absorption band on the longest wavelength side (low energy side) of the compound 132 (fluorescent material). This makes it possible to provide a light-emitting device with drastically improved emission efficiency. Even in the case where the compound 133 is a phosphorescent material, it may form an exciplex together with the compound 131. When an exciplex is formed, the phosphorescent compound does not need to emit light at room temperature and emits light at room temperature after an exciplex is formed. In this case, for example, Ir(ppz)$_3$ or the like can be used as the phosphorescent compound.

Examples of the substance having an emission peak in blue or green include an organometallic iridium complex having a 4H-triazole skeleton, such as tris{2-[5-(2-methylphenyl)-4-(2,6-dimethylphenyl)-4H-1,2,4-triazol-3-yl-κN$^2$]phenyl-κC}iridium(III) (abbreviation: Ir(mpptz-dmp)$_3$), tris(5-methyl-3,4-diphenyl-4H-1,2,4-triazolato) iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), or tris[3-(5-biphenyl)-5-isopropyl-4-phenyl-4H-1,2,4-triazolato]iridium(III) (abbreviation: Ir(iPr5btz)$_3$); an organometallic iridium complex having a 1H-triazole skeleton, such as tris[3-methyl-1-(2-methylphenyl)-5-phenyl-1H-1,2,4-triazolato]iridium(III) (abbreviation: Ir(Mptz1-mp)$_3$) or tris(1-methyl-5-phenyl-3-propyl-1H-1,2,4-triazolato)iridium(III) (abbreviation: Ir(Prptz1-Me)$_3$); an organometallic iridium complex having an imidazole skeleton, such as fac-tris[1-(2,6-diisopropylphenyl)-2-phenyl-1H-imidazole]iridium(III) (abbreviation: Ir(iPrpmi)$_3$) or tris[3-(2,6-dimethylphenyl)-7-methylimidazo[1,2-f]phenanthridinato]iridium(III) (abbreviation: Ir(dmpimpt-Me)$_3$); and an organometallic iridium complex in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis{2-[3',5'-bis(trifluoromethyl)phenyl]pyridinato-N,C$^{2'}$}iridium(III) picolinate (abbreviation: Ir(CF$_3$ppy)$_2$(pic)), or bis[2-(4',6'-difluorophenyl)pyridinato-N,C$^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton, have high triplet excitation energy, reliability, and emission efficiency and are thus especially preferable.

Examples of the substance having an emission peak in green or yellow include an organometallic iridium complex having a pyrimidine skeleton, such as tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato) iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium (III) (abbreviation: Ir(mpmppm)$_2$(acac)), (acetylacetonato) bis{4,6-dimethyl-2-[6-(2,6-dimethylphenyl)-4-pyrimidinyl-cN3]phenyl-κC}iridium(III) (abbreviation: Ir(dmppm-dmp)$_2$(acac)), or (acetylacetonato)bis(4,6-diphenylpyrimidinato)iridium(III) (abbreviation: Ir(dppm)$_2$(acac)); an organometallic iridium complex having a pyrazine skeleton, such as (acetylacetonato)bis(3,5-dimethyl-2-phenylpyrazinato)iridium(III) (abbreviation: Ir(mppr-Me)$_2$(acac)) or (acetylacetonato)bis(5-isopropyl-3-methyl-2-phenylpyrazinato)iridium(III) (abbreviation: Ir(mppr-iPr)$_2$(acac)); an organometallic iridium complex having a pyridine skeleton, such as tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium (III) (abbreviation: Ir(pq)$_3$), or bis(2-phenylquinolinato-N,C$^{2'}$)iridium(III) acetylacetonate (abbreviation: Ir(pq)$_2$(acac)); an organometallic iridium complex such as bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), and bis(2-phenylbenzothiazolato-N,C$^{2'}$)iridium(III) acetylacetonate (abbreviation: Ir(bt)$_2$(acac)); and a rare earth metal complex such as tris(acetylacetonato)(monophenanthroline)terbium(III) (abbreviation: Tb(acac)$_3$(Phen)). Among the substances given above, the organometallic iridium complexes having a pyrimidine skeleton have distinctively high reliability and light emission efficiency and are thus particularly preferable.

Examples of the substance that has an emission peak in yellow or red include an organometallic iridium complex having a pyrimidine skeleton, such as (diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), or bis[4,6-di(naphthalen-1-yl)pyrimidinato](dipivaloylmethanato)iridium(III) (abbreviation: Ir(d1npm)$_2$(dpm)); an organometallic iridium complex having a pyrazine skeleton, such as (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), or (acetylacetonato)bis[2,3-bis(4-fluorophenyl)quinoxalinato]iridium(III) (abbreviation: Ir(Fdpq)$_2$(acac)); an organometallic iridium complex having a pyridine skeleton, such as tris(1-phenylisoquinolinato-N,C'')iridium(III) (abbreviation: Ir(piq)$_3$) or bis(1-phenylisoquinolinato-N,C$^{2'}$)iridium (III) acetylacetonate (abbreviation: Ir(piq)$_2$(acac)); a platinum complex such as 2,3,7,8,12,13,17,18-octaethyl-21H,23H-porphyrin platinum(II) (abbreviation: PtOEP); and a rare earth metal complex such as tris(1,3-diphenyl-1,3-propanedionato) (monophenanthroline)europium(III) (abbreviation: Eu(DBM)$_3$(Phen)) or tris[1-(2-thenoyl)-3,3,3-trifluoroacetonato] (monophenanthroline)europium(III) (abbreviation: Eu(TTA)$_3$(Phen)). Among the substances given above, the organometallic iridium complexes having a pyrimidine skeleton have distinctively high reliability and light emission efficiency and are thus particularly preferable. Furthermore, the organometallic iridium complexes having a pyrazine skeleton can provide red light emission with favorable chromaticity.

Examples of a material that can be used as the above-described energy donor include metal-halide perovskites. The metal-halide perovskites can be represented by any of General Formulae (g1) to (g3) shown below.

$$(SA)MX_3: \quad (g1)$$

$$(LA)_2(SA)_{n-1}M_nX_{3n+1}: \quad (g2)$$

$$(PA)(SA)_{n-1}M_nX3_{n+1}: \quad (g3)$$

In the above general formulae, M represents a divalent metal ion, and X represents a halogen ion.

As the divalent metal ion, specifically, a divalent cation of lead, tin, or the like is used.

As the halogen ion, specifically, an anion of chlorine, bromine, iodine, fluorine, or the like is used.

Note that n represents an integer of 1 to 10. In the case where n is larger than 10 in General Formula (g2) or General Formula (g3), the properties are close to those of the metal-halide perovskite represented by General Formula (g1).

In addition, LA represents an ammonium ion represented by $R^{30}$—$NH_3^+$.

In the ammonium ion represented by the general formula $R^{30}$—$NH_3^+$, $R^{30}$ represents any one of an alkyl group, an aryl group, and a heteroaryl group each having 2 to 20 carbon atoms, or a group in which any one of an alkyl group, an aryl group, and a heteroaryl group each having 2 to 20 carbon atoms is combined with an alkylene group and a vinylene group each having 1 to 12 carbon atoms and an arylene group and a heteroarylene group each having 6 to 13 carbon atoms; in the latter case, a plurality of alkylene groups, arylene groups, and heteroarylene groups may be coupled, and a plurality of groups of the same kind may be used. In the case where a plurality of alkylene groups, vinylene groups, arylene groups, and heteroarylene groups are coupled, the total number of alkylene groups, vinylene groups, arylene groups, and heteroarylene groups is preferably smaller than or equal to 35.

Furthermore, SA represents a monovalent metal ion or an ammonium ion represented by $R^{31}$—$NH_3^+$ in which $R^{31}$ is an alkyl group having 1 to 6 carbon atoms.

Moreover, PA represents $NH_3^+$—$R^{32}$—$NH_3^+$, $NH_3^+$—$R^{33}$—$R^{34}$—$R^{35}$—$NH_3^+$, or a part or whole of branched polyethyleneimine including ammonium cations, and the valence of this portion is +2. Note that charges are roughly in balance in the general formula.

Here, charges of the metal-halide perovskite are not necessarily in balance strictly in every portion of the material in the above formula as long as the neutrality is roughly maintained in the material as a whole. In some cases, other ions such as a free ammonium ion, a free halogen ion, or an impurity ion exist locally in the material and neutralize the charges. In addition, in some cases, the neutrality is not maintained locally also at a surface of a particle or a film, a crystal grain boundary, or the like; thus, the neutrality is not necessarily maintained in every location.

Note that in the above formula (g2), any of substances represented by General Formulae (a-1) to (a-11) and General Formulae (b-1) to (b-6) shown below, for example, can be used as (LA).

[Chemical Formula 30]

(a-1)

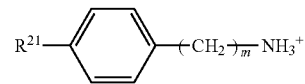
(a-2)

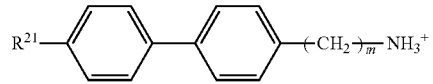
(a-3)

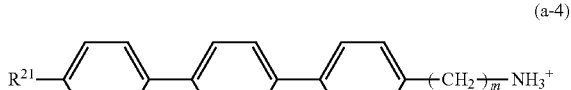
(a-4)

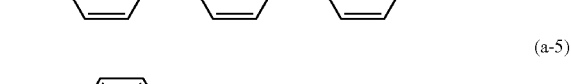
(a-5)

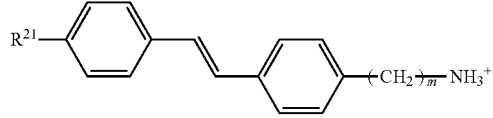
(a-6)

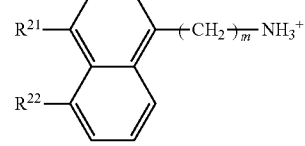
(a-7)

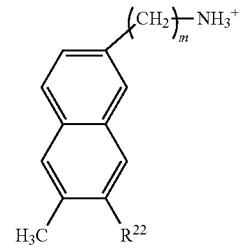
(a-8)

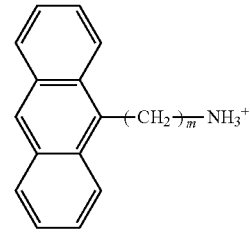
(a-9)

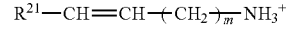
(a-10)

(a-11)

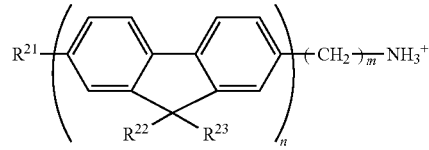

[Chemical Formula 31]

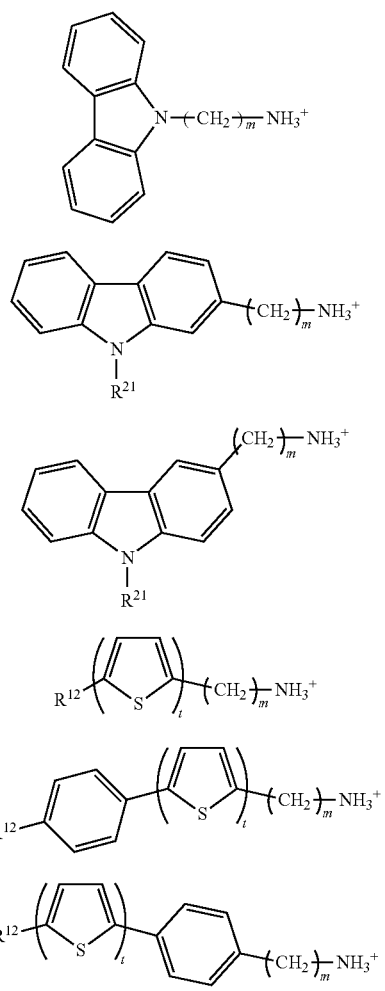

(b-1)
(b-2)
(b-3)
(b-4)
(b-5)
(b-6)

Furthermore, (PA) in General Formula (g3) shown above typically represents any of substances represented by General Formulae (c-1), (c-2), and (d) shown below or a part or whole of branched polyethyleneimine including ammonium cations, and has a valence of +2. These polymers may neutralize charges over a plurality of unit cells; alternatively, one charge of each of two different polymer molecules may neutralize charges of one unit cell.

[Chemical Formula 32]

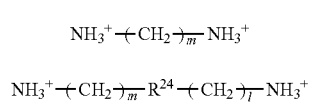

(c-1)

(c-2)

[Chemical Formula 33]

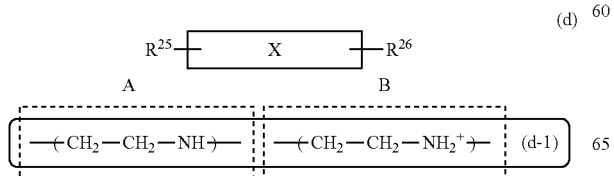

(d)

(d-1)

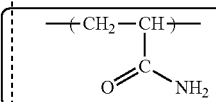
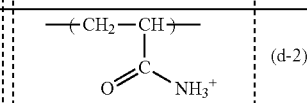

(d-2)

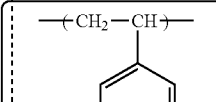
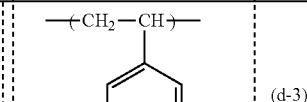

(d-3)

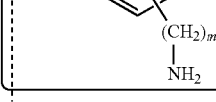
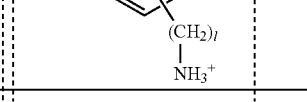

(d-4)

(d-5)

(d-6)

Note that in the above general formulae, $R^{20}$ represents an alkyl group having 2 to 18 carbon atoms, $R^{21}$, $R^{22}$, and $R^{23}$ represent hydrogen or an alkyl group having 1 to 18 carbon atoms, and $R^{24}$ represents any of Structural Formulae and General Formulae ($R^{24}$-1) to ($R^{24}$-14) shown below. Furthermore, $R^{25}$ and $R^{26}$ each independently represent hydrogen or an alkyl group having 1 to 6 carbon atoms. In addition, X has a combination of monomer units A and B represented by any of (d-1) to (d-6) shown above, and represents a structure including u A and v B. Note that the arrangement order of A and B is not limited. Furthermore, m and l are each independently an integer of 0 to 12, and t is an integer of 1 to 18. In addition, u is an integer of 0 to 17, v is an integer of 1 to 18, and u+v is an integer of 1 to 18.

[Chemical Formula 34]

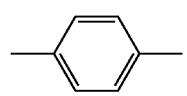

($R^{24}$-1)

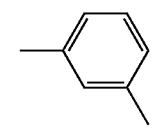

($R^{24}$-2)

(R24-3) 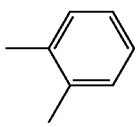

(R24-4) 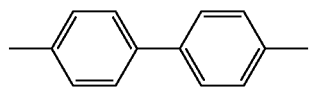

(R24-5) 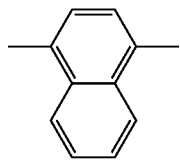

(R24-6) 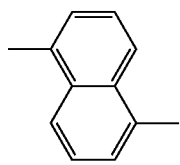

(R24-7) 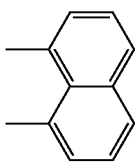

(R24-8) 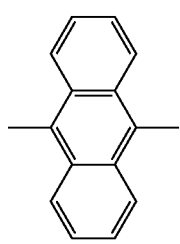

(R24-9) 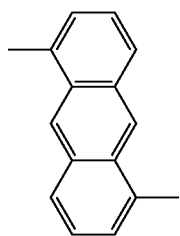

(R24-10) 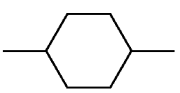

(R24-11) 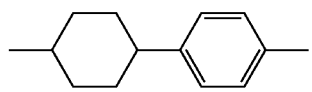

(R24-12) 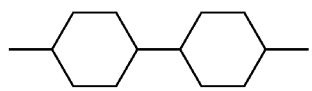

(R24-13) 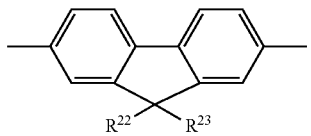

(R24-14) 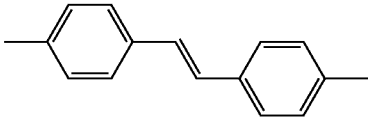

Note that these are examples, and the substances that can be used as (LA) and (PA) are not limited thereto.

In the metal-halide perovskite having a three-dimensional structure including the composition $(SA)MX_3$ represented by General Formula (g1), regular octahedral structures in each of which a metal atom M is placed at the center and halogen atoms are placed at six vertexes are three-dimensionally arranged by sharing the halogen atoms at the vertexes, so that a skeleton is formed. This regular octahedral structure unit including a halogen atom at each vertex is referred to as a perovskite unit. There are a zero-dimensional structure body in which a perovskite unit exists in isolation, a linear structure body in which perovskite units are one-dimensionally coupled with a halogen atom at the vertex, a sheet-shaped structure body in which perovskite units are two-dimensionally coupled, a structure body in which perovskite units are three-dimensionally coupled, and a complicated two-dimensional structure body formed of a stack of a plurality of sheet-shaped structure bodies in each of which perovskite units are two-dimensionally coupled. Furthermore, there is a more complicated structure body. All of these structure bodies having a perovskite unit are collectively defined as a metal-halide perovskite.

The light-emitting layer 130a can be formed of two or more layers. For example, in the case where the light-emitting layer 130a is formed by stacking a first light-emitting layer and a second light-emitting layer in this order from the hole-transport layer side, a substance having a hole-transport property is used as the host material of the first light-emitting layer and a substance having an electron-transport property is used as the host material of the second light-emitting layer.

The light-emitting layer 130a may contain a material (a compound 135) in addition to the compound 131, the compound 132, the compound 133, and the compound 134. In that case, in order for the compound 131 and the compound 133 (or the compound 134) to efficiently form an exciplex, it is preferable that the HOMO level of one of the compound 131 and the compound 133 (or the compound 134) be the highest HOMO level of the materials in the light-emitting layer 130a and that the LUMO level of the other be the lowest LUMO level of the materials in the light-emitting layer 130a. With such an energy level correlation, the reaction for forming an exciplex by the compound 131 and the compound 135 can be inhibited.

In the case where, for example, the compound 131 has a hole-transport property and the compound 133 (or the compound 134) has an electron-transport property, the HOMO level of the compound 131 is preferably higher than the HOMO level of the compound 133 and the HOMO level of the compound 135, and the LUMO level of the compound 133 is preferably lower than the LUMO level of the compound 131 and the LUMO level of the compound 135. In this case, the LUMO level of the compound 135 may be higher or lower than the LUMO level of the compound 131. Furthermore, the HOMO level of the compound 135 may be higher or lower than the HOMO level of the compound 133.

Examples of the material (the compound 135) that can be used for the light-emitting layer 130a are, but not particularly limited to, metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2', 2"-(1, 3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). Condensed polycyclic aromatic compounds such as anthracene derivatives, phenanthrene derivatives, pyrene derivatives, chrysene derivatives, and dibenzo[g,p]chrysene derivatives are also given; specific examples include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 6,12-dimethoxy-5,11-diphenylchrysene, N,N,N',N',N'',N'', N''',N'''-octaphenyldibenzo[g,p]chrysene-2,7,10,15-tetraamine (abbreviation: DBC1), 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the compound 131 and the compound 132 are selected from these substances and known substances.

<<Light-Emitting Layer 130b>>

In the light-emitting layer 130b of the light-emitting device of one embodiment of the present invention, a host material and a guest material having a function of converting triplet excitation energy into light emission are used. As the guest material (the compound 136 and the compound 136_p), a TADF material, an exciplex, and a phosphorescent material are given; the TADF material and the phosphorescent material are preferable and the phosphorescent material is further preferable. Specifically, it is possible to use the TADF material and the phosphorescent material that can be used as an energy donor of the light-emitting layer 130a.

As the host material (the compound 135 and the compound 135_p) of the light-emitting layer 130b, the aforementioned hole-transport material or electron-transport material can be used. A material having a property of transporting more holes than electrons can be used as the hole-transport material, and a material having a hole mobility of $1\times10^{-6}$ cm$^2$/Vs or higher is preferable. Specifically, the aromatic amines and the carbazole derivatives given as the hole-transport material that can be used for the light-emitting layer 130a can be used. A material having a property of transporting more electrons than holes can be used as the electron-transport material, and a material having an electron mobility of $1\times10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specifically, the metal complex having a quinoline ligand, a benzoquinoline ligand, an oxazole ligand, or a thiazole ligand, which is given as the electron-transport material that can be used for the light-emitting layer 130a, can be given. Furthermore, an oxadiazole derivative, a triazole derivative, a phenanthroline derivative, a pyridine derivative, a bipyridine derivative, a pyrimidine derivative, and the like can be given. A substance having an electron mobility of $1\times10^{-6}$ cm$^2$/Vs or higher is preferable.

The host material of the light-emitting layer 130b preferably contains two kinds of materials (the compound 135_1p and the compound 135_2p) as shown in FIG. 11A, and further preferably, the two kinds of materials form an exciplex. Thus, is it preferable that a hole-transport material be used for one of the compound 135_1p and the compound 135_2p and an electron-transport material be used for the other. With this structure, ExTET can be applied to the light-emitting layer 130b.

<<Separation Layer 120>>

The separation layer 120 has a function of inhibiting triplex excitation energy generated in the light-emitting layer 130b from being transferred to the light-emitting layer 130a. Since the separation layer 120 is positioned between the light-emitting layer 130a and the light-emitting layer 130b, the separation layer 120 preferably has a carrier-(electron- and/or hole-) transport property in order that light emission can be efficiently obtained from the light-emitting layer 130a and the light-emitting layer 130b. Thus, the aforementioned hole-transport material and electron-transport material can be used for the separation layer 120.

The separation layer 120 may be formed using two or more kinds of materials. In the case where the separation layer 120 is formed using two or more kinds of materials, both the hole-transport material and the electron-transport material are preferably contained. In the case where the separation layer 120 contains the hole-transport material and the electron-transport material, the carrier balance can be easily controlled by the mixture ratio. Specifically, the ratio of the hole-transport material to the electron-transport material is preferably within a range of 1:9 to 9:1 (weight ratio). Since the carrier balance can be easily controlled with the structure, a carrier recombination region can also be controlled easily. In the case where the separation layer 120 contains the hole-transport material and the electron-transport material, the hole-transport material and the electron-transport material preferably form an exciplex in combination.

The T1 level of the material used for the separation layer 120 is preferably higher than or equal to the T1 level of the host material used for the light-emitting layer 130b, in which case diffusion of triplet excitons generated in the light-emitting layer 130b can be inhibited. It is also possible that the T1 level of the host material used for the light-emitting layer 130b≥the T1 level of the material used for the separation layer 120≥the T1 level of the energy donor used for the light-emitting layer 130a be satisfied. In that case, triplet excitons generated in the light-emitting layer 130b are transferred to the light-emitting layer 130a and converted into fluorescence.

<<Pair of Electrodes>>

The electrode 101 and the electrode 102 have functions of injecting holes and electrons into the light-emitting layer 130a and the light-emitting layer 130b. The electrode 101 and the electrode 102 can be formed using a metal, an alloy, or a conductive compound, a mixture or a stack thereof, or the like. As the metal, aluminum (Al) is a typical example; besides, a transition metal such as silver (Ag), tungsten, chromium, molybdenum, copper, or titanium, an alkali metal such as lithium (Li) or cesium, or a Group 2 metal such as calcium or magnesium (Mg) can be used. As the transition metal, a rare earth metal such as ytterbium (Yb) may be used. An alloy containing the above metal can be used as the alloy; examples are MgAg and AlLi. Examples of the conductive compound include metal oxides such as indium tin oxide (hereinafter ITO), indium tin oxide containing silicon or silicon oxide (abbreviation: ITSO), indium zinc oxide, and indium oxide containing tungsten and zinc. It is also possible to use an inorganic carbon-based material such as graphene as the conductive compound. As described above, one or both of the electrode 101 and the electrode 102 may be formed by stacking two or more of these materials.

Light emission obtained from the light-emitting layer 130a and the light-emitting layer 130b is extracted through one or both of the electrode 101 and the electrode 102. Therefore, at least one of the electrode 101 and the electrode 102 has a function of transmitting visible light. An example of a conductive material having a function of transmitting light is a conductive material having a visible light transmittance higher than or equal to 40% and lower than or equal to 100%, preferably higher than or equal to 60% and lower than or equal to 100% and a resistivity lower than or equal to $1 \times 10^{-2}$ Ω·cm. The electrode through which light is extracted may be formed using a conductive material having a function of transmitting light and a function of reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1 \times 10^{-2}$ Ω·cm can be used. In the case where a material with low light transmittance, such as metal or alloy, is used for the electrode through which light is extracted, one or both of the electrode 101 and the electrode 102 are formed to a thickness that is thin enough to transmit visible light (e.g., a thickness of 1 nm to 10 nm).

Note that in this specification and the like, for the electrode having a function of transmitting light, a material that has a function of transmitting visible light and has conductivity is used; examples include, in addition to a layer of an oxide conductor typified by ITO mentioned above, an oxide semiconductor layer and an organic conductor layer containing an organic substance. Examples of the organic conductor layer containing an organic substance include a layer containing a composite material in which an organic compound and an electron donor (donor) are mixed and a layer containing a composite material in which an organic compound and an electron acceptor (acceptor) are mixed. The resistivity of the transparent conductive layer is preferably lower than or equal to $1 \times 10^5$ Ω·cm, further preferably lower than or equal to $1 \times 10^4$ Ω·cm.

As a method for forming the electrode 101 and the electrode 102, a sputtering method, an evaporation method, a printing method, a coating method, an MBE (Molecular Beam Epitaxy) method, a CVD method, a pulsed laser deposition method, an ALD (Atomic Layer Deposition) method, or the like can be used as appropriate.

<<Hole-Injection Layer>>

The hole-injection layer 111 has a function of lowering a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, and the like can be given. As the phthalocyanine derivative, phthalocyanine, metal phthalocyanine, and the like can be given. As the aromatic amine, a benzidine derivative, a phenylenediamine derivative, and the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron-accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (in particular, a cyano group or a halogen group such as a fluoro group), such as 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), and 1,3,4,5,7,8-hexafluorotetracyano-naphthoquinodimethane (abbreviation: F6-TCNNQ). A compound in which electron-withdrawing groups are bonded to a condensed aromatic ring having a plurality of hetero atoms, such as HAT-CN, is particularly preferable because it is thermally stable. A [3]radialene derivative having an electron-withdrawing group (in particular, a cyano group or a halogen group such as a fluoro group) is preferable because of having a very high electron-accepting property. Specific examples include α,α', α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. Alternatively, a transition metal oxide such as an oxide of a metal from Group 4 to Group 8 can be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ cm$^2$/Vs or higher is preferable. Specifically, the aromatic amines and the carbazole derivatives given as the hole-transport material that can be used for the light-emitting layer 130a can be used. Alternatively, the aromatic hydrocarbons, the stilbene derivatives, and the like can be used. Furthermore, the hole-transport material may be a high molecular compound.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. Thus, the use of the aromatic hydrocarbon having a hole mobility of $1\times10^{-6}$ cm$^2$/Vs or higher and having 14 to 42 carbon atoms is further preferable.

The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA).

Other examples include high molecular compounds such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N-bis(4-butylphenyl)-N,N-bis(phenyl)benzidine] (abbreviation: Poly-TPD).

<<Hole-Transport Layer>>

The hole-transport layer 112 is a layer containing a hole-transport material and can be formed using the materials given as examples of the materials for the hole-injection layer 111. In order to have a function of transporting holes injected into the hole-injection layer 111 to the light-emitting layer 130a or the light-emitting layer 130b, the hole-transport layer 112 preferably has a HOMO level equal or close to the HOMO level of the hole-injection layer 111.

As the hole-transport material, the materials given as examples of the material for the hole-injection layer 111 can be used. A substance having a hole mobility of $1\times10^{-6}$ cm$^2$/Vs or higher is preferred. Note that other substances may also be used as long as they have a property of transporting more holes than electrons. The layer containing a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130a or the light-emitting layer 130b, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ cm$^2$/Vs or higher is preferable. As a compound that easily accepts electrons (a material having an electron-transport property), a π-electron deficient heteroaromatic compound such as a nitrogen-containing heteroaromatic compound or a metal complex can be used, for example. Specifically, the metal complex having a quinoline ligand, a benzoquinoline ligand, an oxazole ligand, or a thiazole ligand, which is given as the electron-transport material that can be used for the light-emitting layer 130a, can be given. Furthermore, an oxadiazole derivative, a triazole derivative, a phenanthroline derivative, a pyridine derivative, a bipyridine derivative, a pyrimidine derivative, and the like can be given. A substance having an electron mobility of $1\times10^{-6}$ cm$^2$/Vs or higher is preferable. Note that other than these substances, any substance that has a property of transporting more electrons than holes may be used for the electron-transport layer. The electron-transport layer 118 is not limited to a single layer, and two or more layers containing the aforementioned substances may be stacked.

A layer that controls transfer of electron carriers may be provided between the electron-transport layer 118 and the light-emitting layer 130a or the light-emitting layer 130b. The layer that controls transfer of electron carriers is a layer in which a small amount of a substance having a high electron-trapping property is added to the above-described material having a high electron-transport property, and is capable of adjusting carrier balance by inhibiting transfer of electron carriers. Such a structure is very effective in reducing a problem (such as a decrease in device lifetime) caused when electrons pass through the light-emitting layer.

<<Electron-Injection Layer>>

The electron-injection layer 119 has a function of reducing a barrier for electron injection from the electrode 102 to promote electron injection, and a Group 1 metal, a Group 2 metal, or an oxide, a halide, a carbonate, or the like of them can be used, for example. Alternatively, a composite material containing the electron-transport material described above and a material having a property of donating electrons to the electron-transport material can also be used. As the material having an electron-donating property, a Group 1 metal, a Group 2 metal, an oxide of any of the metals, and the like can be given. Specifically, an alkali metal, an alkaline earth metal, or a compound thereof, such as lithium fluoride (LiF), sodium fluoride (NaF), cesium fluoride (CsF), calcium fluoride (CaF$_2$), or lithium oxide (LiO$_x$), can be used. A rare earth metal compound like erbium fluoride (ErF$_3$) can also be used. Electride may also be used for the electron-injection layer 119. Examples of the electride include a substance in which electrons are added at high concentration to a mixed oxide of calcium and aluminum. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons; specifically, the above-listed substances contained in the electron-transport layer 118 (the metal complexes, heteroaromatic compounds, and the like) can be used, for example. As the electron donor, a substance showing an electron-donating property with respect to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

Note that the light-emitting layer, the hole-injection layer, the hole-transport layer, the electron-transport layer, and the electron-injection layer described above can each be formed by a method such as an evaporation method (including a vacuum evaporation method), an inkjet method, a coating method, a nozzle printing method, or gravure printing. Other than the above-described materials, an inorganic compound such as a quantum dot or a high molecular compound (an oligomer, a dendrimer, a polymer, or the like) may be used for the light-emitting layer, the hole-injection layer, the hole-transport layer, the electron-transport layer, and the electron-injection layer described above.

As the quantum dot, a colloidal quantum dot, an alloyed quantum dot, a core-shell quantum dot, a core quantum dot, or the like may be used. Moreover, a quantum dot containing elements belonging to Groups 2 and 16, Groups 13 and 15, Groups 13 and 17, Groups 11 and 17, or Groups 14 and 15 may be used. Alternatively, a quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

As the liquid medium used for the wet process, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

Examples of the high molecular compound that can be used for the light-emitting layer include polyphenylenevinylene (PPV) derivatives such as poly[2-methoxy-5-(2-ethylhexyloxy)-1,4-phenylenevinylene] (abbreviation: MEH-PPV) and poly(2,5-dioctyl-1,4-phenylenevinylene); polyfluorene derivatives such as poly(9,9-di-n-octylfluorenyl-2,7-diyl) (abbreviation: PF8), poly[(9,9-di-n-octylfluorenyl-2,7-diyl)-alt-(benzo[2,1,3]thiadiazole-4,8-diyl)] (abbreviation: F8BT), poly[(9,9-di-n-octylfluorenyl-2,7-diyl)-alt-(2,2'-bithiophene-5,5'-diyl)] (abbreviation: F8T2), poly[(9,9-dioctyl-2,7-divinylenefluorenylene)-alt-(9,10-anthracene)], or poly[(9,9-dihexylfluorene-2,7-diyl)-alt-(2,5-dimethyl-1,4-phenylene)]; a polyalkylthiophene (PAT) derivative such as poly(3-hexylthiophene-2,5-diyl) (abbreviation: P3HT); and a polyphenylene derivative. These high molecular compounds and high molecular compounds such as poly(N-vinylcarbazole) (abbreviation: PVK), poly(2-vinylnaphthalene), and poly[bis(4-phenyl) (2,4,6-trimethylphenyl)amine] (abbreviation: PTAA) may be doped with a light-emitting compound and used for the light-emitting layer. As the light-emitting compound, the light-emitting compounds given above can be used.

<<Substrate>>

A light-emitting device of one embodiment of the present invention is formed over a substrate of glass, plastic, or the like. As for the order of forming layers over the substrate, layers may be sequentially stacked from the electrode 101 side or sequentially stacked from the electrode 102 side.

For the substrate over which the light-emitting device of one embodiment of the present invention can be formed, glass, quartz, plastic, or the like can be used, for example. Alternatively, a flexible substrate can be used. The flexible substrate is a substrate that can be bent (is flexible), such as a plastic substrate made of polycarbonate or polyarylate, for example. Furthermore, a film, an inorganic vapor deposition film, or the like can be used. Note that materials other than these may be used as long as they function as a support in a manufacturing process of the light-emitting device and an optical element. Alternatively, another material may be used as long as it has a function of protecting the light-emitting device and the optical element.

In one embodiment of the present invention, a light-emitting device can be formed using any of a variety of substrates, for example. There is no particular limitation on the type of a substrate. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, and a base material film. Examples of the glass substrate include barium borosilicate glass, aluminoborosilicate glass, and soda lime glass. Examples of the flexible substrate, the attachment film, the base material film, and the like are as follows. The examples include plastics typified by polyethylene terephthalate (PET), polyethylene naphthalate (PEN), polyether sulfone (PES), and polytetrafluoroethylene (PTFE). Another example is a resin such as acrylic. Other examples are polypropylene, polyester, polyvinyl fluoride, and polyvinyl chloride. Other examples are polyamide, polyimide, aramid, epoxy, an inorganic vapor deposition film, paper, and the like.

Furthermore, a flexible substrate may be used as the substrate and the light-emitting device may be formed directly on the flexible substrate. Alternatively, a separation layer may be provided between the substrate and the light-emitting device. The separation layer can be used when part or the whole of a light-emitting device formed over the separation layer is separated from the substrate and transferred onto another substrate. In such a case, the light-emitting device can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting device is formed using a substrate, the light-emitting device may be transferred to another substrate. Examples of the substrate to which the light-emitting device is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), and the like), a leather substrate, a rubber substrate, and the like. With the use of such a substrate, a light-emitting device with high durability, a light-emitting device with high heat resistance, a light-emitting device with reduced weight, or a light-emitting device with reduced thickness can be obtained.

The light-emitting device 150 may be formed over an electrode electrically connected to, for example, a field-effect transistor (FET) that is formed over any of the above-described substrates. Accordingly, an active matrix display device in which the FET controls the driving of the light-emitting device can be fabricated.

The structure described above in this embodiment can be used in appropriate combination with the other embodiments.

Embodiment 2

In this embodiment, examples of a method for synthesizing an organic compound that is favorably used for the light-emitting device of one embodiment of the present invention will be described giving the organic compounds represented by General Formulae (G1) and (G2) as an example.

<Method for Synthesizing Organic Compound Represented by General Formula (G1)>

The organic compound represented by General Formula (G1) shown above can be synthesized by a synthesis method using a variety of reactions. For example, the organic compound can be synthesized by Synthesis Schemes (S-1) and (S-2) shown below. A compound 1, an arylamine (a compound 2), and an arylamine (a compound 3) are coupled, whereby a diamine compound (a compound 4) is obtained.

Next, the diamine compound (the compound 4), halogenated aryl (the compound 5), and halogenated aryl (the compound 6) are coupled, whereby the organic compound represented by General Formula (G1) can be obtained.

[Chemical Formula 35]

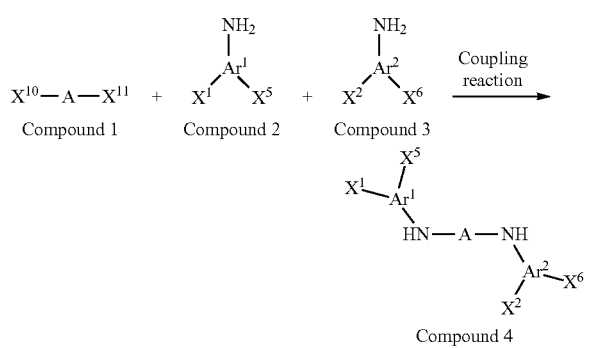

[Chemical Formula 36]

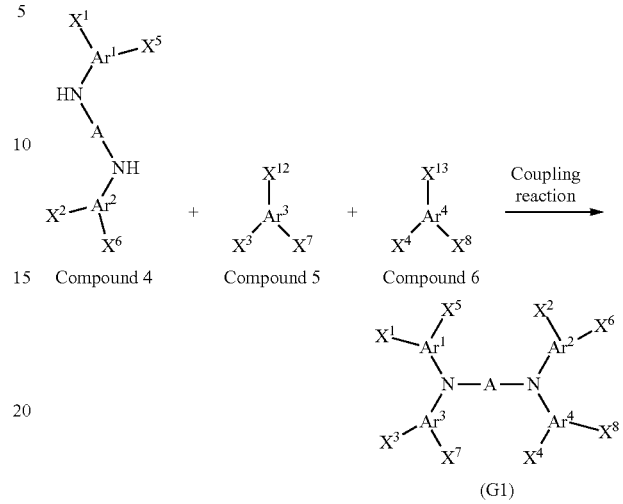

In Synthesis Schemes (S-1) and (S-2) shown above, A represents a substituted or unsubstituted condensed aromatic ring having 10 to 30 carbon atoms or a substituted or unsubstituted condensed heteroaromatic ring having 10 to 30 carbon atoms, $Ar^1$ to $Ar^4$ each independently represent a substituted or unsubstituted aromatic hydrocarbon group having 6 to 13 carbon atoms, $X^1$ to $X^8$ each independently represent any one of an alkyl group having 3 to 10 carbon atoms, a substituted or unsubstituted cycloalkyl group having 3 to 10 carbon atoms, and a trialkylsilyl group having 3 to 12 carbon atoms. Examples of the condensed aromatic ring or condensed heteroaromatic ring include chrysene, phenanthrene, stilbene, acridone, phenoxazine, and phenothiazine. In particular, anthracene, pyrene, coumarin, quinacridone, perylene, tetracene, and naphthobisbenzofuran are preferable.

In the case where a Buchwald-Hartwig reaction using a palladium catalyst is performed in Synthesis Schemes (S-1) and (S-2) shown above, $X^{10}$ to $X^{13}$ each represent a halogen group or a triflate group, and the halogen is preferably iodine, bromine, or chlorine. In the reaction, a palladium compound such as bis(dibenzylideneacetone)palladium(0) or palladium(II) acetate and a ligand such as tri(tert-butyl) phosphine, tri(n-hexyl)phosphine, tricyclohexylphosphine, di(1-adamantyl)-n-butylphosphine, or 2-dicyclohexylphosphino-2',6'-dimethoxy-1,1'-biphenyl can be used. In addition, an organic base such as sodium tert-butoxide, an inorganic base such as potassium carbonate, cesium carbonate, or sodium carbonate, or the like can be used. Furthermore, toluene, xylene, mesitylene, benzene, tetrahydrofuran, dioxane, or the like can be used as a solvent. Reagents that can be used in the reaction are not limited thereto.

The reaction performed in Synthesis Schemes (S-1) and (S-2) shown above is not limited to the Buchwald-Hartwig reaction. A Migita-Kosugi-Stille coupling reaction using an organotin compound, a coupling reaction using a Grignard reagent, an Ullmann reaction using copper or a copper compound, or the like can be used.

In the case where the compound 2 and the compound 3 have different structures in Synthesis Scheme (S-1) shown above, it is preferable that the compound 1 and the compound 2 be reacted first to form a coupling product and then the obtained coupling product and the compound 3 be reacted. In the case where the compound 1 is reacted with the compound 2 and the compound 3 in different stages, it is preferable that the compound 1 be a dihalogen compound and $X^{10}$ and $X^{11}$ be different halogens and selectively subjected to amination reactions one by one.

Furthermore, in the case where the compound 5 and the compound 6 have different structures in Synthesis Scheme (S-2), it is preferable that the compound 4 and the compound 5 be reacted first to form a coupling product and then the obtained coupling product and the compound 6 be reacted.

<Method for Synthesizing Organic Compound Represented by General Formula (G2)>

The organic compound of one embodiment of the present invention represented by General Formula (G2) can be synthesized by utilizing a variety of organic reactions. Two kinds of methods are shown below as examples.

The first method consists of Synthesis Schemes (S-3) to (S-8) below. In the first step, a condensation reaction of an aniline compound (a compound 7) and a 1,4-cyclohexadiene-1,4-dicarboxylic acid compound (a compound 8) gives an amine compound (a compound 9). The step is shown in Scheme (S-3). Note that in the case where two aniline compounds (the compounds 7) having the same substituent are condensed and an amino group having the same substituent is introduced in one step, the reaction is preferably performed with two equivalents of the aniline compound (the compound 7). In that case, an objective substance can be obtained even when a carbonyl group of the compound 8 does not have reaction selectivity.

Next, a condensation reaction of the amine compound (the compound 9) and an aniline derivative (a compound 10) gives a 1,4-cyclohexadiene compound (a compound 11). The step for obtaining the compound 11 is shown in Scheme (S-4).

Then, the 1,4-cyclohexadiene compound (the compound 11) is oxidized in the air, whereby a terephthalic acid compound (a compound 12) can be obtained. The step for obtaining the compound 12 is shown in Scheme (S-5).

Next, a ring of the terephthalic acid compound (the compound 12) is fused using acid, whereby a quinacridone compound (a compound 13) can be obtained. The step for obtaining the compound 13 is shown in Scheme (S-6).

Then, the quinacridone compound (the compound 13) and a halogenated aryl (a compound 14) are coupled, whereby a quinacridone compound (a compound 15) can be obtained. The step for obtaining the compound 15 is shown in Scheme (S-7). Note that in the case where two halogenated aryls (compounds 8) having the same substituent can be coupled and an amino group having the same substituent is introduced in one step, the reaction is preferably performed with two equivalents of the halogenated aryl (the compound 14). In that case, an objective substance can be obtained even when an amino group of the compound 14 does not have reaction selectivity.

Then, the quinacridone compound (the compound 15) and a halogenated aryl (a compound 16) are coupled, whereby the organic compound represented by General Formula (G2) shown above can be obtained. The step is shown in Scheme (S-8).

[Chemical Formula 37]

(S-3)

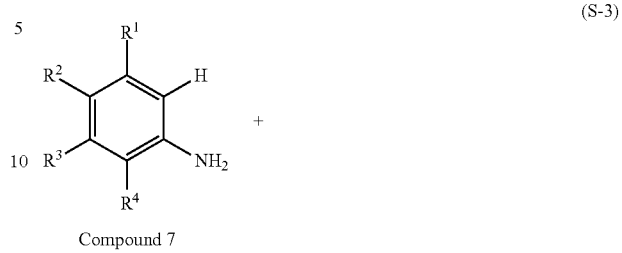

Compound 7

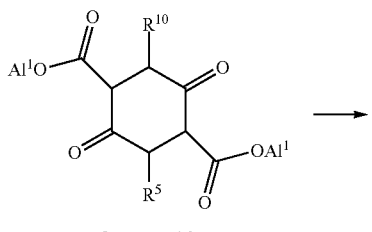

Compound 8

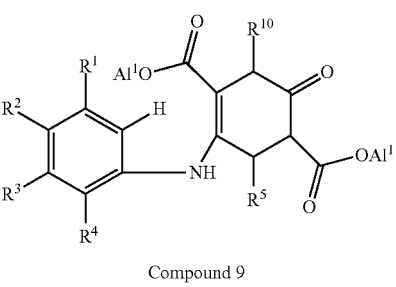

Compound 9

(S-4)

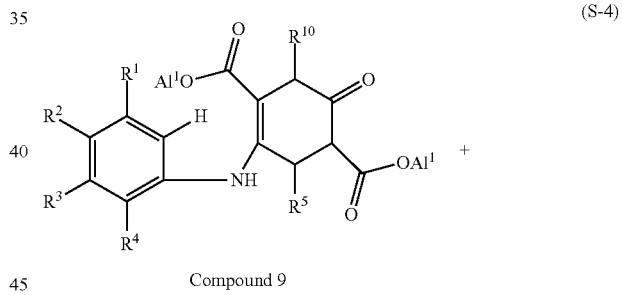

Compound 9

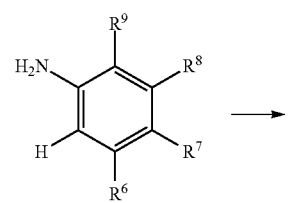

Compound 10

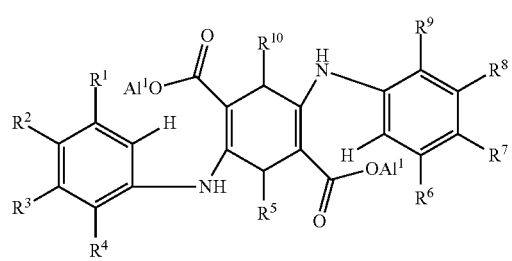

Compound 11

-continued (S-5)

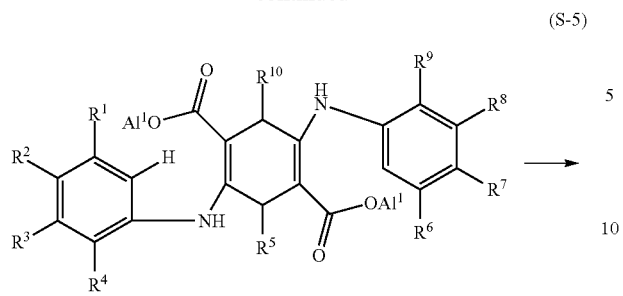

Compound 11

[Chemical Formula 38]

(S-6)

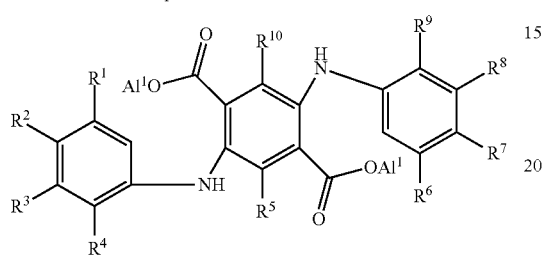

Compound 12

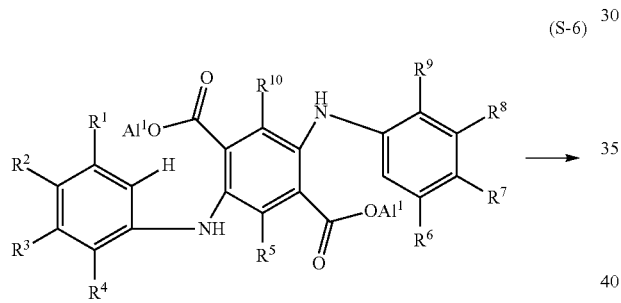

Compound 13

(S-7)

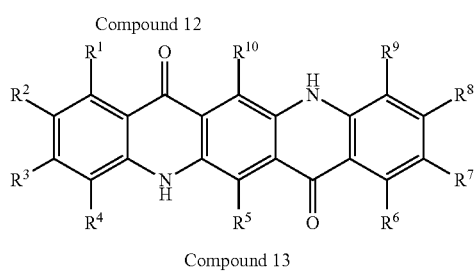

Compound 13

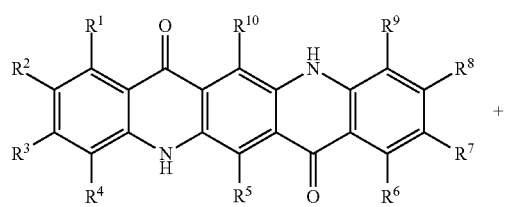

Compound 14

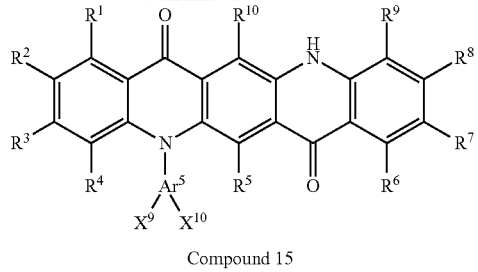

Compound 15

(S-8)

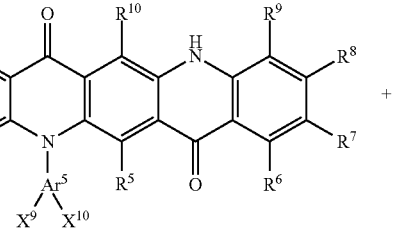

Compound 15

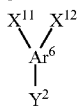

Compound 16

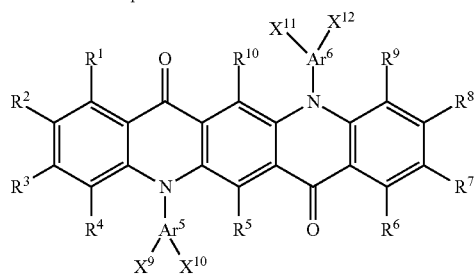

(G2)

The second method consists of Synthesis Schemes (S-3) to (S-5), (S-9), (S-10), and (S-11) shown below. The description of (S-3) to (S-5) is as described above. The terephthalic acid compound (the compound 12) and the halogenated aryl (the compound 14) are coupled, whereby a diamine compound (a compound 17) can be obtained. The step for obtaining the compound 17 is shown in Scheme (S-9). Note that in the case where two halogenated aryl molecules having the same substituent can be coupled and an amino group having the same substituent is introduced in one step, the reaction is preferably performed with two equivalents of the halogenated aryl (the compound 14). In that case, an objective substance can be obtained even when an amino group of the compound 12 does not have reaction selectivity.

Next, the diamine compound (the compound 17) and the halogenated aryl (the compound 16) are coupled, whereby a diamine compound (a compound 18) can be obtained. The step for obtaining the compound 18 is shown in Scheme (S-10).

Finally, a ring of the diamine compound (the compound 18) is fused using acid, whereby the organic compound represented by General Formula (G2) shown above can be obtained. The step is shown in Scheme (S-11). Note that in the annelation reaction, hydrogen at the ortho position of $Ar^5$ or $Ar^6$ may be reacted and an isomer of the organic compound represented by General Formula (G2) shown above may be generated.

The diamine compound (the compound 18) having a symmetrical structure is used in Scheme (S-11), whereby the organic compound represented by General Formula (G2) shown above can be synthesized.

[Chemical Formula 39]

(S-9)

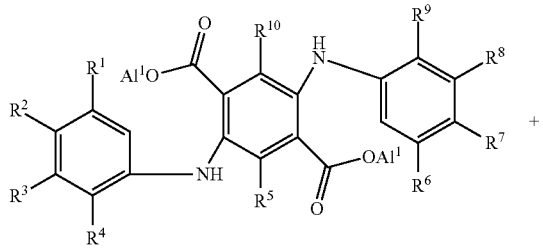

Compound 12

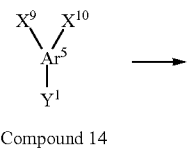

Compound 14

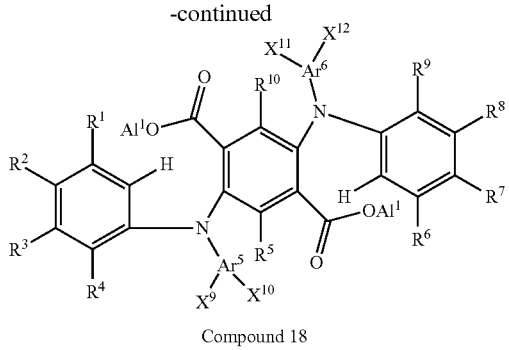

Compound 18

(S-11)

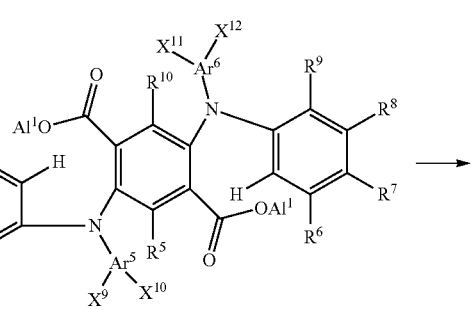

Compound 18

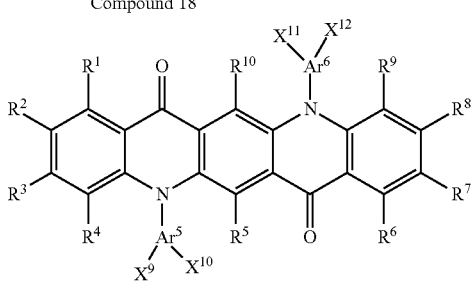

(G2)

(S-10)

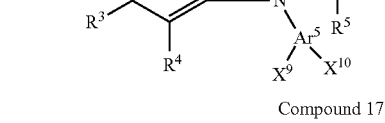

Compound 17

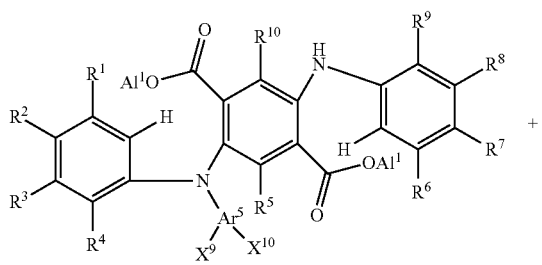

Compound 17

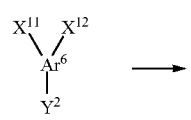

Compound 16

In Synthesis Schemes (S-3) to (S-6) and (S-9) to (S-11), $Al^1$ represents an alkyl group such as a methyl group.

In Synthesis Schemes (S-7) to (S-10), $Y^1$ and $Y^2$ each represent chlorine, bromine, iodine, or a triflate group.

In Synthesis Schemes (S-7) to (S-10), the Ullmann reaction is preferably performed because the reaction can proceed at high temperatures and a target compound can be obtained in a relatively high yield. In the reaction, copper or a copper compound can be used as a reagent, and an inorganic base such as potassium carbonate or sodium hydride can be used as a base. Examples of the solvent that can be used in the reaction include 2,2,6,6-tetramethyl-3,5-heptanedione, 1,3-dimethyl-3,4,5,6-tetrahydro-2(1H)pyrimidinone (DMPU), toluene, xylene, and benzene. In the Ullmann reaction, the objective substance can be obtained in a shorter time and in a higher yield when the reaction temperature is 100° C. or higher; therefore, it is preferable to use 2,2,6,6-tetramethyl-3,5-heptanedione, DMPU, or xylene, which has high boiling temperatures. A reaction temperature of 150° C. or higher is further preferred, and accordingly, DMPU is further preferably used. Reagents that can be used in the reaction are not limited to the above-described reagents.

In Synthesis Schemes (S-7) to (S-10), the Buchwald-Hartwig reaction using a palladium catalyst can be performed. In the reaction, a palladium compound such as bis(dibenzylideneacetone)palladium(0), palladium(II) acetate, [1,1-bis(diphenylphosphino)ferrocene]palladium (II) dichloride, tetrakis(triphenylphosphine)palladium(0), or allylpalladium(II) chloride (dimer) and a ligand such as tri(tert-butyl)phosphine, tri(n-hexyl)phosphine, tricyclohexylphosphine, di(1-adamantyl)-n-butylphosphine, 2-dicyclohexylphosphino-2',6'-dimethoxybiphenyl, tri(ortho-tolyl)phosphine, or (S)-(6,6'-dimethoxybiphenyl-2,2'-diyl)bis(diisopropylphosphine) (abbreviation: cBRIDP (registered trademark)) can be used, for example. In the reaction, an organic base such as sodium tert-butoxide, an inorganic base such as potassium carbonate, cesium carbonate, or sodium carbonate, or the like can be used. In the reaction, toluene, xylene, benzene, tetrahydrofuran, dioxane, or the like can be used as a solvent. Reagents that can be used in the reaction are not limited to the above-described reagents.

The method for synthesizing the organic compound represented by General Formula (G2) of the present invention is not limited to Synthesis Schemes (S-1) to (S-11).

Specific examples of $R^1$ to $R^{10}$ substituted at the quinacridone skeleton include an n-propyl group, an isopropyl group, an n-butyl group, an isobutyl group, a tert-butyl group, a cyclopropyl group, a cyclobutyl group, a cyclopentyl group, a cyclohexyl group, a trimethylsilyl group, a triethylsilyl group, and a tributylsilyl group.

Specific examples of $Ar^5$ at which $X^9$ and $X^{10}$ are substituted and $Ar^6$ at which $X^{11}$ and $X^{12}$ are substituted include a 2-isopropylphenyl group, a 2-butylphenyl group, a 2-isobutylphenyl group, a 2-tert-butylphenyl group, a 2-isopropylphenyl group, a 2-butylphenyl group, a 3-propylphenyl group, a 3-isobutylphenyl group, a 3-tert-butylphenyl group, a 4-propylphenyl group, a 4-isopropylphenyl group, a 4-butylphenyl group, a 4-isobutylphenyl group, a 4-tert-butylphenyl group, a 3,5-dipropylphenyl group, a 3,5-diisopropylphenyl group, a 3,5-dibutylphenyl group, a 3,5-diisobutylphenyl group, a (3,5-di-tert-butyl)phenyl group, a 1,3-dipropylphenyl group, a 1,3-di-isopropylphenyl group, a 1,3-dibutylphenyl group, a 1,3-di-isobutylphenyl group, a (1,3-di-tert-butyl)phenyl group, a 1,3,5-triisopropylphenyl group, a (1,3,5-tri-tert-butyl)phenyl group, and a 4-cyclohexylphenyl group.

The above is the description of the methods for synthesizing the organic compounds which are embodiments of the present invention and are represented by General Formula (G1) and General Formula (G2); however, the present invention is not limited thereto and the synthesis may be performed by another synthesis method.

Embodiment 3

In this embodiment, a light-emitting device having a structure different from the structure of the light-emitting device described in Embodiment 1 will be described below with reference to FIG. 12. Note that in FIG. 12, a portion having a function similar to that in FIG. 1A is represented by the same hatch pattern and a reference numeral thereof is omitted in some cases. In addition, common reference numerals are used for portions having similar functions, and a detailed description thereof is omitted in some cases.

Structure Example 2 of Light-Emitting Device

Figure 12:
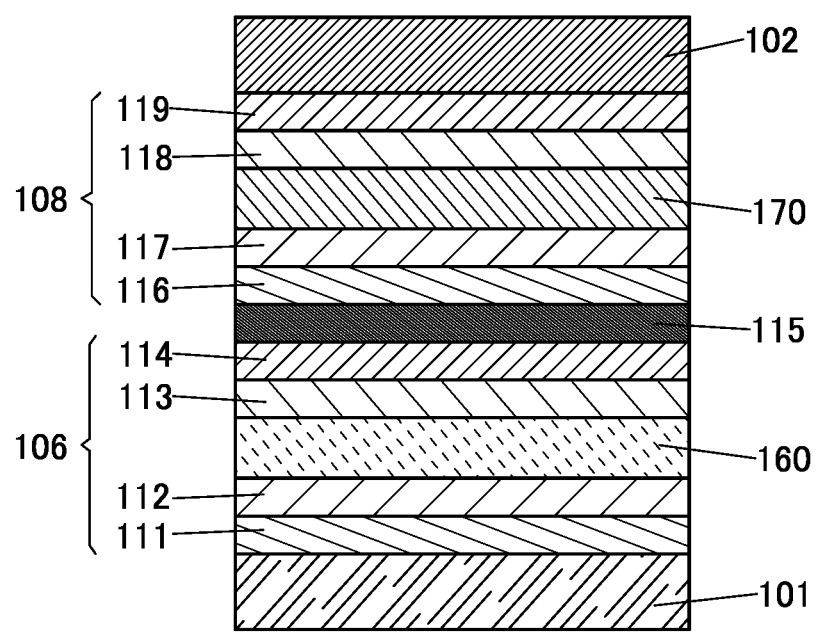
FIG. 12 is a schematic cross-sectional view of a light-emitting device of one embodiment of the present invention.

FIG. 12 is a schematic cross-sectional view of a light-emitting device 250.

The light-emitting device 250 illustrated in FIG. 12 includes a plurality of light-emitting units (a light-emitting unit 106 and a light-emitting unit 108) between a pair of electrodes (the electrode 101 and the electrode 102). Any one of the plurality of light-emitting units preferably has a structure similar to that of the EL layer 100 illustrated in FIG. 1A. That is, it is preferable that the light-emitting device 150 illustrated in FIG. 1A include one light-emitting unit, while the light-emitting device 250 include a plurality of light-emitting units. Note that the electrode 101 functions as an anode and the electrode 102 functions as a cathode in the light-emitting device 250 in the following description; however, the functions may be reversed as the structure of the light-emitting device 250.

Moreover, in the light-emitting device 250 illustrated in FIG. 12, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, a structure similar to that of the EL layer 100 is preferably used for the light-emitting unit 108.

The light-emitting device 250 includes a light-emitting layer 160 and a light-emitting layer 170. The light-emitting unit 106 includes the hole-injection layer 111, the hole-transport layer 112, an electron-transport layer 113, and an electron-injection layer 114 in addition to the light-emitting layer 160. The light-emitting unit 108 includes a hole-injection layer 116, a hole-transport layer 117, the electron-transport layer 118, and the electron-injection layer 119 in addition to the light-emitting layer 170.

In the light-emitting device 250, any layer included in each of the light-emitting unit 106 and the light-emitting unit 108 preferably contains the compound of one embodiment of the present invention. Note that the layer containing the compound is preferably the light-emitting layer 160 or the light-emitting layer 170.

The charge-generation layer 115 may have either a structure in which a substance having an acceptor property, which is an electron acceptor, is added to a hole-transport material or a structure in which a substance having a donor property, which is an electron donor, is added to an electron-transport material. Alternatively, both of these structures may be stacked.

In the case where the charge-generation layer 115 contains a composite material of an organic compound and a substance having an acceptor property, the composite material that can be used for the hole-injection layer 111 described in Embodiment 1 is used as the composite material. As the organic compound, a variety of compounds such as an aromatic amine compound, a carbazole compound, an aromatic hydrocarbon, and a high molecular compound (an oligomer, a dendrimer, a polymer, or the like) can be used. Note that a substance having a hole mobility of $1\times10^{-6}$ cm$^2$/Vs or higher is preferably used as the organic compound. However, other substances may also be used as long as they have a property of transporting more holes than electrons. Since the composite material of an organic compound and a substance having an acceptor property has excellent carrier-injection and carrier-transport properties, low-voltage driving or low-current driving can be achieved. Note that in the case where a surface of a light-emitting unit on the anode side is in contact with the charge-generation layer 115, the charge-generation layer 115 can also serve as a hole-injection layer or a hole-transport layer of the light-emitting unit; thus, a structure in which a hole-injection layer or a hole-transport layer is not provided in the light-emitting unit may be employed. Alternatively, in the case where a surface of a light-emitting unit on the cathode side is in contact with the charge-generation layer 115, the charge-generation layer 115 can also serve as an electron-injection layer or an electron-transport layer of the light-emitting unit; thus, a structure in which an electron-injection layer or an electron-transport layer is not provided in the light-emitting unit may be employed.

Note that the charge-generation layer 115 may have a stacked-layer structure combining a layer containing the composite material of an organic compound and a substance having an acceptor property and a layer formed of another material. For example, a layer containing the composite material of an organic compound and a substance having an acceptor property and a layer containing one compound selected from electron-donating substances and a compound having a high electron-transport property may be combined. Moreover, a layer containing the composite material of an organic compound and a substance having an acceptor property and a layer containing a transparent conductive film may be combined.

Note that the charge-generation layer 115 sandwiched between the light-emitting unit 106 and the light-emitting unit 108 injects electrons into one of the light-emitting units and injects holes into the other of the light-emitting units when voltage is applied to the electrode 101 and the electrode 102. For example, in FIG. 12, the charge-generation layer 115 injects electrons into the light-emitting unit 106 and injects holes into the light-emitting unit 108 when voltage is applied such that the potential of the electrode 101 is higher than the potential of the electrode 102.

Note that in terms of light extraction efficiency, the charge-generation layer 115 preferably has a property of transmitting visible light (specifically, the transmittance of visible light through the charge-generation layer 115 is higher than or equal to 40%). Moreover, the charge-generation layer 115 functions even when it has lower conductivity than the pair of electrodes (the electrode 101 and the electrode 102).

Forming the charge-generation layer 115 using the above-described materials can inhibit an increase in drive voltage in the case where the light-emitting layers are stacked.

The light-emitting device having two light-emitting units is described with reference to FIG. 12; however, a light-emitting device in which three or more light-emitting units are stacked can be similarly employed. With a plurality of light-emitting units partitioned by the charge-generation layer between a pair of electrodes as in the light-emitting device 250, it is possible to achieve a light-emitting device that can emit high-luminance light with the current density kept low and has a long lifetime. Moreover, a light-emitting device having low power consumption can be achieved.

Note that in each of the above structures, the emission colors exhibited by the guest materials used in the light-emitting unit 106 and the light-emitting unit 108 may be the same or different. In the case where guest materials having a function of exhibiting light emission of the same color are used for the light-emitting unit 106 and the light-emitting unit 108, the light-emitting device 250 can exhibit high emission luminance at a small current value, which is preferable. In the case where guest materials having a function of exhibiting light emission of different colors are used for the light-emitting unit 106 and the light-emitting unit 108, the light-emitting device 250 can exhibit multi-color light emission, which is preferable. In this case, with the use of a plurality of light-emitting materials with different emission wavelengths in one or both of the light-emitting layer 160 and the light-emitting layer 170, the light-emitting device 250 emits light obtained by synthesizing light emission having different emission peaks; thus, its emission spectrum has at least two local maximum values.

The above structure is also suitable for obtaining white light emission. When the light-emitting layer 160 and the light-emitting layer 170 emit light of complementary colors, white light emission can be obtained. It is particularly suitable to select the guest materials so that white light emission with high color rendering properties or light emission of at least red, green, and blue can be obtained. For example, the light-emitting layer 160 can have the structures of the light-emitting layer 130a and the light-emitting layer 130b described in Embodiment 1, so that green and red light emission can be obtained from the light-emitting layer 160 and blue light emission can be obtained from the light-emitting layer 170.

One or both of the light-emitting layer 160 and the light-emitting layer 170 preferably have the structures of the light-emitting layer 130a and the light-emitting layer 130b described in Embodiment 1. With such a structure, a light-emitting device with favorable emission efficiency and reliability can be obtained. In the case where the light-emitting layer 160 has the structures of the light-emitting layer 130a and the light-emitting layer 130b described in Embodiment 1, the light-emitting layer 170 may be a phosphorescent light-emitting layer, a fluorescent light-emitting layer, or a light-emitting layer exhibiting both fluorescence and phosphorescence; preferably, the light-emitting layer 170 is a blue fluorescent light-emitting layer in order that white light emission can be obtained.

In the case of a light-emitting device in which three or more light-emitting units are stacked, colors of light emitted from guest materials used in the light-emitting units may be the same or different from each other. In the case where a plurality of light-emitting units that emit light of the same color are included, these light-emitting units can emit light with high intensity with a small current value. Such a structure can be suitably used for adjustment of emission colors. The structure is particularly suitable when guest materials that emit light of different colors with different emission efficiencies are used. For example, when three layers of light-emitting units are included, the emission intensity of fluorescence and phosphorescence can be adjusted with two layers of light-emitting units that contain a fluorescent material of the same color and one layer of a light-emitting unit containing a phosphorescent material that exhibits an emission color different from that of the fluorescent material. That is, the intensity of emitted light of each color can be adjusted with the number of light-emitting units.

At least one of the light-emitting layer 160 and the light-emitting layer 170 may further be divided into layers and the divided layers may contain different light-emitting materials. That is, at least one of the light-emitting layer 160 and the light-emitting layer 170 can consist of two or more layers. For example, in the case where the light-emitting layer is formed by stacking a first light-emitting layer and a second light-emitting layer in this order from the hole-transport layer side, the first light-emitting layer is formed using a material having a hole-transport property as the host material and the second light-emitting layer is formed using a material having an electron-transport property as the host material. In this case, the light-emitting materials contained in the first light-emitting layer and the second light-emitting layer may be the same or different, and may have functions of exhibiting light emission of the same color or exhibiting light emission of different colors. White light emission with high color rendering properties that is formed of three primary colors or four or more emission colors can also be obtained by using a plurality of light-emitting materials having functions of exhibiting light emission of different colors.

Note that the hole-transport material, electron-transport material, and phosphorescent material described in Embodiment 1 can be used in appropriate combination for the phosphorescent light-emitting layer described in Embodiment 3.

There is no particular limitation on the host material and guest material used for the blue fluorescent light-emitting layer described in Embodiment 3, and the following materials can be given as examples.

As the guest material, a pyrene derivative, a perylene derivative, or the like can be used, and for example, the following materials can be used.

Specifically, N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9-phenyl-9H-fluoren-9-yl)phenyl]-N,N'-bis(4-tert-butylphenyl)pyrene-1,6-diamine (abbreviation: 1,6tBu-FLPAPrn), N,N-bis[4-(9-phenyl-9H-fluoren-9-yl)phenyl]-N,N-diphenyl-3,8-dicyclohexylpyrene-1,6-diamine (abbreviation: ch-1,6FLPAPrn), 5,10,15,20-tetraphenylbisbenzo[5,6]indeno[1,2,3-cd:1',2',3'-lm]perylene (abbreviation: DBP), and the like are given.

Examples of the host material include condensed polycyclic aromatic compounds such as anthracene derivatives, phenanthrene derivatives, pyrene derivatives, chrysene derivatives, and dibenzo[g,p]chrysene derivatives, and specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)tris(1-phenyl-1H-benzimidazole) (abbreviation: TPBI), bathophenanthroline (abbreviation: BPhen), bathocuproine (abbreviation: BCP), and 9-[4-(5-phenyl-1,3,4-oxadiazol-2-yl)phenyl]-9H-carbazole (abbreviation: CO11); and aromatic amine compounds such as 4,4'-bis[N-(1-naphthyl)-N-phenylamino]biphenyl (abbreviation: NPB or α-NPD), N,N-bis(3-methylphenyl)-N,N-diphenyl-[1,1'-biphenyl]-4,4'-diamine (abbreviation: TPD), and 4,4'-bis[N-(spiro-9,9'-bifluoren-2-yl)-N-phenylamino]biphenyl (abbreviation: BSPB). Other examples include condensed polycyclic aromatic compounds such as anthracene derivatives, phenanthrene derivatives, pyrene derivatives, chrysene derivatives, and dibenzo[g,p]chrysene derivatives, and specific examples include 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), 4-(9H-carbazol-9-yl)-4'-(10-phenyl-9-anthryl)triphenylamine (abbreviation: YGAPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N,9-diphenyl-N-(9,10-diphenyl-2-anthryl)-9H-carbazol-3-amine (abbreviation: 2PCAPA), 7-[4-(10-phenyl-9-anthryl)phenyl]-7H-dibenzo[c,g]carbazole (abbreviation: cgDBCzPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-phenyl-3-[4-(10-phenyl-9-anthryl)phenyl]-9H-carbazole (abbreviation: PCzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), and 1,3,5-tri(1-pyrenyl)benzene (abbreviation: TPB3). One or more substances having a wider energy gap than the guest material are selected from these and known substances.

Note that this embodiment can be combined as appropriate with any of the other embodiments.

Embodiment 4

In this embodiment, a light-emitting apparatus including the light-emitting device described in Embodiment 1 and Embodiment 3 will be described with reference to FIG. 13A and FIG. 13B.

Figure 13A:
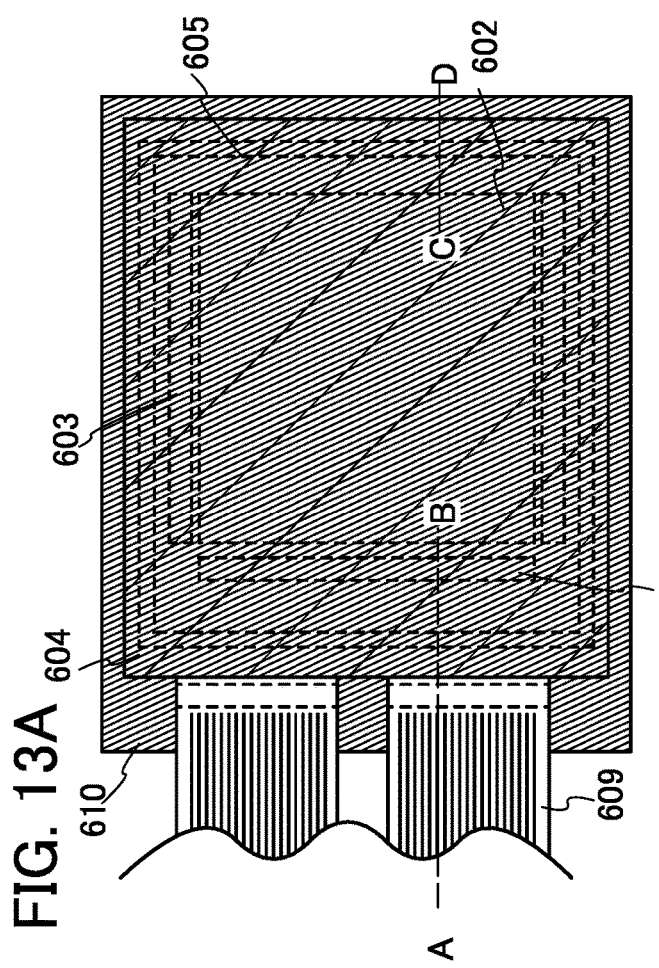
FIG. 13A is a top view illustrating a display device of one embodiment of the present invention.
Figure 13B:
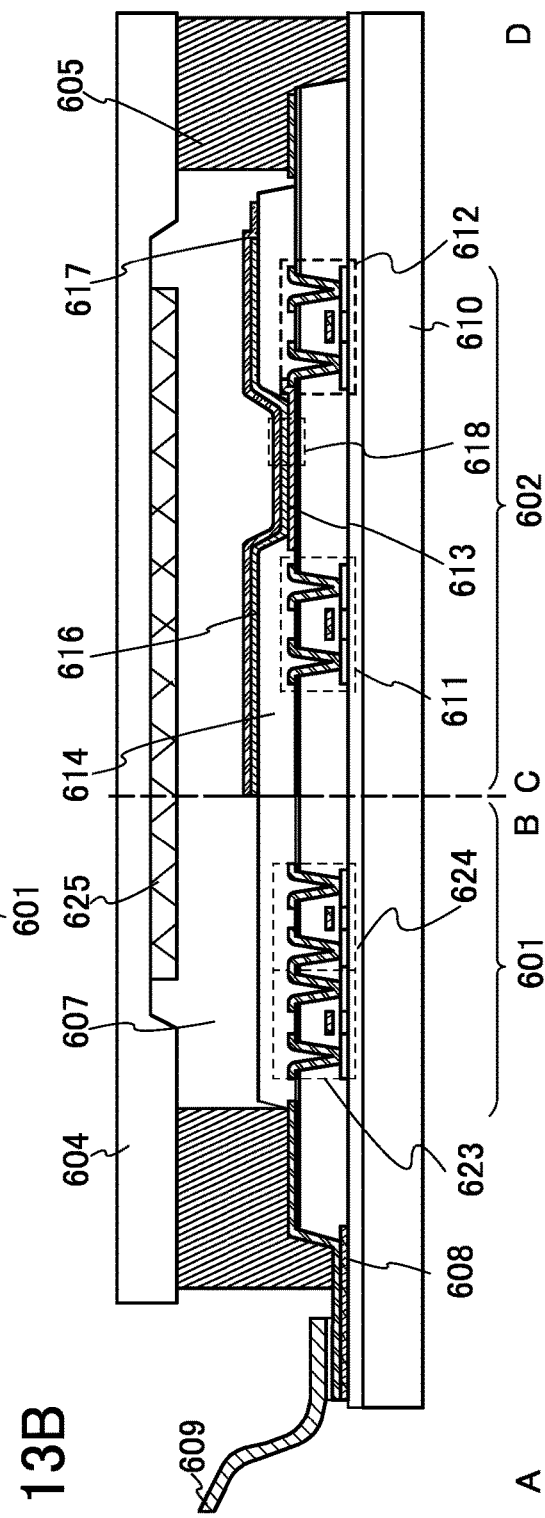
FIG. 13B is a schematic cross-sectional view illustrating the display device of one embodiment of the present invention.

FIG. 13A is a top view of a light-emitting apparatus, and FIG. 13B is a cross-sectional view taken along A-B and C-D in FIG. 13A. This light-emitting apparatus includes a driver circuit portion (a source side driver circuit) 601, a pixel portion 602, and a driver circuit portion (a gate side driver circuit) 603, which are indicated by dotted lines, as components controlling light emission from a light-emitting device. Furthermore, 604 denotes a sealing substrate, 625 denotes a desiccant, 605 denotes a sealant, and a portion surrounded by the sealant 605 is a space 607.

Note that a lead wiring 608 is a wiring for transmitting signals to be input to the source side driver circuit 601 and the gate side driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting apparatus in this specification includes not only the light-emitting apparatus itself but also the state where the FPC or the PWB is attached thereto.

Next, a cross-sectional structure of the above light-emitting apparatus is described with reference to FIG. 13B. The driver circuit portion and the pixel portion are formed over an element substrate 610; here, the source side driver circuit 601, which is the driver circuit portion, and one pixel in the pixel portion 602 are illustrated.

Note that in the source side driver circuit 601, a CMOS circuit in which an n-channel TFT 623 and a p-channel TFT 624 are combined is formed. The driver circuit may be formed of various CMOS circuits, PMOS circuits, or NMOS circuits. Although a driver-integrated type where the driver circuit is formed over the substrate is described in this embodiment, the driver circuit is not necessarily integrated and can be formed not over the substrate but outside the substrate.

The pixel portion 602 is formed of pixels including a switching TFT 611, a current controlling TFT 612, and a first electrode 613 electrically connected to a drain thereof. Note that an insulator 614 is formed to cover an end portion of the first electrode 613. The insulator 614 can be formed using a positive photosensitive resin film.

In order to improve the coverage with a film formed over the insulator 614, the insulator 614 is formed to have a surface with curvature at its upper end portion or lower end portion. For example, in the case where a photosensitive acrylic is used as a material of the insulator 614, only the upper end portion of the insulator 614 preferably has a curved surface. The radius of curvature of the curved surface is preferably greater than or equal to 0.2 μm and less than or equal to 0.3 μm. Either a negative photosensitive material or a positive photosensitive material can be used as the insulator 614.

An EL layer 616 and a second electrode 617 are formed over the first electrode 613. Here, as a material used for the first electrode 613 functioning as an anode, a material with a high work function is desirably used. For example, a single-layer film of an ITO film, an indium tin oxide film containing silicon, an indium oxide film containing zinc oxide at 2 wt % or higher and 20 wt % or lower, a titanium nitride film, a chromium film, a tungsten film, a Zn film, a Pt film, or the like, a stacked layer of titanium nitride and a film containing aluminum as its main component, a three-layer structure of a titanium nitride film, a film containing aluminum as its main component, and a titanium nitride film, or the like can be used. Note that the stacked-layer structure achieves low wiring resistance, a favorable ohmic contact, and a function as an anode.

The EL layer 616 is formed by any of a variety of methods such as an evaporation method using an evaporation mask, an inkjet method, and a spin coating method. A material included in the EL layer 616 may be a low molecular compound or a high molecular compound (including an oligomer or a dendrimer).

As a material used for the second electrode 617, which is formed over the EL layer 616 and functions as a cathode, a material with a low work function (e.g., Al, Mg, Li, Ca, or an alloy or a compound thereof, MgAg, MgIn, or AlLi) is preferably used. Note that in the case where light generated in the EL layer 616 passes through the second electrode 617, a stacked layer of a thin metal film with a reduced thickness and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the first electrode 613, the EL layer 616, and the second electrode 617 constitute a light-emitting device 618. The light-emitting device 618 is preferably the light-emitting device having the structure described in Embodiment 1 and Embodiment 2. In the light-emitting apparatus of this embodiment, the pixel portion, which includes a plurality of light-emitting devices, may include both the light-emitting device with the structure described in Embodiment 1 and Embodiment 2 and a light-emitting device with another structure.

The sealing substrate 604 and the element substrate 610 are attached to each other using the sealant 605, achieving a structure in which the light-emitting device 618 is provided in the space 607 surrounded by the element substrate 610, the sealing substrate 604, and the sealant 605. Note that the space 607 is filled with a filler, and may be filled with an inert gas (nitrogen, argon, or the like) or a resin and/or a desiccant.

Note that an epoxy-based resin or glass frit is preferably used for the sealant 605. Furthermore, these materials are preferably materials that transmit moisture or oxygen as little as possible. As a material used for the sealing substrate 604, in addition to a glass substrate and a quartz substrate, a plastic substrate formed of FRP (Fiber Reinforced Plastics), PVF (polyvinyl fluoride), polyester, acrylic, or the like can be used.

As described above, the light-emitting apparatus using the light-emitting device described in Embodiment 1 and Embodiment 3 can be obtained.

Structure Example 1 of Light-Emitting Apparatus

As an example of a display device, FIG. 14 shows a light-emitting apparatus in which a light-emitting device exhibiting white light emission is formed and a coloring layer (a color filter) is formed.

FIG. 14A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024W, 1024R, 1024G, and 1024B of light-emitting devices, a bank 1025, an EL layer 1028, a second electrode 1029 of the light-emitting devices, a sealing substrate 1031, a sealant 1032, a red pixel 1044R, a green pixel 1044G, a blue pixel 1044B, a white pixel 1044W, and the like.

In FIG. 14A and FIG. 14B, coloring layers (a red coloring layer 1034R, a green coloring layer 1034G, and a blue coloring layer 1034B) are provided on a transparent base material 1033. A black layer (black matrix) 1035 may be additionally provided. The transparent base material 1033 provided with the coloring layers and the black layer is positioned and fixed to the substrate 1001. Note that the coloring layers and the black layer are covered with an overcoat layer 1036. In FIG. 14A, a light-emitting layer emits light that goes outside without passing through the coloring layers, while the other light-emitting layers emit light that passes through the respective coloring layers to go outside. The light that does not pass through the coloring layers is white, and the light that passes through the coloring layers is red, green, and blue, so that an image can be expressed with the pixels of four color.

FIG. 14B shows an example in which the red coloring layer 1034R, the green coloring layer 1034G, and the blue coloring layer 1034B are formed between the gate insulating film 1003 and the first interlayer insulating film 1020. As shown in FIG. 14B, the coloring layers may be provided between the substrate 1001 and the sealing substrate 1031.

The above-described light-emitting apparatus is a light-emitting apparatus having a structure in which light is extracted from the substrate 1001 side where the TFTs are formed (a bottom emission type), but may be a light-emitting apparatus having a structure in which light is extracted from the sealing substrate 1031 side (a top emission type).

Structure Example 2 of Light-Emitting Apparatus

FIG. 15A and FIG. 15B each show a cross-sectional view of a top emission light-emitting apparatus. In this case, a substrate that does not transmit light can be used as the substrate 1001. The process up to the formation of a connection electrode that connects the TFT and the anode of the light-emitting device is performed in a manner similar to that of a bottom emission light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film 1021 or using other various materials.

A lower electrode 1025W, a lower electrode 1025R, a lower electrode 1025G, and a lower electrode 1025B of the light-emitting device are anodes here, but may be cathodes. Furthermore, in the case of the top emission light-emitting apparatus as illustrated in FIG. 15A and FIG. 15B, the lower electrode 1025W, the lower electrode 1025R, the lower electrode 1025G, and the lower electrode 1025B are preferably reflective electrodes. Note that the second electrode 1029 preferably has a function of reflecting light and a function of transmitting light. It is preferable that a microcavity structure be used between the second electrode 1029, and the lower electrode 1025W, the lower electrode 1025R, the lower electrode 1025G, and the lower electrode 1025B, in which case a function of amplifying light with a specific wavelength is included. The structure of the EL layer 1028 is a device structure similar to the structures described in Embodiment 1 and Embodiment 3, with which white light emission can be obtained.

In FIG. 14A, FIG. 14B, FIG. 15A, and FIG. 15B, the structure of the EL layer for providing white light emission can be achieved by, for example, using a plurality of light-emitting layers or using a plurality of light-emitting units. Note that the structure for providing white light emission is not limited thereto.

In a top emission structure as illustrated in FIG. 15A and FIG. 15B, sealing can be performed with the sealing substrate 1031 on which the coloring layers (the red coloring layer 1034R, the green coloring layer 1034G, and the blue coloring layer 1034B) are provided. The sealing substrate 1031 may be provided with a black layer (black matrix) 1030 which is positioned between pixels. The coloring layers (the red coloring layer 1034R, the green coloring layer 1034G, and the blue coloring layer 1034B) and the black layer (black matrix) may be covered with the overcoat layer. Note that a substrate having a light-transmitting property is used as the sealing substrate 1031.

FIG. 15A illustrates a structure in which full color display is performed using three colors of red, green, and blue; alternatively, full color display may be performed using four colors of red, green, blue, and white as illustrated in FIG. 15B. Note that the structure for performing full color display is not limited to them. For example, full color display using four colors of red, green, blue, and yellow may be performed.

In the light-emitting device of one embodiment of the present invention, a fluorescent material is used as a guest material. Since a fluorescent material has a sharper spectrum than a phosphorescent material, light emission with high color purity can be obtained. Accordingly, when the light-emitting device is used for the light-emitting apparatus described in this embodiment, a light-emitting apparatus with high color reproducibility can be obtained.

As described above, the light-emitting apparatus using the light-emitting device described in Embodiment 1 and Embodiment 3 can be obtained.

Note that this embodiment can be combined as appropriate with any of the other embodiments.

Embodiment 5

In this embodiment, electronic appliances and display devices of embodiments of the present invention will be described.

According to one embodiment of the present invention, an electronic appliance and a display device that have a flat surface, high emission efficiency, and high reliability can be manufactured. In addition, an electronic appliance and a display device that have a curved surface, high emission efficiency, and high reliability can be manufactured according to one embodiment of the present invention. Moreover, a light-emitting device having high color reproducibility can be obtained as described above.

Examples of the electronic appliances include a television device, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

Figure 16A:
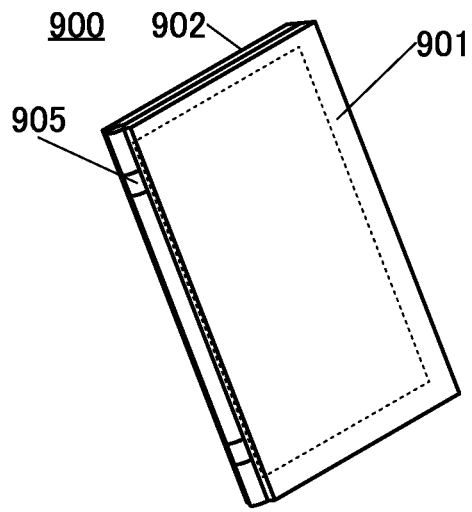
FIG. 16A to FIG. 16D are perspective views illustrating display modules of one embodiment of the present invention.
Figure 16B:
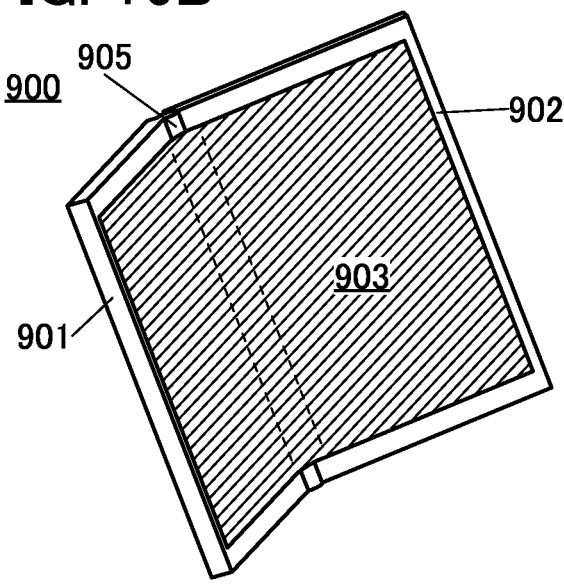

A portable information terminal 900 illustrated in FIG. 16A and FIG. 16B includes a housing 901, a housing 902, a display portion 903, a hinge portion 905, and the like.

The housing 901 and the housing 902 are joined together by the hinge portion 905. The portable information terminal 900 can be opened as illustrated in FIG. 16B from a folded state (FIG. 16A). Thus, the portable information terminal 900 has high portability when carried and excellent visibility with its large display region when used.

In the portable information terminal 900, the flexible display portion 903 is provided across the housing 901 and the housing 902 which are joined together by the hinge portion 905.

The light-emitting apparatus manufactured using one embodiment of the present invention can be used for the display portion 903. Thus, a highly reliable portable information terminal can be manufactured.

The display portion 903 can display at least one of text information, a still image, a moving image, and the like. When text information is displayed on the display portion, the portable information terminal 900 can be used as an e-book reader.

When the portable information terminal 900 is opened, the display portion 903 is held in a state with a large radius of curvature. For example, the display portion 903 is held while including a curved portion with a radius of curvature of greater than or equal to 1 mm and less than or equal to 50 mm, preferably greater than or equal to 5 mm and less than or equal to 30 mm. Part of the display portion 903 can display an image while being curved since pixels are continuously arranged from the housing 901 to the housing 902.

The display portion 903 functions as a touch panel and can be controlled with a finger, a stylus, or the like.

The display portion 903 is preferably formed using one flexible display. Thus, a seamless continuous image can be displayed between the housing 901 and the housing 902. Note that each of the housing 901 and the housing 902 may be provided with a display.

The hinge portion 905 preferably includes a locking mechanism so that an angle formed between the housing 901 and the housing 902 does not become larger than a predetermined angle when the portable information terminal 900 is opened. For example, the angle at which they become locked (they are not opened any further) is preferably greater than or equal to 900 and less than 1800 and can be typically 90°, 120°, 135°, 150°, 175°, or the like. In this way, the convenience, safety, and reliability of the portable information terminal 900 can be improved.

When the hinge portion 905 includes a locking mechanism, excessive force is not applied to the display portion 903; thus, breakage of the display portion 903 can be prevented. Therefore, a highly reliable portable information terminal can be achieved.

The housing 901 and the housing 902 may be provided with a power button, an operation button, an external connection port, a speaker, a microphone, or the like.

Any one of the housing 901 and the housing 902 is provided with a wireless communication module, and data can be transmitted and received through a computer network such as the Internet, a LAN (Local Area Network), or Wi-Fi (registered trademark).

Figure 16C:
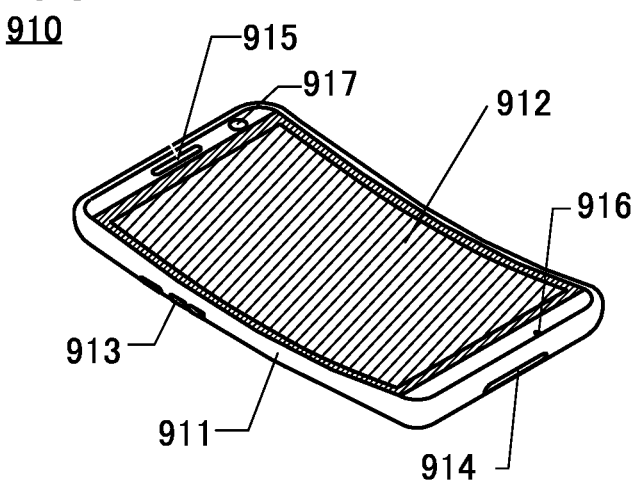

A portable information terminal 910 illustrated in FIG. 16C includes a housing 911, a display portion 912, an operation button 913, an external connection port 914, a speaker 915, a microphone 916, a camera 917, and the like.

The light-emitting apparatus manufactured using one embodiment of the present invention can be used for the display portion 912. Thus, the portable information terminal can be manufactured with a high yield.

The portable information terminal 910 includes a touch sensor in the display portion 912. A variety of operations such as making a call and inputting a character can be performed by touch on the display portion 912 with a finger, a stylus, or the like.

In addition, the operation of the operation button 913 can switch the power ON and OFF operations and types of images displayed on the display portion 912. For example, switching from a mail creation screen to a main menu screen can be performed.

When a sensing device such as a gyroscope sensor or an acceleration sensor is provided inside the portable information terminal 910, the direction of display on the screen of the display portion 912 can be automatically switched by determining the orientation (horizontal or vertical) of the portable information terminal 910. Furthermore, the direction of display on the screen can be switched by touch on the display portion 912, operation of the operation button 913, sound input using the microphone 916, or the like.

The portable information terminal 910 has, for example, one or more functions selected from a telephone set, a notebook, an information browsing system, and the like. Specifically, the portable information terminal can be used as a smartphone. The portable information terminal 910 is capable of executing a variety of applications such as mobile phone calls, e-mailing, text viewing and writing, music replay, video replay, Internet communication, and games, for example.

Figure 16D:
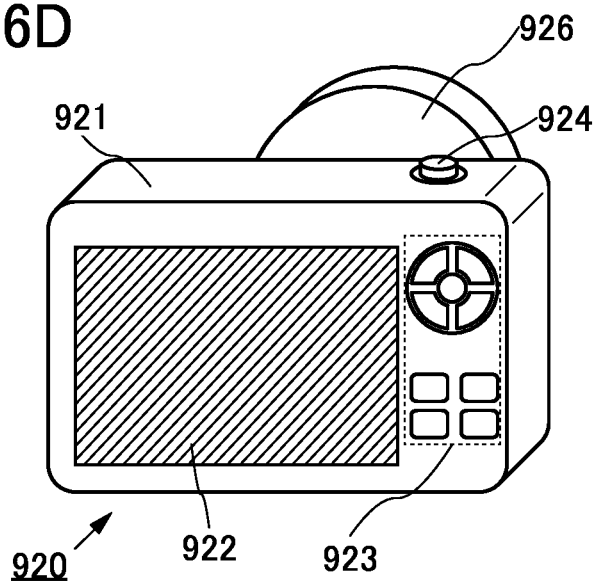

A camera 920 illustrated in FIG. 16D includes a housing 921, a display portion 922, operation buttons 923, a shutter button 924, and the like. Furthermore, a detachable lens 926 is attached to the camera 920.

The light-emitting apparatus manufactured using one embodiment of the present invention can be used for the display portion 922. Thus, a highly reliable camera can be manufactured.

Although the camera 920 here is configured such that the lens 926 is detachable from the housing 921 for replacement, the lens 926 may be integrated with the housing 921.

A still image or a moving image can be taken with the camera 920 at the press of the shutter button 924. In addition, the display portion 922 has a function of a touch panel, and images can also be taken by the touch on the display portion 922.

Note that a stroboscope, a viewfinder, or the like can be additionally attached to the camera 920. Alternatively, these may be incorporated into the housing 921.

Figure 17A:
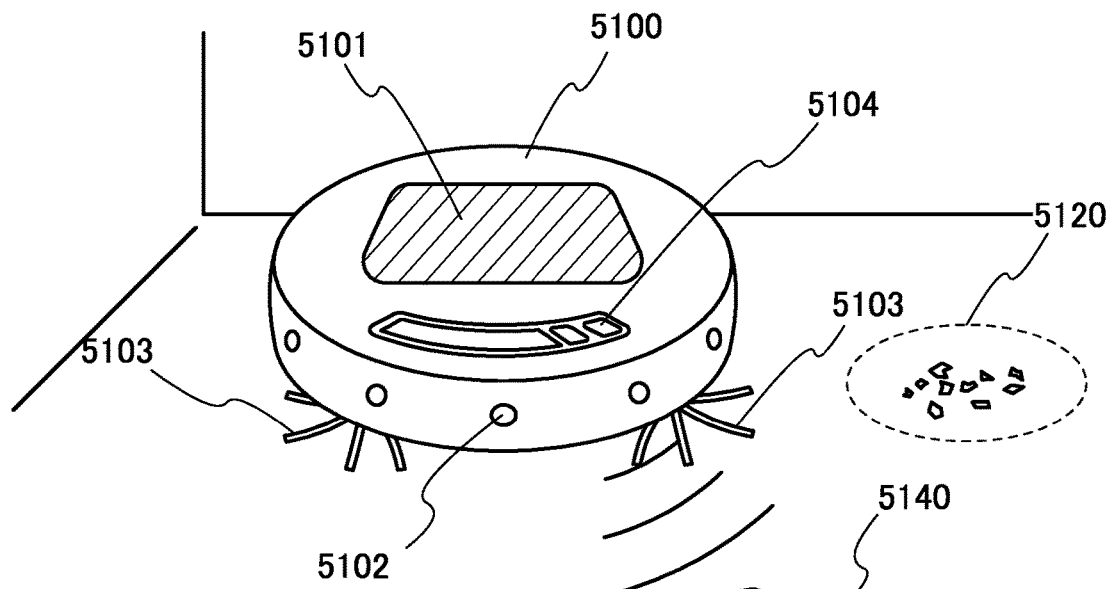
FIG. 17A to FIG. 17C are diagrams illustrating electronic appliances of one embodiment of the present invention.

FIG. 17A is a schematic view showing an example of a cleaning robot.

A cleaning robot 5100 includes a display 5101 placed on its top surface, a plurality of cameras 5102 placed on its side surface, a brush 5103, and an operation button 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. In addition, the cleaning robot 5100 has a wireless communication means.

The cleaning robot 5100 is self-propelled, detects dust 5120, and can suck up the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is detected by image analysis, the rotation of the brush 5103 can be stopped.

The display 5101 can display the remaining capacity of a battery, the amount of vacuumed dust, and the like. The display 5101 may display the path on which the cleaning robot 5100 has run. The display 5101 may be a touch panel, and the operation button 5104 may be provided on the display 5101.

The cleaning robot 5100 can communicate with a portable electronic appliance 5140 such as a smartphone. The portable electronic appliance 5140 can display images taken by the cameras 5102. Accordingly, an owner of the cleaning robot 5100 can monitor the room even from the outside. The display on the display 5101 can be checked by the portable electronic appliance 5140 such as a smartphone.

The light-emitting apparatus of one embodiment of the present invention can be used for the display 5101.

Figure 17B:
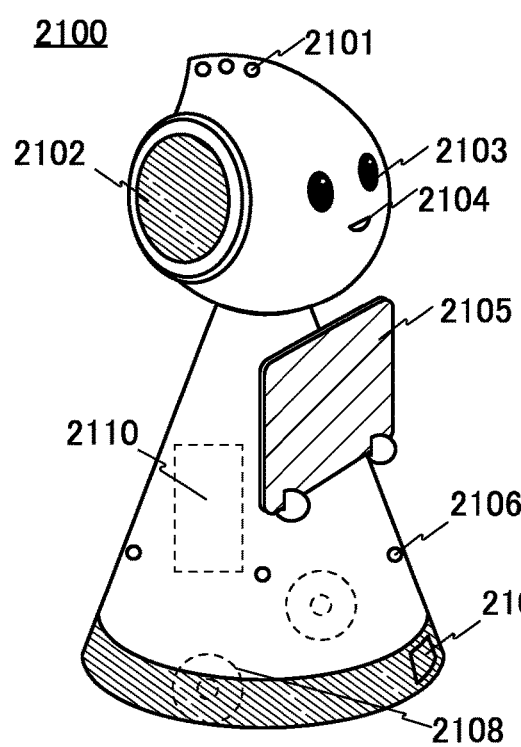

A robot 2100 illustrated in FIG. 17B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect the presence of an obstacle in the direction where the robot 2100 advances with the moving mechanism 2108. The robot 2100 can move safely by recognizing the surroundings with the upper camera 2103, the lower camera 2106, and the obstacle sensor 2107.

The light-emitting apparatus of one embodiment of the present invention can be used for the display 2105.

Figure 17C:
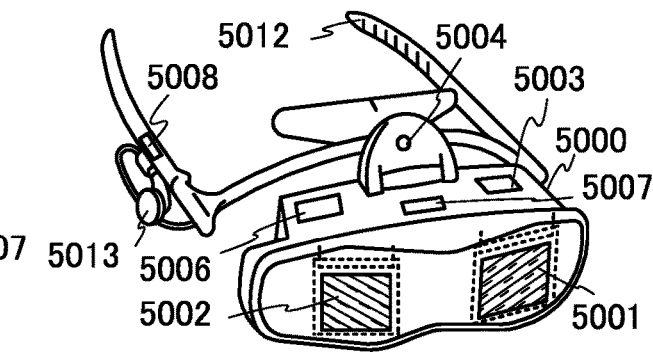

FIG. 17C illustrates an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared ray), a microphone 5008, a second display portion 5002, a support 5012, and an earphone 5013.

The light-emitting apparatus of one embodiment of the present invention can be used for the display portion 5001 and the second display portion 5002.

Figure 18A:
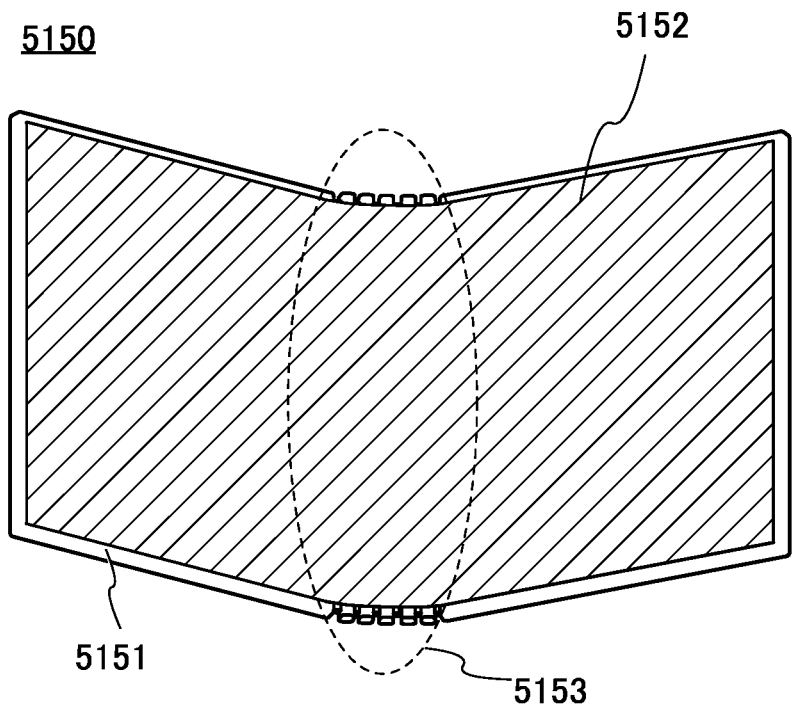
FIG. 18A and FIG. 18B are perspective views illustrating a display device of one embodiment of the present invention.
Figure 18B:
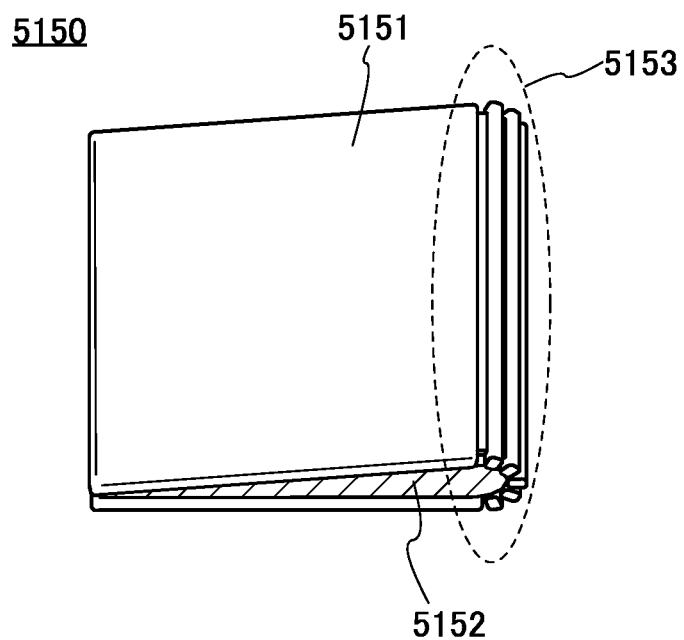

FIG. 18A and FIG. 18B illustrate a foldable portable information terminal 5150. The foldable portable information terminal 5150 includes a housing 5151, a display region 5152, and a bend portion 5153. FIG. 18A illustrates the portable information terminal 5150 that is opened. FIG. 18B illustrates the portable information terminal 5150 that is folded. Despite its large display region 5152, the portable information terminal 5150 is compact in size and has excellent portability when folded.

The display region 5152 can be folded in half with the bend portion 5153. The bend portion 5153 is formed of a stretchable member and a plurality of supporting members, and in the case where the display region is folded, the stretchable member stretches and the bend portion 5153 has a radius of curvature of 2 mm or more, preferably 5 mm or more.

Note that the display region 5152 may be a touch panel (an input/output device) including a touch sensor (an input device). The light-emitting apparatus of one embodiment of the present invention can be used for the display region 5152.

This embodiment can be combined with the other embodiments as appropriate.

Embodiment 6

In this embodiment, examples in which the light-emitting device of one embodiment of the present invention is used for various lighting devices will be described with reference to FIG. 19. With the use of the light-emitting device of one embodiment of the present invention, a highly reliable lighting device with high emission efficiency can be manufactured.

Manufacturing the light-emitting device of one embodiment of the present invention over a substrate having flexibility achieves an electronic appliance or a lighting device that has a light-emitting region with a curved surface.

Furthermore, a light-emitting apparatus in which the light-emitting device of one embodiment of the present invention is used can also be used for lighting for motor vehicles; for example, such lighting can be provided on a windshield, a ceiling, and the like.

Figure 19:
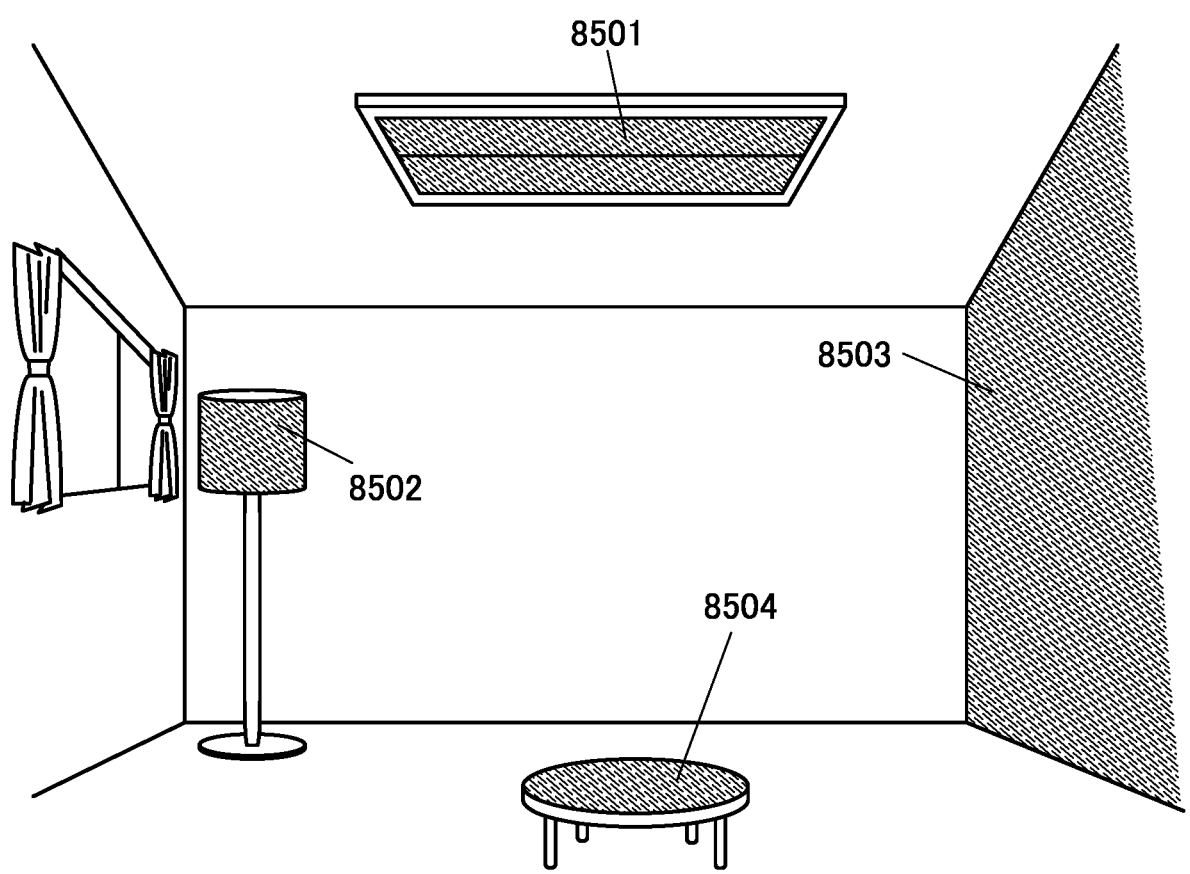
FIG. 19 is a diagram illustrating lighting devices of one embodiment of the present invention.

FIG. 19 illustrates an example in which the light-emitting device is used for an indoor lighting device 8501. Since the light-emitting device can have a larger area, a lighting device having a large area can also be formed. In addition, a lighting device 8502 in which a light-emitting region has a curved surface can also be formed with the use of a housing with a curved surface. A light-emitting device described in this embodiment is in the form of a thin film, which allows the housing to be designed more freely. Thus, the lighting device can be elaborately designed in a variety of ways. Furthermore, a wall of the room may be provided with a large-sized lighting device 8503. The lighting devices 8501, 8502, and 8503 may be provided with a touch sensor with which power-on or off is performed.

Moreover, when the light-emitting device is used on the surface side of a table, a lighting device 8504 which has a function as a table can be obtained. When the light-emitting device is used as part of other furniture, a lighting device having a function of the furniture can be obtained.

As described above, lighting devices and electronic appliances can be obtained by application of the light-emitting device of one embodiment of the present invention. Note that the light-emitting device can be used for lighting devices and electronic appliances in a variety of fields without being limited to the lighting devices and the electronic appliances described in this embodiment.

The structures described in this embodiment can be used in an appropriate combination with the structures described in the other embodiments.

REFERENCE NUMERALS

100: EL layer, 101: electrode, 102: electrode, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 120: separation layer, 130a: light-emitting layer, 130b: light-emitting layer, 131: compound, 131_f: compound, 132: compound, 132_f: compound, 133: compound, 134: compound, 135: compound, 135_p: compound, 135_1: compound, 135_1p: compound, 135_2: compound, 135_2p: compound, 136: compound, 136_p: compound, 150: light-emitting device, 152: light-emitting device, 160: light-emitting layer, 170: light-emitting layer, 200: EL layer, 250: light-emitting device, 301: guest material, 302: guest material, 310: luminophore, 320: protecting group, 330: host material, 601: source side driver circuit, 602: pixel portion, 603: gate side driver circuit, 604: sealing substrate, 605: sealant, 607: space, 608: wiring, 609: FPC, 610: element substrate, 611: switching TFT, 612: current controlling TFT, 613: electrode, 614: insulator, 616: EL layer, 617: electrode, 618: light-emitting device, 623: n-channel TFT, 624: p-channel TFT, 625: desiccant, 900: portable information terminal, 901: housing, 902: housing, 903: display portion, 905: hinge portion, 910: portable information terminal, 911: housing, 912: display portion, 913: operation button, 914: external connection port, 915: speaker, 916: microphone, 917: camera, 920: camera, 921: housing, 922: display portion, 923: operation button, 924: shutter button, 926: lens, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: electrode, 1024G: electrode, 1024R: electrode, 1024W: electrode, 1025B: lower electrode, 1025G: lower electrode, 1025R: lower electrode, 1025W: lower electrode, 1025: bank, 1028: EL layer, 1029: electrode, 1031: sealing substrate, 1032: sealant, 1033: base material, 1034B: coloring layer, 1034G: coloring layer, 1034R: coloring layer, 1036: overcoat layer, 1037: interlayer insulating film, 1040: pixel portion, 1041: driver circuit portion, 1042: peripheral portion, 1044R: red pixel, 1044G: green pixel, 1044B: blue pixel, 1044W: white pixel, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: display portion, 5003: speaker, 5004:

LED lamp, 5006: connection terminal, 5007: sensor, 5008: microphone, 5012: support, 5013: earphone, 5100: cleaning robot, 5101: display, 5102: camera, 5103: brush, 5104: operation button, 5120: dust, 5140: portable electronic appliance, 5150: portable information terminal, 5151: housing, 5152: display region, 5153: bend portion, 8501: lighting device, 8502: lighting device, 8503: lighting device, 8504: lighting device This application is based on Japanese Patent Application Serial No. 2019-019692 filed on Feb. 6, 2019, the entire contents of which are hereby incorporated herein by reference.

The invention claimed is:

1. A light-emitting device comprising:
a first electrode;
a first light-emitting layer over the first electrode;
a second light-emitting layer over the first light-emitting layer; and
a second electrode over the second light-emitting layer,
wherein one of the first light-emitting layer and the second light-emitting layer comprises a first material and a second material,
wherein the other of the first light-emitting layer and the second light-emitting layer comprises a third material and a fourth material,
wherein light emission from the light-emitting device includes an emission of the second material and an emission of the fourth material,
wherein the first material is capable of converting triplet excitation energy into light emission,
wherein the second material is capable of converting singlet excitation energy into light emission and includes a luminophore and five or more protecting groups,
wherein the luminophore is one of a condensed aromatic ring and a condensed heteroaromatic ring,
wherein each of the five or more protecting groups independently includes any one of an alkyl group having 1 to 10 carbon atoms, a substituted or unsubstituted cycloalkyl group having 3 to 10 carbon atoms, and a trialkylsilyl group having 3 to 12 carbon atoms,
wherein the third material is capable of emitting delayed fluorescence, and
wherein the fourth material is capable of converting triplet excitation energy into light emission.

2. The light-emitting device according to claim 1,
wherein the third material comprises a first host compound and a second host compound,
wherein the first host compound and the second host compound are capable of forming an exciplex, and
wherein the emission spectrum of the third material is an emission spectrum of the exciplex formed by the first host compound and the second host compound.

3. The light-emitting device according to claim 1, wherein at least four protecting groups among the five or more protecting groups are each independently any one of an alkyl group having 3 to 10 carbon atoms, a substituted or unsubstituted cycloalkyl group having 3 to 10 carbon atoms, and a trialkylsilyl group having 3 to 12 carbon atoms.

4. The light-emitting device according to claim 1, wherein the alkyl group is a branched-chain alkyl group.

5. The light-emitting device according to claim 4, wherein the branched-chain alkyl group has a quaternary carbon.

6. The light-emitting device according to claim 1, wherein the condensed aromatic ring or the condensed heteroaromatic ring includes any one of naphthalene, anthracene, fluorene, chrysene, triphenylene, tetracene, pyrene, perylene, coumarin, quinacridone and naphthobisbenzofuran.

7. The light-emitting device according to claim 1,
wherein the one of the first light-emitting layer and the second light-emitting layer further comprises a fifth material, and
wherein the first material and the fifth material are capable of forming a first exciplex.

8. The light-emitting device according to claim 7, wherein an emission spectrum of the first exciplex overlaps with an absorption band having a longest wavelength in an absorption spectrum of the second material.

9. The light-emitting device according to claim 1,
wherein the first material is a first phosphorescent compound, and
wherein the fourth material is a second phosphorescent compound.

10. The light-emitting device according to claim 1, wherein a difference between an energy value of a peak of the emission spectrum of the third material and an energy value of a peak of an absorption band in an absorption spectrum of the fourth material is less than or equal to 0.2 eV.

11. The light-emitting device according to claim 1, wherein an emission color obtained from the first light-emitting layer is different from an emission color obtained from the second light-emitting layer.

12. The light-emitting device according to claim 1, wherein a peak wavelength of the emission spectrum of the second material is shorter than a peak wavelength of an emission spectrum of the fourth material.

13. The light-emitting device according to claim 1,
wherein the first light-emitting layer comprises the first material and the second material, and
wherein the second light-emitting layer comprises the third material and the fourth material.

14. The light-emitting device according to claim 1, wherein the first light-emitting layer and the second light-emitting layer is in contact with each other.

15. An electronic appliance comprising:
the light-emitting device according to claim 1; and
at least one of a housing and a touch sensor.

16. A lighting device comprising:
the light-emitting device according to claim 1; and
at least one of a housing and a touch sensor.

* * * * *